(12) United States Patent
Watabe et al.

(10) Patent No.: US 10,950,805 B2
(45) Date of Patent: Mar. 16, 2021

(54) ELECTRONIC DEVICE, LIGHT-EMITTING DEVICE, ELECTRONIC APPLIANCE, AND LIGHTING DEVICE

(71) Applicant: Semiconductor Energy Laboratory Co., Ltd., Kanagawa-ken (JP)

(72) Inventors: Takeyoshi Watabe, Kanagawa (JP); Satoshi Seo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/613,245

(22) PCT Filed: May 11, 2018

(86) PCT No.: PCT/IB2018/053276
§ 371 (c)(1),
(2) Date: Nov. 13, 2019

(87) PCT Pub. No.: WO2018/211377
PCT Pub. Date: Nov. 22, 2018

(65) Prior Publication Data
US 2020/0176692 A1    Jun. 4, 2020

(30) Foreign Application Priority Data

May 19, 2017    (JP) .................................. 2017-100046
May 19, 2017    (JP) .................................. 2017-100049

(51) Int. Cl.
*H01L 51/00*    (2006.01)
*C07F 15/00*    (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC ............ H01L 51/5012; H01L 51/5072; H01L 51/5092
See application file for complete search history.

(56) References Cited

U.S. PATENT DOCUMENTS 6,762,553 B1    7/2004    Yokogawa et al.
9,051,239 B2    6/2015    Osaka et al.
(Continued)

FOREIGN PATENT DOCUMENTS

CN    102448926 A    5/2012
CN    103154187 A    6/2013
(Continued)

OTHER PUBLICATIONS

International Search Report re Application No. PCT/IB2018/053276, dated Aug. 14, 2018.
(Continued)

*Primary Examiner* — Jay C Chang
*Assistant Examiner* — Mikka Liu
(74) *Attorney, Agent, or Firm* — Husch Blackwell LLP

(57) ABSTRACT

An electronic device with high outcoupling efficiency or a high light-trapping effect is provided.
The electronic device includes a first layer and a second layer between a first electrode and a second electrode, the first layer is included between the first electrode and the second layer, the first layer includes a first organic compound and a first substance, the refractive index of a thin film of the first organic compound is higher than or equal to 1 and lower than or equal to 1.75, the first substance has an electron-accepting property, and the second layer has a function of emitting or absorbing light.

20 Claims, 26 Drawing Sheets

(51) Int. Cl.
*C09K 11/06* (2006.01)
*H01L 27/32* (2006.01)
*H01L 51/42* (2006.01)
*H01L 51/50* (2006.01)
*H01L 51/52* (2006.01)
*H01L 51/56* (2006.01)

(52) U.S. Cl.
CPC ........ *H01L 51/006* (2013.01); *H01L 51/0052* (2013.01); *H01L 51/0058* (2013.01); *H01L 51/0059* (2013.01); *H01L 51/0061* (2013.01); *H01L 51/0067* (2013.01); *H01L 51/0072* (2013.01); *H01L 51/0074* (2013.01); *C09K 2211/1029* (2013.01); *C09K 2211/1044* (2013.01); *C09K 2211/185* (2013.01); *H01L 27/322* (2013.01); *H01L 27/323* (2013.01); *H01L 27/3244* (2013.01); *H01L 51/001* (2013.01); *H01L 51/42* (2013.01); *H01L 51/5012* (2013.01); *H01L 51/5072* (2013.01); *H01L 51/5092* (2013.01); *H01L 51/5237* (2013.01); *H01L 51/56* (2013.01); *H01L 2251/558* (2013.01)

(56) References Cited

U.S. PATENT DOCUMENTS

| | | | |
|---|---|---|---|
| 9,496,505 | B2 | 11/2016 | Nowatari et al. |
| 9,577,222 | B2 | 2/2017 | Seo et al. |
| 9,741,937 | B2 | 8/2017 | Osaka et al. |
| 9,935,292 | B2 | 4/2018 | Seo et al. |
| 2009/0167156 | A1 | 7/2009 | Kawamura et al. |
| 2010/0171417 | A1* | 7/2010 | Kitamura ............... C09K 11/06 313/504 |
| 2010/0301744 | A1 | 12/2010 | Osaka et al. |
| 2012/0080667 | A1* | 4/2012 | Nowatari ............ H01L 51/0074 257/40 |
| 2012/0235197 | A1 | 9/2012 | Okuyama |
| 2016/0093678 | A1 | 3/2016 | Seo et al. |
| 2017/0054088 | A1 | 2/2017 | Nowatari et al. |
| 2017/0365782 | A1 | 12/2017 | Osaka et al. |

FOREIGN PATENT DOCUMENTS

| | | |
|---|---|---|
| CN | 103682137 A | 3/2014 |
| EP | 2 124 270 A1 | 11/2009 |
| JP | 2001-202827 A | 7/2001 |
| JP | 2005-220088 A | 8/2005 |
| JP | 2007-242927 A | 9/2007 |
| JP | 2008-270225 A | 11/2008 |
| JP | 2011-006405 A | 1/2011 |
| JP | 2013-012698 A | 1/2013 |
| JP | 2013-33706 A | 2/2013 |
| JP | 2013-051155 A | 3/2013 |
| JP | 2014-32851 A | 2/2014 |
| JP | 2016-072250 A | 5/2016 |
| KR | 2009-0128427 A | 12/2009 |
| KR | 2012-0014913 A | 2/2012 |
| KR | 2013-0120473 A | 11/2013 |
| TW | 200848489 | 12/2008 |
| TW | 201229046 | 7/2012 |
| TW | 201624789 | 7/2016 |
| WO | WO 2008/105294 A1 | 9/2008 |
| WO | WO 2010/137601 A1 | 12/2010 |
| WO | WO 2012/046560 A1 | 4/2012 |

OTHER PUBLICATIONS

Written Opinion re Application No. PCT/IB2018/053276, dated Aug. 14, 2018.

Shin, H. et al, "Sky-Blue Phosphorescent OLEDs with 34.1% External Quantum Efficiency Using a Low Refractive Index Electron Transporting Layer," Advanced Materials, vol. 28, issue 24, pp. 4920-4925, Jun. 22, 2016.

Lee, J. et al, "Synergetic Electrode Architecture for Efficient Graphene-Based Flexible Organic Light-Emitting Diodes," Nature Communications, vol. 7, pp. 11791-1-11791-9, Jun. 2, 2016.

Fuchs, C. et al., "Enhanced Light Emission from Top-Emitting Organic Light-Emitting Diodes by Optimizing Surface Plasmon Polariton Losses," Physical Review B, Dec. 11, 2015, vol. 92, pp. 245306-1-245306-10.

* cited by examiner

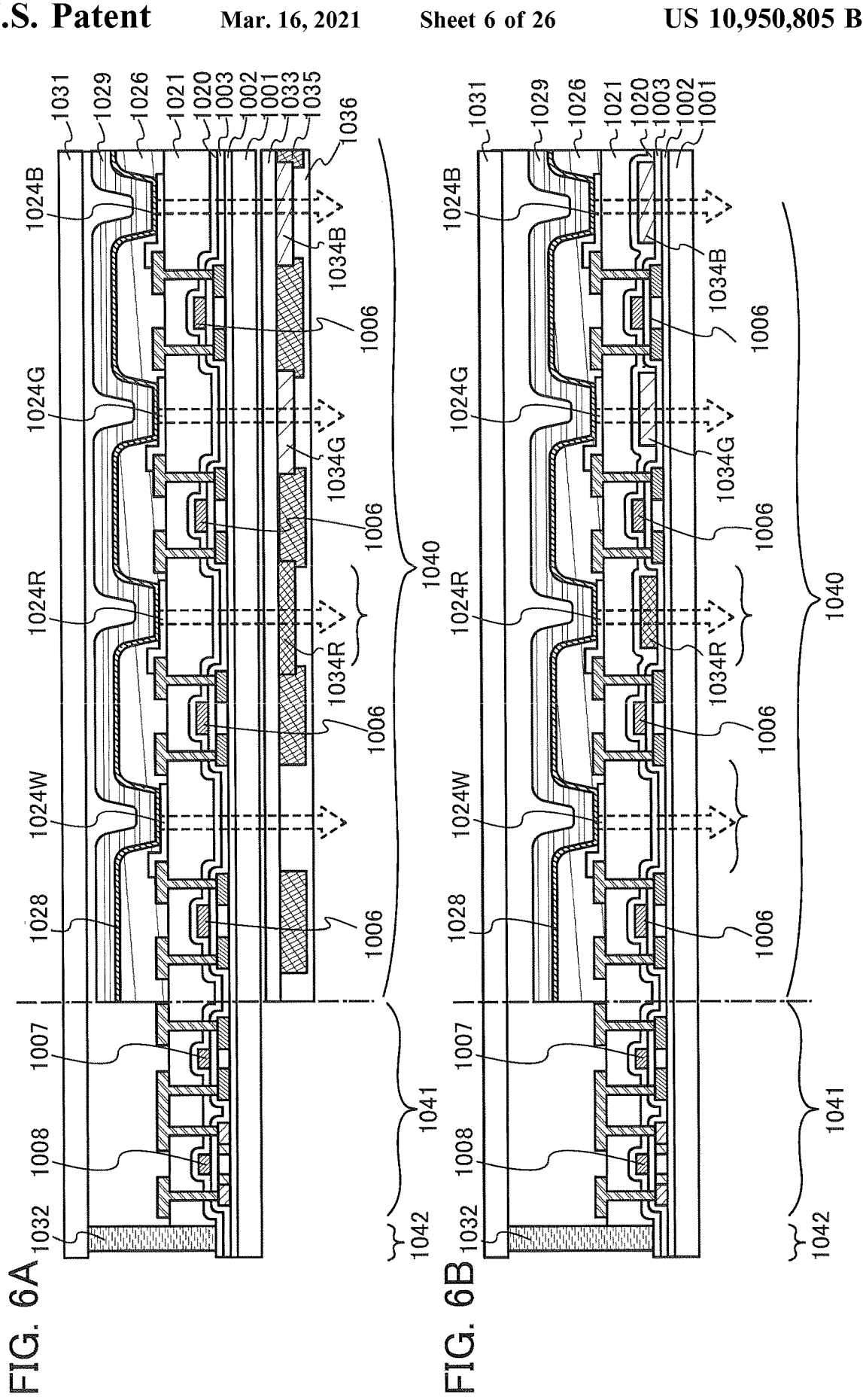

ELECTRONIC DEVICE, LIGHT-EMITTING DEVICE, ELECTRONIC APPLIANCE, AND LIGHTING DEVICE

This application is a 371 of international application PCT/IB2018/053276 filed on May 11, 2018 which is incorporated herein by reference.

TECHNICAL FIELD

One embodiment of the present invention relates to a novel electronic device. One embodiment of the present invention also relates to an electronic device including an organic compound with a low refractive index. One embodiment of the present invention also relates to a light-emitting device, an electronic appliance, and a lighting device each including the electronic device.

Note that one embodiment of the present invention is not limited to the above technical field. One embodiment of the present invention relates to an object, a method, or a manufacturing method. The present invention also relates to a process, a machine, manufacture, or a composition of matter. In particular, one embodiment of the present invention relates to an electronic device, a semiconductor device, a light-emitting device, a display device, a lighting device, a light-emitting element, or a manufacturing method thereof.

BACKGROUND ART

Light-emitting elements (organic EL elements) that use organic compounds and utilize electroluminescence (EL) and electronic devices such as organic solar cells have been put to practical use. The basic structure of such electronic devices is a structure in which a semiconductor layer containing an organic compound is interposed between a pair of electrodes.

Such electronic devices are lightweight, flexible, and highly designed. The electronic devices have various advantages, for example, coating process is possible, and thus their research and development have actively proceeded. In particular, light-emitting elements are of self-light-emitting type, and have advantages such as high visibility and no need for backlight when used for pixels of a display; accordingly, the light-emitting elements are suitable as flat panel display elements.

In such an electronic device, an organic semiconductor layer obtained by thinning an organic compound is mainly formed, and the organic compound and the layer structure significantly affect the organic semiconductor element; thus, selection of the organic compound and the layer structure is important. Moreover, in an electronic device that emits or absorbs light, such as an organic solar cell or an organic EL element, it is important that outcoupling efficiency and a light-trapping effect be high.

Various methods for improving the outcoupling efficiency of an organic EL element have been proposed. For example, in Patent Document 1, the outcoupling efficiency is improved by formation of unevenness on part of an electrode or an EL layer.

REFERENCE

Patent Document

[Patent Document 1] Japanese Published Patent Application No. 2013-033706

SUMMARY OF INVENTION

Problems to be Solved by the Invention

Examples of a method for improving the outcoupling efficiency of a light-emitting element such as an organic EL element include a method for adjusting a refractive index between a substrate and an electrode and/or between an electrode and an EL layer. However, introduction of a layer that adjusts a refractive index into an organic EL element brings a problem of a complicated process. Hence, there has been a demand for development of a layer and a layer structure that function as an EL layer and can adjust a refractive index. There has also been a demand for development of a layer and a layer structure that have a high light-trapping effect in an organic solar cell.

In view of the above-described problem, an object of one embodiment of the present invention is to provide an electronic device having high outcoupling efficiency. Another object of one embodiment of the present invention is to provide an electronic device including a layer with a low refractive index. Another object of one embodiment of the present invention is to provide an electronic device with low driving voltage. Another object of one embodiment of the present invention is to provide an electronic device with reduced power consumption. Another object of one embodiment of the present invention is to provide an electronic device with high reliability. Another object of one embodiment of the present invention is to provide an electronic device having high luminous efficiency. Another object of one embodiment of the present invention is to provide a novel electronic device. Another object of one embodiment of the present invention is to provide an electronic device having an excellent light-trapping effect. Another object of one embodiment of the present invention is to provide a novel semiconductor device.

Note that the description of the above objects does not preclude the existence of other objects. In one embodiment of the present invention, there is no need to achieve all the objects. Objects other than the above will be apparent from the description of the specification and the like, and objects other than the above can be derived from the description of the specification and the like.

Means for Solving the Problems

One embodiment of the present invention is an electronic device including a first layer and a second layer between a first electrode and a second electrode; the first layer is included between the first electrode and the second layer; the first layer includes a first organic compound and a first substance; a refractive index of a thin film of the first organic compound is higher than or equal to 1 and lower than or equal to 1.75; the first substance has an electron-accepting property; and the second layer has a function of emitting or absorbing light.

Another embodiment of the present invention is an electronic device including a first layer between a first electrode and a second electrode; the first layer includes a first organic compound and a first substance; the first organic compound includes a first skeleton and an electron-donating skeleton; and the first skeleton is a tetraarylmethane skeleton or a tetraarylsilane skeleton.

In the above structure, the refractive index of the first layer is preferably higher than or equal to 1 and lower than or equal to 1.75. This structure can improve outcoupling efficiency and a light-trapping effect of the electronic device.

In the above structure, it is preferable that aryl groups included in the tetraarylmethane skeleton and the tetraarylsilane skeleton be independently a substituted or unsubstituted aryl group having 6 to 13 carbon atoms. The aryl groups are further preferably substituted or unsubstituted phenyl groups. This structure enables an organic compound with a low refractive index and a high carrier-transport property to be obtained. The aryl groups or the phenyl groups may be bonded to each other to form a ring.

In the above structure, the electron-donating skeleton preferably includes any one of a pyrrole skeleton, an aromatic amine skeleton, an acridine skeleton, and an azepine skeleton. This structure can reduce the driving voltage of the electronic device.

In the above structure, the glass transition point (Tg) of the first organic compound is preferably higher than or equal to 100° C. This structure enables an electronic device with excellent heat resistance to be obtained.

In the above structure, the refractive index of the first layer is preferably lower than the refractive index of the second layer. This structure can improve outcoupling efficiency and a light-trapping effect of the electronic device.

Another embodiment of the present invention is an electronic device including a first layer, a second layer, and a third layer between a first electrode and a second electrode; the first layer is included between the first electrode and the second layer; the second layer is included between the first layer and the third layer; the first layer includes a first organic compound and a first substance; a refractive index of a thin film of the first organic compound is higher than or equal to 1 and lower than or equal to 1.75; the first substance has an electron-accepting property; the third layer has a function of emitting or absorbing light; the refractive index of the first layer is lower than the refractive index of the second layer; and the refractive index of the first layer is lower than the refractive index of the third layer.

In the above structure, the first organic compound preferably has an electron-donating property. This structure enables an electronic device with a high carrier-transport property to be obtained.

In the above structure, it is preferable that the first layer be in contact with the second layer, and it is further preferable that the second layer be in contact with the third layer. This structure can reduce the refractive index difference between the layers and improve outcoupling efficiency and a light-trapping effect of the electronic device.

In the above structure, the refractive index of the first layer is preferably lower than the refractive index of the first electrode. This structure can improve outcoupling efficiency and a light-trapping effect of the electronic device.

In the above structure, it is preferable that a volume ratio of the first substance to the first organic compound in the first layer be higher than or equal to 0.01 and lower than or equal to 0.3. This structure can improve outcoupling efficiency and a light-trapping effect of the electronic device.

In the above structure, the first substance preferably contains any one of titanium oxide, vanadium oxide, tantalum oxide, molybdenum oxide, tungsten oxide, rhenium oxide, ruthenium oxide, chromium oxide, zirconium oxide, hafnium oxide, and silver oxide. This structure enables an electronic device with a high carrier-transport property to be obtained.

In the above structure, the first substance is preferably any one of 7,7,8,8-tetracyanoquinodimethane (abbreviation: TCNQ), 7,7,8,8-tetracyano-2,3,5,6-tetrafluoro-quinodimethane (abbreviation: F4TCNQ), and 1,3,4,5,7,8-hexafluoro-tetracyano-naphthoquinodimethane (abbreviation: F6TCNNQ). This structure enables an electronic device with a high carrier-transport property to be obtained.

In the above structure, the electronic device is preferably an organic EL element or a solar cell.

Another embodiment of the present invention is an electronic appliance including the light-emitting element having any of the above structures, and at least one of a housing and a touch sensor. Another embodiment of the present invention is a lighting device including the electronic device having any of the above structures, and at least one of a housing, a connection terminal, and a protective cover. The category of one embodiment of the present invention includes not only a light-emitting device including an electronic device but also an electronic appliance including a light-emitting device. Accordingly, the light-emitting device in this specification refers to an image display device or a light source (including a lighting device). A display module in which a connector such as an FPC (Flexible Printed Circuit) or a TCP (Tape Carrier Package) is connected to a light-emitting element, a display module in which a printed wiring board is provided on the tip of a TCP, and a display module in which an IC (integrated circuit) is directly mounted on an electronic device by a COG (Chip On Glass) method are also embodiments of the present invention.

Effect of the Invention

One embodiment of the present invention can provide an electronic device having high outcoupling efficiency. Another embodiment of the present invention can provide an electronic device including a layer with a low refractive index. Another embodiment of the present invention can provide an electronic device with low driving voltage. Another embodiment of the present invention can provide an electronic device with reduced power consumption. Another embodiment of the present invention can provide an electronic device with high reliability. Another embodiment of the present invention can provide an electronic device having high luminous efficiency. Another embodiment of the present invention can provide a novel electronic device. Another embodiment of the present invention can provide an electronic device having an excellent light-trapping effect. Another embodiment of the present invention can provide a novel semiconductor device.

Note that the description of these effects does not preclude the existence of other effects. One embodiment of the present invention does not necessarily achieve all the effects listed above. Note that other effects will be apparent from the description of the specification, the drawings, the claims, and the like, and other effects can be derived from the description of the specification, the drawings, the claims, and the like.

BRIEF DESCRIPTION OF DRAWINGS

FIG. 5 Conceptual

FIG. 6 Conceptual FIGS. 6A and 6B are conceptional views of an active matrix light-emitting device of one embodiment of the present invention.

FIG. 8 Schematic

FIG. 9 Schematic

MODE FOR CARRYING OUT THE INVENTION

Figure 1:
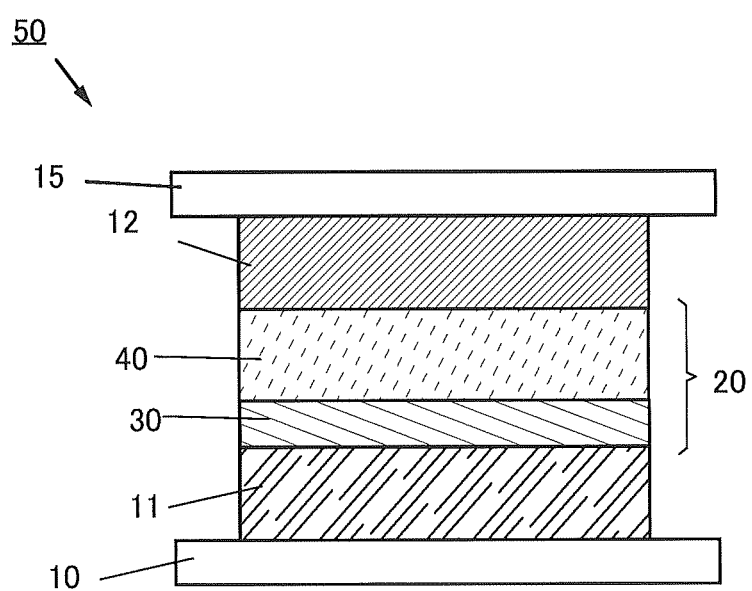
FIG. 1 is a schematic cross-sectional view of an electronic device of one embodiment of the present invention.

Embodiments of the present invention are described in detail below with reference to the drawings. Note that the present invention is not limited to description below, and modes and details of the present invention can be variously modified without departing from the spirit and scope of the present invention. Thus, the present invention should not be interpreted as being limited to the description of the embodiments below.

Note that the position, size, range, or the like of each component shown in drawings and the like does not represent the actual position, size, range, or the like in some cases for easy understanding. Therefore, the disclosed invention is not necessarily limited to the position, size, range, or the like disclosed in the drawings and the like.

The ordinal numbers such as first and second in this specification and the like are used for convenience and do not denote the order of steps or the stacking order of layers in some cases. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In describing structures of the invention in this specification and the like with reference to the drawings, common numerals are used for the same components in different drawings in some cases.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

Examples of a refractive index n includes a refractive index of an ordinary ray, n Ordinary, a refractive index of an extraordinary ray, n Extraordinary, and the average of them, n average. In this specification and the like, the simple term "refractive index" may be rephrased as n average when anisotropy analysis is not performed, and as n Ordinary when anisotropy analysis is performed. Note that anisotropy is represented by a difference between n Ordinary and n Extraordinary. Note that n average is a value obtained by dividing the sum of n Extraordinary and 2 n Ordinary by 3.

Note that in this specification and the like, room temperature refers to a temperature in the range of higher than or equal to 0° C. and lower than or equal to 40° C.

Embodiment 1

In this embodiment, an electronic device of one embodiment of the present invention is described below with reference to FIG. 1.

Structure Example 1 of Electronic Device

An electronic device 50 includes a pair of electrodes (an electrode 11 and an electrode 12) and an organic semiconductor layer 20 between a pair of substrates (a substrate 10 and a substrate 15). The organic semiconductor layer 20 includes at least a carrier-transport layer 30 and a functional layer 40. The organic semiconductor layer 20 may include a plurality of functional layers.

The functional layer 40 in the electronic device 50 preferably has a function of absorbing or emitting light. In the case where light generated in the functional layer 40 is extracted from the electrode 11 side, light passing through the substrate 10 passes through the electrode 11 and the carrier-transport layer 30. In the case where light entering the organic semiconductor layer 20 from the electrode 11 side is absorbed by the functional layer 40, light passing through the substrate 10 passes through the electrode 11 and the carrier-transport layer 30. In order that light generated in the functional layer 40 is efficiently extracted or light is efficiently absorbed by the functional layer 40, the amount of light attenuating in the electrode 11 and the carrier-transport layer 30 is preferably as small as possible.

However, in the electronic device 50, it is known that light attenuates in the organic semiconductor layer 20 due to an attenuation mode called an evanescent mode. For example, in the case where light is emitted from the functional layer 40, light generated in the functional layer 40 attenuates due to an evanescent mode when passing through or being reflected by the electrode 11.

It is known that the amount of attenuating light is reduced when a layer with a low refractive index exists in layers through which light passes. In FIG. 1, using a layer with a low refractive index as the carrier-transport layer 30 can reduce the amount of attenuating light.

However, in many cases, the carrier-transport layer 30 is required to have a carrier-transport property or a carrier-injection property. Therefore, a carrier-accepting or carrier-donating substance is used for the carrier-transport layer 30. The carrier-accepting or carrier-donating substance tends to have a high refractive index, resulting in a high refractive index of the carrier-transport layer 30. That is, it is difficult to obtain a layer with a carrier-transport property and a low refractive index. In the case where the carrier-accepting or carrier-donating substance is an organic compound, it is known that a saturated cyclic compound such as a cyclohexane skeleton included in the structure of the organic compound lowers a refractive index but has a problem in heat resistance.

The present inventors have found that mixing an organic compound with a low refractive index into the carrier-transport layer 30 allows formation of a layer with a carrier-transport property and a low refractive index even in the case of using a substance with a high refractive index and an electron-accepting property. The present inventors also have found that mixing an organic compound including an electron-donating group and one of a tetraarylmethane skeleton and a tetraarylsilane skeleton into the carrier-transport layer 30 allows formation of a layer with a carrier-transport property and a low refractive index even in the case of using a substance with a high refractive index and an electron-accepting property. In addition, the organic compound is found to have excellent heat resistance.

The refractive index of the organic compound with a low refractive index is preferably higher than or equal to 1 and lower than or equal to 1.75, further preferably higher than or equal to 1 and lower than or equal to 1.73, still further preferably lower than or equal to 1.70. This structure enables an excellent electronic device with reduced amount of attenuating light to be obtained.

The refractive index of the organic compound including an electron-donating group and one of a tetraarylmethane skeleton and a tetraarylsilane skeleton is preferably higher than or equal to 1 and lower than or equal to 1.75, further preferably higher than or equal to 1 and lower than or equal to 1.73, still further preferably lower than or equal to 1.70. This structure enables an electronic device with reduced amount of attenuating light and excellent outcoupling efficiency to be obtained.

Structure Example 2 of Electronic Device

A light-emitting element, which is an example of an electronic device of one embodiment of the present invention, is described below with reference to FIG. 2.

Figure 2A:
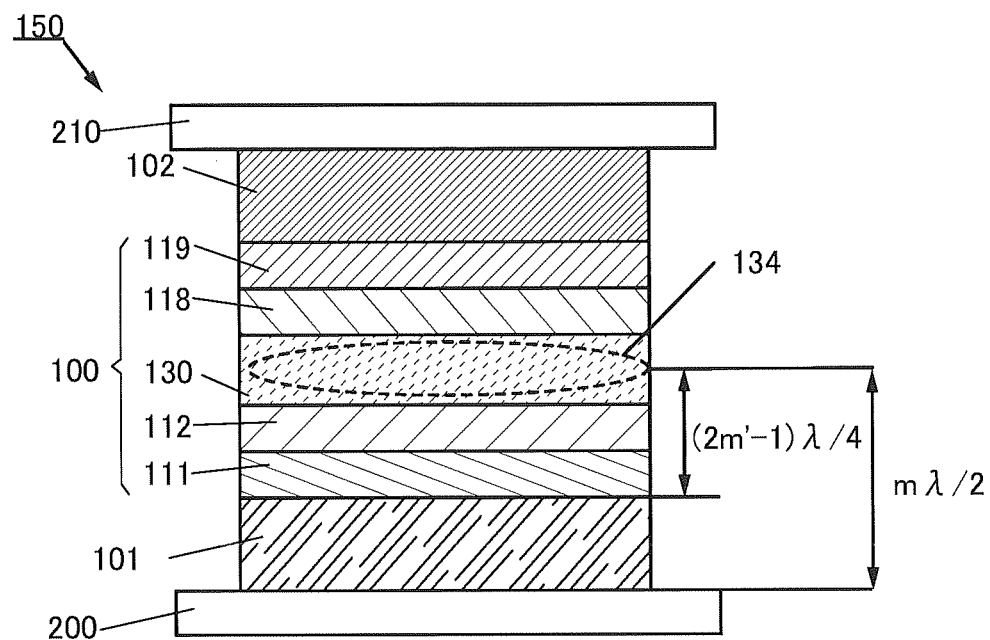
FIGS. 2A and 2B are a schematic cross-sectional view of a light-emitting element of one embodiment of the present invention and a view showing an optical path length, and an example of the light-emitting layer.

FIG. 2(A) is a schematic cross-sectional view of a light-emitting element 150 of one embodiment of the present invention.

The light-emitting element 150 includes a substrate 200 and a substrate 210, a pair of electrodes (an electrode 101 and an electrode 102) between the substrate 200 and the substrate 210, and an EL layer 100 provided between the pair of electrodes. The EL layer 100 includes at least a light-emitting layer 130.

The EL layer 100 shown in FIG. 2(A) includes functional layers such as a hole-injection layer 111, a hole-transport layer 112, an electron-transport layer 118, and an electron-injection layer 119, in addition to the light-emitting layer 130.

Although description in this embodiment is given assuming that the electrode 101 and the electrode 102 of the pair of electrodes serve as an anode and a cathode, respectively, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Although description in this embodiment is given assuming that the electrode 101 (anode) side is the light extraction side in FIG. 2(A), the structure of the light-emitting element 150 is not limited thereto. That is, the light extraction side may be the electrode 102 (cathode) side, or light may be extracted from both the electrode 101 and the electrode 102.

Note that the structure of the EL layer 100 is not limited to the structure shown in FIG. 2(A), and the EL layer 100 includes at least the light-emitting layer 130 and does not necessarily include the hole-injection layer 111, the hole-transport layer 112, the electron-transport layer 118, and the electron-injection layer 119. The EL layer 100 may have a structure including functional layers which have a function such as capability of lowering a hole- or electron-injection barrier, improving a hole- or electron-transport property, inhibiting a hole- or electron-transport property, suppressing a quenching phenomenon by an electrode, or suppressing exciton diffusion, for example. Note that the functional layers may each be a single layer or have a structure in which a plurality of layers are stacked.

Figure 2B:
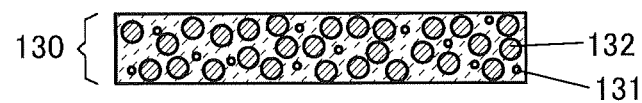

FIG. 2(B) is a schematic cross-sectional view showing an example of the light-emitting layer 130 shown in FIG. 2(A). The light-emitting layer 130 shown in FIG. 2(B) may include a guest material 131 and a host material 132.

In order to obtain light emission from the light-emitting element 150 efficiently, the light-emitting element 150 preferably has high outcoupling efficiency. However, as described above, it is known that the outcoupling efficiency of an organic EL element decreases due to an attenuation mode called an evanescent mode. For example, in the light-emitting element 150, light generated in the light-emitting layer 130 attenuates due to an evanescent mode when passing through or being reflected by the electrode 101.

In order to reduce the amount of light that attenuates due to an evanescent mode, a method in which the thicknesses of layers between the light-emitting layer 130 and the electrode 101, such as the hole-injection layer 111 and the hole-transport layer 112, are made large can be employed; however, this structure brings problems such as an increase in driving voltage and high manufacturing costs.

In the light-emitting element 150, light generated in the light-emitting layer 130 is extracted to the outside; it is known that the outcoupling efficiency is improved when there is a layer with a low refractive index before light generated in the light-emitting layer 130 passes through the substrate 200.

Light generated in the light-emitting layer 130 passes through the hole-injection layer 111, the hole-transport layer 112, the electrode 101, and the substrate 200 before being extracted to the outside. Thus, the hole-injection layer 111 or the hole-transport layer 112 preferably has a low refractive index. In particular, the hole-injection layer 111 that is in contact with the electrode 101 preferably has a low refractive index.

However, in many cases, a substance having an electron-accepting property is mixed with an organic compound having an electron-donating property to obtain a hole-injection property of the hole-injection layer 111. The substance having an electron-accepting property tends to have a high refractive index, resulting in a high refractive index of the hole-injection layer 111. That is, it is difficult to obtain a layer with a hole-injection property and a low refractive index. In the case where the electron-accepting or electron-donating substance is an organic compound, it is known that a saturated cyclic compound such as a cyclohexane skeleton included in the structure of the organic compound lowers a refractive index but has a problem in heat resistance.

The present inventors have found that the use of an organic compound with a low refractive index for the hole-injection layer 111 allows formation of a layer with a hole-injection property and a low refractive index even in the case of using a substance with a high refractive index and an electron-accepting property. The present inventors also have found that mixing an organic compound including an electron-donating group and at least one of a tetraarylmethane skeleton and a tetraarylsilane skeleton into the hole-injection layer 111 allows formation of a layer with a carrier-transport property and a low refractive index even in the case of using a substance with a high refractive index and an electron-accepting property. In addition, the organic compound is found to have excellent heat resistance. The glass transition point (Tg) of the organic compound is preferably higher than or equal to 100° C.

The refractive index of the organic compound with a low refractive index is preferably higher than or equal to 1 and lower than or equal to 1.75, further preferably higher than or equal to 1 and lower than or equal to 1.73, still further preferably lower than or equal to 1.70. This structure enables a light-emitting element with excellent outcoupling efficiency to be obtained.

The refractive index of the organic compound including an electron-donating group and one of a tetraarylmethane skeleton and a tetraarylsilane skeleton is preferably higher than or equal to 1 and lower than or equal to 1.75, further preferably higher than or equal to 1 and lower than or equal to 1.73, still further preferably lower than or equal to 1.70. This structure enables a light-emitting element with excellent outcoupling efficiency to be obtained.

As described above, a layer with a low refractive index between the light-emitting layer 130 and the substrate 200 improves outcoupling efficiency; however, introduction of the layer with a low refractive index in addition to the hole-injection layer 111 and the hole-transport layer 112 increases the number of layers to be formed and thus the formation process of a light-emitting element is complicated. However, in one embodiment of the present invention, a layer with a low refractive index and a hole-injection property can be formed; thus, the outcoupling efficiency of a light-emitting element can be improved with a conventional formation process, i.e., while the number of layers to be formed is kept.

Similarly, in one embodiment of the present invention, a layer with a low refractive index and a hole-injection property can be formed using an organic compound including an electron-donating group and one of a tetraarylmethane skeleton and a tetraarylsilane skeleton; thus, the outcoupling efficiency of a light-emitting element can be improved with a conventional formation process, i.e., without an increase in the number of layers to be formed.

One embodiment of the present invention relates to an EL layer between an anode and a cathode. Thus, one embodiment of the present invention can be combined with another technique for improving outcoupling, such as formation of unevenness on a substrate.

In one embodiment of the present invention, an organic compound having an electron-donating property is preferably used as an organic compound with a low refractive index. With such a structure, a hole-injection property of the hole-injection layer 111 can be increased while a refractive index thereof is lowered, which enables a light-emitting element with excellent outcoupling efficiency and low driving voltage to be provided. The organic compound further preferably includes a tetraarylmethane skeleton or a tetraarylsilane skeleton.

The refractive index of the hole-injection layer 111 is preferably lower than the refractive index of the light-emitting layer 130. With such a structure, attenuation of light emitted from the light-emitting layer 130 due to an evanescent wave can be reduced. It is further preferable that the refractive index of the hole-injection layer 111 be lower than the refractive index of the hole-transport layer 112, and the refractive index of the hole-transport layer 112 be lower than the refractive index of the light-emitting layer 130. With such a structure, the refractive index difference between the light-emitting layer 130 and the hole-injection layer 111 can be reduced and thus outcoupling efficiency can be further improved.

In order to suppress a guided wave mode of an EL layer, the number of layers through which light generated in the light-emitting layer 130 passes is preferably small. Therefore, a structure in which the light-emitting layer 130 is in contact with the electrode 101 is preferable in terms of outcoupling efficiency; however, this structure might reduce the luminous efficiency of the light-emitting layer 130 because of an influence of a carrier balance or an influence of a plasmon effect. Thus, the hole-injection layer 111 and the hole-transport layer 112 are layers necessary to make an EL layer function efficiently. For this reason, it is preferable that the hole-injection layer 111 be in contact with the hole-transport layer 112, and it is further preferable that the hole-transport layer 112 be in contact with the light-emitting layer 130.

The refractive index of the hole-injection layer 111 is preferably lower than the refractive index of the electrode 101. With such a structure, a relation between the refractive index of the hole-injection layer 111, n HIL, and the refractive index of the electrode 101, n cat., becomes n cat./n HIL>1; thus, total reflection of light entering the electrode 101 from the hole-injection layer 111 can be inhibited. That is, a guided wave mode can be suppressed. In addition, light attenuation due to an evanescent mode caused by reflection can be suppressed.

The refractive index of the hole-injection layer 111 is preferably higher than or equal to 1 and lower than or equal to 1.80, further preferably higher than or equal to 1 and lower than or equal to 1.78, still further preferably higher than or equal to 1 and lower than or equal to 1.75. With such a structure, excellent outcoupling efficiency can be achieved.

In the hole-injection layer 111, an organic compound having an electron-donating property is preferably mixed with a substance having an electron-accepting property. With such a structure, an excellent hole-injection property can be achieved.

With regard to a mixing ratio between the organic compound and the substance having an electron-accepting property, a volume ratio of the substance having an electron-accepting property to the organic compound is preferably greater than or equal to 0.01 and less than or equal to 0.3. The present inventors have found that the hole-injection layer 111 with a low refractive index can be formed using an organic compound with a low refractive index as the organic compound, even when a substance with a high refractive index is used as the substance having an electron-accepting property.

Light incident on an electronic device may also attenuate due to the evanescent wave. For example, in the case where the electronic device of one embodiment of the present invention is used for a solar cell, light attenuation due to the evanescent wave can be inhibited and thus a light-trapping effect of the solar cell can be improved. Hence, the electronic device of one embodiment of the present invention can be suitably used for a solar cell. In that case, the functional layer 40 in the electronic device 50 illustrated in FIG. 1 may be rephrased as an active layer, a light-absorbing layer, or a light-generation layer.

<Organic Compound Used for Hole-Injection Layer 111>

Here, organic compounds that can be suitably used for the hole-injection layer 111 are described.

An organic compound with a low refractive index is preferably used for the hole-injection layer 111. Note that a refractive index of a high molecule is expressed by a Lorentz-Lorenz equation (formula (1)) below.

[Formula 1]

$$\frac{n^2-1}{n^2+2} = \frac{4\pi}{3} N\alpha = \frac{4\pi}{3} \frac{\rho N_A}{M} \alpha = \frac{[R]}{V_0} = \phi \quad (1)$$

Formula (2) is obtained by modifying Formula (1).

[Formula 2]

$$n = \sqrt{\frac{1+2\phi}{1-\phi}} \quad (2)$$

In the formula (1) and the formula (2), n represents a refractive index, α represents polarizability, N represents the number of molecules per unit volume, ρ represents a density, $N_A$ represents Avogadro's number, M represents a molecular weight, $V_0$ represents a molar volume, and [R] represents atomic refraction.

According to the formula (2), the value of ϕ is reduced to lower the refractive index n, and according to the formula (1), the atomic refraction [R] is reduced to reduce the value of ϕ. That is, in order to lower the refractive index n, an organic compound is selected such that the atomic refraction [R] is reduced.

Since the above formula is a formula for a high molecule, when the formula is used for a low molecular compound, the calculated value may be slightly deviated but have a similar tendency; thus, an organic compound used for the hole-injection layer 111 is preferably selected such that the atomic refraction [R] is reduced. In addition, the hole-injection layer 111 preferably has a hole-injection property. Hence, it is further preferable that an organic compound used for the hole-injection layer 111 have a π-conjugated system in a molecule and also have an electron-donating property, like an aromatic compound. Selecting such an organic compound allows formation of the hole-injection layer 111 with a low refractive index and an excellent hole-injection property.

The atomic refraction [R] tends to be small when a substituent containing fluorine, such as a fluoro group or a trifluoromethyl group, a cyclohexyl group, or a bond through aromatic rings that has a structure in which a conjugation between the aromatic rings is cut typically by an $sp^3$ hybrid orbital is included. The conjugated system does not spread across a molecule in an organic compound containing non-alternant hydrocarbon; thus, the organic compound tends to have small atomic refraction [R]. Thus, an organic compound used for the hole-injection layer 111 is preferably an organic compound having the above-mentioned substituent or bond.

As an organic compound used for the hole-injection layer 111, an organic compound including an aromatic amine skeleton, a pyrrole skeleton, or a thiophene skeleton or an organic compound including an aromatic ring that has a bulky substituent such as a methyl group, a t-butyl group, or an isopropyl group can be suitably used. These organic compounds each have a π-conjugated system in a molecule and thus tend to have a lower refractive index.

Examples of the bond through aromatic rings that has a structure in which a conjugation between the aromatic rings is cut include a tetraarylmethane skeleton represented by General Formula (100) below, a tetraarylsilane skeleton represented by General Formula (101), and a cyclohexyl skeleton. A tetraarylmethane skeleton and a tetraarylsilane skeleton each have a low refractive index and higher heat resistance than a cyclohexyl skeleton and thus can be suitably used for the hole-injection layer 111. A thin film can be easily formed by vacuum evaporation; thus, the above skeletons can be suitably used for an electronic device such as organic EL.

[Chemical Formulae 1]

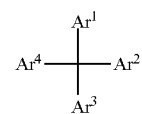

(100)

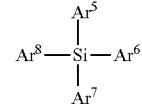

(101)

An organic compound used for the hole-injection layer 111 preferably has an electron-donating property. Examples of a skeleton having an electron-donating property include an aromatic amine skeleton and a π-electron rich heteroaromatic ring skeleton represented by General Formulae (200) to (220) below. In General Formulae (210) to (213), X represents oxygen or sulfur.

[Chemical Formulae 2]

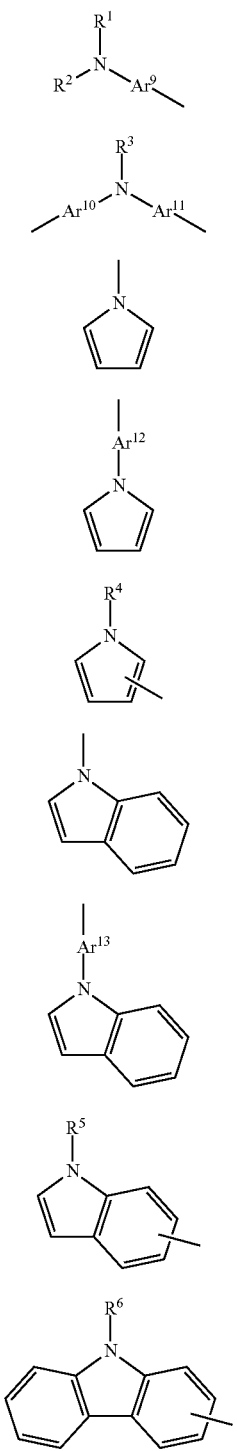

(200)
(201)
(202)
(203)
(204)
(205)
(206)
(207)
(208)

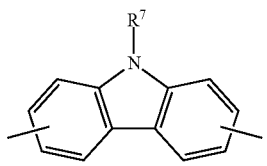

(209)

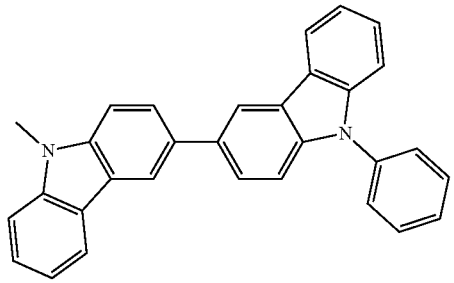

(210)

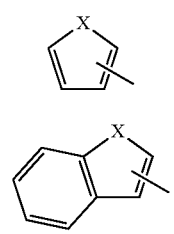

(211)

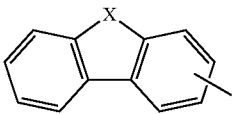

(212)

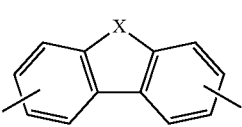

(213)

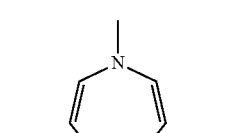

(214)

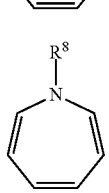

(215)

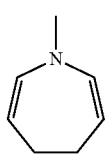

(216)

(217)

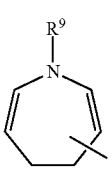

(218)

-continued

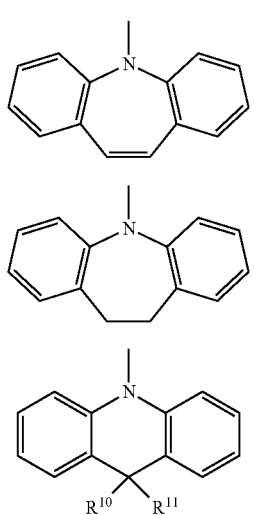

(219)

(220)

(221)

The above aromatic amine skeleton (specifically, a triarylamine skeleton or the like) and the above π-electron rich heteroaromatic ring skeleton (specifically, a ring including a furan skeleton, a thiophene skeleton, a pyrrole skeleton, an azepine skeleton, or an acridine skeleton, or the like) may each have a substituent. As the substituent, an alkyl group having 1 to 6 carbon atoms, a cycloalkyl group having 3 to 6 carbon atoms, or a substituted or unsubstituted aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group. The above substituents may be bonded to each other to form a ring. Examples of such a case include the case where carbon at the 9-position in a fluorene skeleton has two phenyl groups as substituents and the phenyl groups are bonded to each other to form a spirofluorene skeleton. Note that an unsubstituted group has advantages in easy synthesis and an inexpensive raw material.

As described above, the skeleton having an electron-donating property is preferably an odd-membered ring skeleton such as an aromatic amine skeleton, a pyrrole skeleton, or an azepine skeleton or an acridine skeleton. These skeletons have excellent electron-donating properties and small atomic refraction [R]; thus, these skeletons included in a molecule enable an organic compound with an excellent electron-donating property and a low refractive index to be obtained.

Note that $Ar^1$ to $Ar^8$ independently represent an aryl group having 6 to 13 carbon atoms, or an aromatic amine skeleton or a π-electron rich heteroaromatic skeleton represented by General Formulae (200) to (220) shown above. The aryl group may have substituents, and the substituents may be bonded to each other to form a ring. Examples of such a case include the case where carbon at the 9-position in a fluorene group has two phenyl groups as substituents and the phenyl groups are bonded to each other to form a spirofluorene skeleton. Specific examples of the aryl group having 6 to 13 carbon atoms include a phenyl group, a naphthalenyl group, and a fluorenyl group. Note that in the case where the aryl group has a substituent, an alkyl group having 1 to 6 carbon atoms, a cycloalkyl group having 3 to 6 carbon atoms, or an aryl group having 6 to 12 carbon atoms can also be selected as the substituent. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group and a naphthyl group.

As the aryl group represented by $Ar^1$ to $Ar^8$, for example, a group represented by any of the following structural formulae can be used. Note that the group that can be used as an aryl group is not limited thereto.

[Chemical Formulae 3]

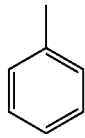

(Ar-1)

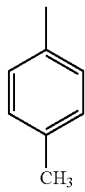

(Ar-2)

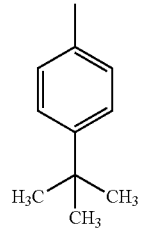

(Ar-3)

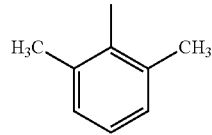

(Ar-4)

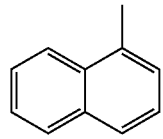

(Ar-5)

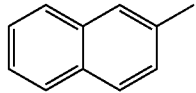

(Ar-6)

(Ar-7)

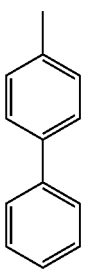

(Ar-8)

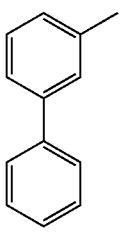

(Ar-9)

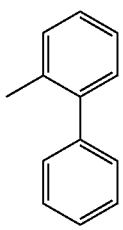

(Ar-10)

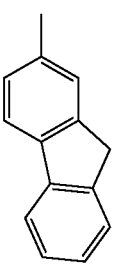

(Ar-11)

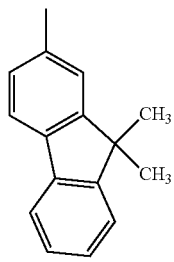

In the case where $Ar^1$ to $Ar^8$ are each an aryl group, the aryl group is preferably a substituent with a relatively small extension of a π-conjugated system, as in a substituted or unsubstituted aryl group having 6 to 13 carbon atoms, and is further preferably a substituted or unsubstituted phenyl group. A substituent with a small it-conjugated system tends to have small atomic refraction [R]. However, an organic compound with a small n-conjugated system, such as alkene, is not suitable for an electronic device because of its poor carrier-transport property. Thus, an organic compound with a carrier-transport property and a small i-conjugated system, such as an aryl group having 6 to 13 carbon atoms, in particular a phenyl group, is preferably used for the hole-injection layer 111. An odd-membered ring substituent is also preferable because of its small atomic refraction [R].

Furthermore, $R^1$ to $R^{11}$ in General Formulae (200) to (220) independently represent any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. Furthermore, the above aryl group or phenyl group may include substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group.

For example, groups represented by the following structural formulae (R-1) to (R-27) can be used as hydrogen, the alkyl group, or the aryl group represented by $R^1$ to $R^{11}$. Note that the groups that can be used as an alkyl group or an aryl group are not limited thereto.

[Chemical Formulae 4]

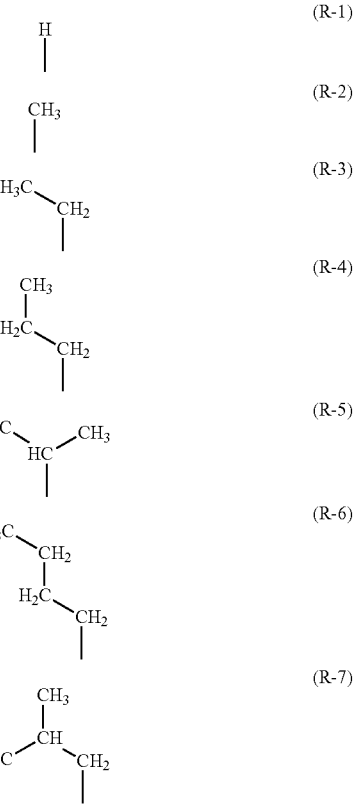

-continued
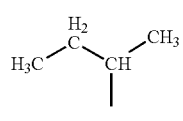
(R-8)
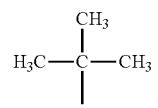
(R-9)
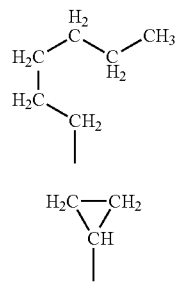
(R-10)
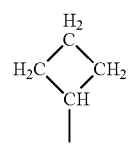
(R-11)
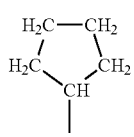
(R-12)
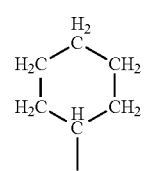
(R-13)
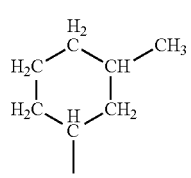
(R-14)
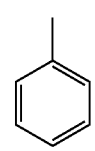
(R-15)
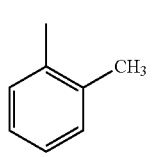
(R-16)
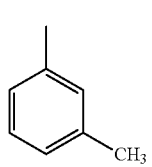
(R-17)
(R-18)
-continued
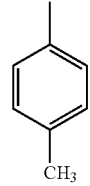
(R-19)
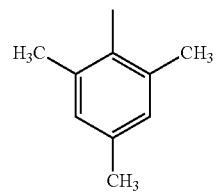
(R-20)
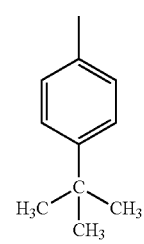
(R-21)
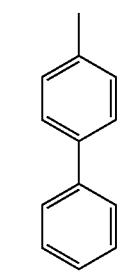
(R-22)
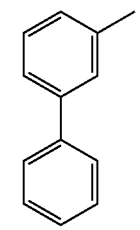
(R-23)
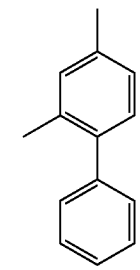
(R-24)

-continued (R-25)
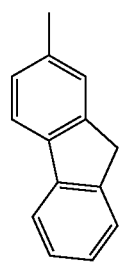

(R-26)
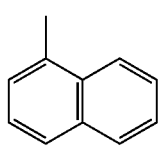

(R-27)
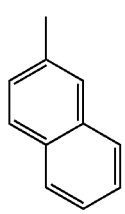

Furthermore, $Ar^9$ to $Ar^{13}$ in General Formulae (200) to (220) each represent an arylene group having 6 to 13 carbon atoms, the arylene group may include substituents, and the substituents may be bonded to each other to form a ring. Examples of such a case include the case where carbon at the 9-position in a fluorenyl group has two phenyl groups as substituents and the phenyl groups are bonded to each other to form a spirofluorene skeleton. Specific examples of the arylene group having 6 to 13 carbon atoms include a phenylene group, a naphthalenediyl group, a biphenylene group, and a fluorenediyl group. Note that in the case where the arylene group has a substituent, an alkyl group having 1 to 6 carbon atoms, a cycloalkyl group having 3 to 6 carbon atoms, or an aryl group having 6 to 12 carbon atoms can also be selected as the substituent. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group.

As the arylene group represented by $Ar^9$ to $Ar^{13}$, for example, any of groups represented by the following structural formulae (Ar-12) to (Ar-25) can be used. Note that the group that can be used as $Ar^9$ to $Ar^{13}$ is not limited thereto.

[Chemical Formulae 5]

(Ar-12)
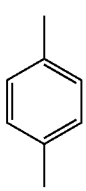

(Ar-13)
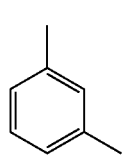

(Ar-14)
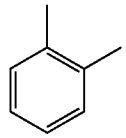

(Ar-15)
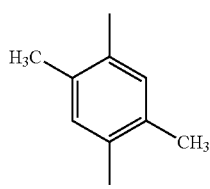

(Ar-16)
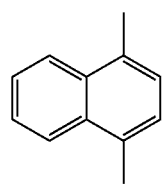

(Ar-17)
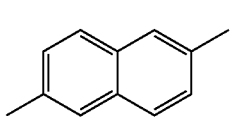

(Ar-18)
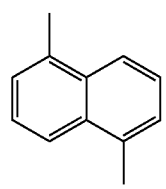

(Ar-19)
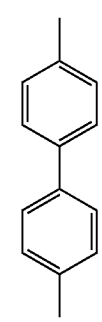

(Ar-20)
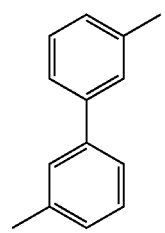

(Ar-21) 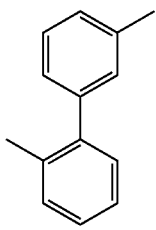

(Ar-22) 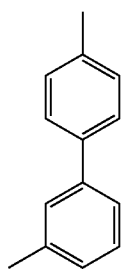

(Ar-23) 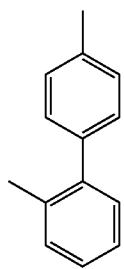

(Ar-24) 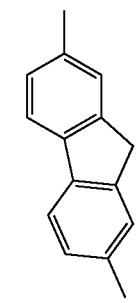

(Ar-25) 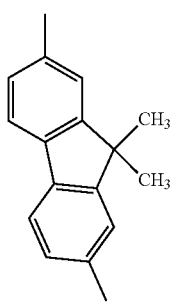

As described above, an organic compound used for the hole-injection layer 111 is preferably an organic compound having a tetraarylmethane skeleton or a tetraarylsilane skeleton and an electron-donating property. Examples of the organic compound include 9-(4-t-butylphenyl)-3,4-ditrityl-9H-carbazole (abbreviation: CzC), 9-(4-t-butylphenyl)-3,4-ditriphenylsilyl-9H-carbazole (abbreviation: CzSi), 4,4,8,8-12,12-hexa-p-toluyl-4H-8H-12H-12C-aza-dibenzo[cd,mn]pylene (abbreviation: FATPA), 4,4'-bis(dibenzo-azepin-1-yl)-biphenyl (abbreviation: BazBP), 4,4'-bis(dihydro-dibenzo-azepin-1-yl)-biphenyl (abbreviation: HBazBP), 4,4'-(diphenylmethylene)bis(N,N-diphenylamine) (abbreviation: TCBPA), and 4,4'-(diphenylsilanediyl)bis(N,N-diphenylamine) (abbreviation: TSBPA). The structural formulae of them are shown below. The organic compound having a tetraarylmethane skeleton or a tetraarylsilane skeleton and an electron-donating property is not limited thereto. The structural formulae of them are shown below.

[Chemical Formulae 6]

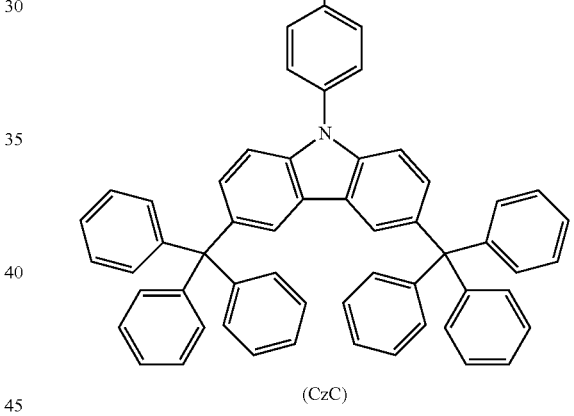

(CzC)

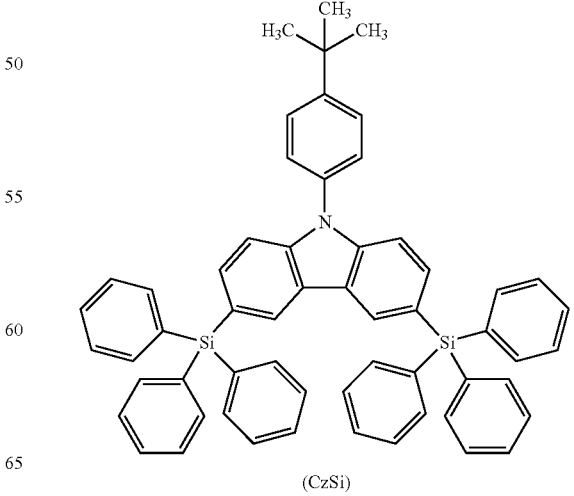

(CzSi)

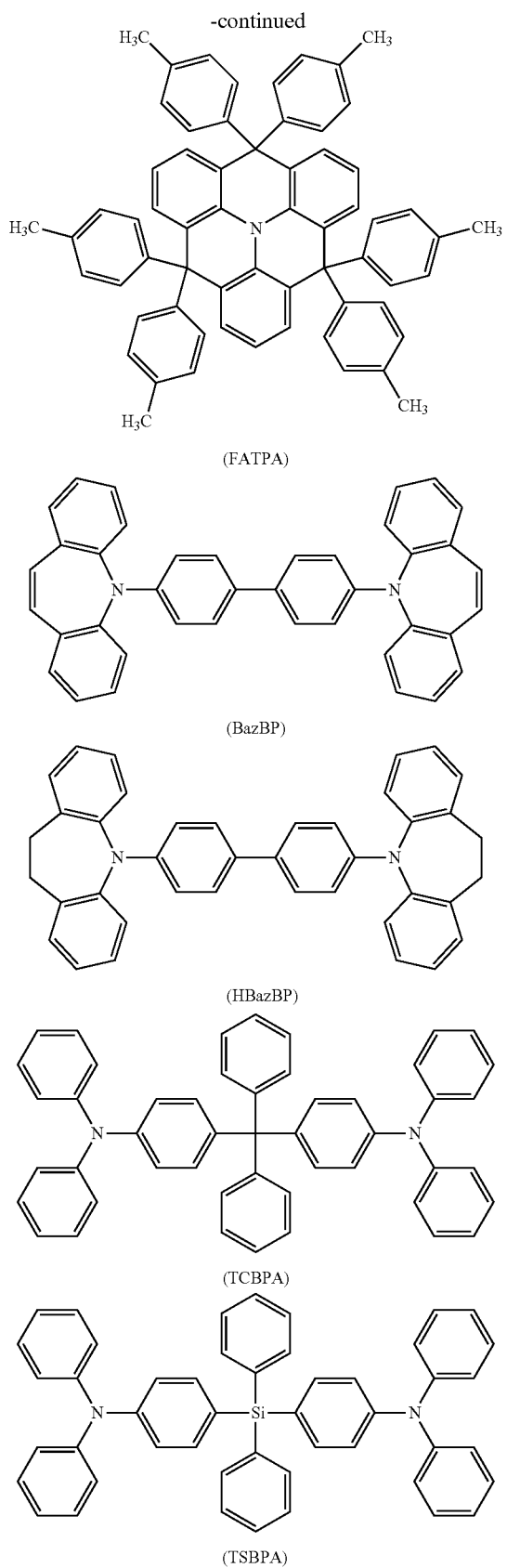

(FATPA)

(BazBP)

(HBazBP)

(TCBPA)

(TSBPA)

Note that a low molecular organic compound can be suitably used for the electronic device of one embodiment of the present invention. The use of the low molecular organic compound enables all the layers in the EL layer 100 to be deposited by vacuum evaporation, so that the formation process can be simplified.

<<Improvement in Outcoupling Efficiency with Optical Path Length Adjustment>>

The outcoupling efficiency of the electronic device of one embodiment of the present invention can be further improved by the optical path length adjustment. Light with a desired wavelength among light emitted from the light-emitting layer 130 can be efficiently extracted.

For example, to efficiently extract light with a desired wavelength (wavelength: λ) obtained from the light-emitting layer 130, the optical path length from the interface between the electrode 101 and the hole-injection layer 111 to a region where light with a desired wavelength can be obtained in the light-emitting layer 130 (a light-emitting region 134) is preferably adjusted to around (2m'−1)λ/4 (m' is a natural number). Here, the light-emitting region means a region where holes and electrons are recombined in the light-emitting layer 130.

Such optical adjustment can reduce light attenuation due to an evanescent mode and thus can improve the outcoupling efficiency of the light-emitting layer 130.

In addition, the optical path length from the interface between the substrate 200 and the electrode 101 to the region where light with a desired wavelength can be obtained in the light-emitting layer 130 (the light-emitting region 134) is preferably adjusted to around mλ/2 (m is a natural number). Such optical adjustment can reduce light attenuation due to an evanescent mode and thus can improve the outcoupling efficiency of the light-emitting layer 130.

In order to perform the optical adjustment, the thickness of the hole-injection layer 111 or the hole-transport layer 112 needs to be adjusted; however, a high refractive index of the hole-injection layer 111 is likely to lengthen the optical path length, which makes it difficult to adjust the optical path length or increases driving voltage because of the increased thickness of the hole-injection layer 111, in some cases. However, in one embodiment of the present invention, the hole-injection layer 111 has a low refractive index; thus, the optical path length can be easily adjusted and the thickness can be reduced. Therefore, not only an improvement in the outcoupling efficiency of the light-emitting layer 130 but also simplification of the formation process of a light-emitting element and a light-emitting element with low driving voltage can be achieved.

Light incident on an electronic device may also attenuate due to the evanescent wave. For example, in the case where the electronic device of one embodiment of the present invention is used for a solar cell, light attenuation due to the evanescent wave can be inhibited and thus a light-trapping effect of the organic solar cell can be improved. Hence, the electronic device of one embodiment of the present invention can be suitably used for a solar cell. In that case, the functional layer 40 in the electronic device 50 illustrated in FIG. 1 may be rephrased as an active layer.

The structure in which light is efficiently extracted by adjustment of the optical path length of a light-emitting element to a wavelength λ of desired light is described above, and an example of the case where this structure is applied to a solar cell is described with reference to FIG. 1. The thickness between a pair of electrodes, i.e., the thickness of the organic semiconductor layer 20 in FIG. 1, is preferably adjusted so that the optical path length is different from a wavelength λ' of light incident on the electronic device 50. With such a structure, light incident on the electronic device 50 can be efficiently trapped in the electronic device 50. In addition, in the electronic device of one embodiment of the present invention, light attenuation due to an evanescent wave can be inhibited; thus, a light-trapping effect can be obtained more efficiently.

<Material>

Next, components of a light-emitting element, which is an example of the electronic device of one embodiment of the present invention, are described in detail below.

<<Light-Emitting Layer>>

The light-emitting layer 130 includes at least the host material 131 and preferably further includes the guest material 132. As described later, the host material 131 may include an organic compound 131_1 and an organic compound 131_2. In the light-emitting layer 130, the host material 131 is present in the highest proportion by weight, and the guest material 132 is dispersed in the host material 131. When the guest material 132 is a fluorescent compound, the S1 level of the host material 131 (the organic compound 131_1 and the organic compound 131_2) in the light-emitting layer 130 is preferably higher than the S1 level of the guest material (the guest material 132) in the light-emitting layer 130. When the guest material 132 is a phosphorescent compound, the T1 level of the host material 131 (the organic compound 131_1 and the organic compound 131_2) in the light-emitting layer 130 is preferably higher than the T1 level of the guest material (the guest material 132) in the light-emitting layer 130.

The organic compound 131_1 preferably includes a heteroaromatic skeleton having two or more nitrogen atoms and 1 to 20 carbon atoms. A compound including a pyrimidine skeleton and a triazine skeleton is particularly preferable. As the organic compound 131_1, a material having a property of transporting more electrons than holes (an electron-transport material) can be used, and a material having an electron mobility of $1\times10^{-6}$ cm$^2$/Vs or higher is preferable.

Specifically, for example, heterocyclic compounds including a diazine skeleton, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm), or heterocyclic compounds including a triazine skeleton, a pyrimidine skeleton, or a triazole skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn), 2-{3-[3-(benzo[b]naphtho[1,2-d]furan-8-yl)phenyl]phenyl}-4,6-diphenyl-1,3,5-triazine (abbreviation: mBnfBPTzn), 2,4,6-tris(biphenyl-3-yl)-1,3,5-triazine (abbreviation: T2T), 2,4,6-tris[3'-(pyridin-3-yl)-biphenyl-3-yl]-1,3,5-triazine (abbreviation: TmPPPyTz), and 9-[4-(3,5-diphenyl-1H-1,2,4-triazol-1-yl)]phenyl-9H-carbazole (abbreviation: CzTAZ(1H)) are preferred because of their high stability and reliability. In addition, the heterocyclic compounds having the skeletons have a high electron-transport property to contribute to a reduction in driving voltage. The substances described here are mainly substances having an electron mobility of $1\times10^{-6}$ cm$^2$/Vs or higher. Note that other substances may also be used as long as they have a property of transporting more electrons than holes.

As the organic compound 131_1, a compound such as a pyridine derivative, a pyrazine derivative, a pyridazine derivative, a bipyridine derivative, a quinoxaline derivative, a dibenzoquinoxaline derivative, a phenanthroline derivative, or a purine derivative can also be used. Such an organic compound preferably has an electron mobility of $1\times10^{-6}$ cm$^2$/Vs or higher.

Specific examples include heterocyclic compounds including a pyridine skeleton, such as bathophenanthroline (abbreviation: BPhen) and bathocuproine (abbreviation: BCP); heteroaromatic ring compounds including a pyrazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[fh]quinoxaline (abbreviation: 7mDBTPDBq-II), 6-[3-(dibenzothiophen-4-yl)phenyl]dibenzo[fh]quinoxaline (abbreviation: 6mDBTPDBq-II), and 2-[3-(3,9'-bi-9H-carbazol-9-yl)phenyl]dibenzo[f,h]quinoxaline (abbreviation: 2mCzCzPDBq); and heterocyclic compounds including a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)](abbreviation: PF-BPy) can be used. Note that other substances may also be used as long as they have a property of transporting more electrons than holes.

The organic compound 131_2 preferably includes a heteroaromatic skeleton having two or more nitrogen atoms and 1 to 20 carbon atoms. In particular, a nitrogen-containing five-membered heterocyclic skeleton is preferable. Examples include an imidazole skeleton, a triazole skeleton, and a tetrazole skeleton. As the organic compound 131_2, a material having a property of transporting more holes than electrons (a hole-transport material) can be used, and a material having a hole mobility of $1\times10^{-6}$ cm$^2$/Vs or higher is preferable. Furthermore, the hole-transport material may be a high molecular compound.

Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and the like can be used, for example.

As the organic compound 131_2, a compound including another nitrogen-containing five-membered heterocyclic skeleton or a tertiary amine skeleton can also be suitably used. Specific examples include compounds including any of a pyrrole skeleton and an aromatic amine skeleton. Examples include an indole derivative, a carbazole derivative, and a triarylamine derivative. As the organic compound 131_2, a material having a property of transporting more holes than electrons (a hole-transport material) can be used, and a material having a hole mobility of $1\times10^{-6}$ cm$^2$/Vs or higher is preferable. Furthermore, the hole-transport material may be a high molecular compound.

Examples of the aromatic amine compounds that can be used as the material having a high hole-transport property include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis{4-[bis(3-methylphenyl)amino]phenyl}-N,N-diphenyl- (1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and 4,4'-bis(9-carbazolyl)-2,2'-dimethyl-biphenyl (abbreviation: dmCBP).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Furthermore, it is possible to use N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), N,N,N',N',N'',N'',N''',N'''-octaphenyldibenzo[g,p]chrysene-2,7,10,15-tetraamine (abbreviation: DBC1), 1,1-bis-(4-bis(4-methyl-phenyl)-amino-phenyl)-cyclohexane (abbreviation: TAPC), or the like.

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N'-bis(4-butylphenyl)-N,N-bis(phenyl)benzidine] (abbreviation: poly-TPD).

Examples of the material having a high hole-transport property include aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). In addition, amine compounds, carbazole compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT) can be used. Among the above compounds, compounds including a pyrrole skeleton or an aromatic amine skeleton are preferred because of their high stability and reliability. In addition, the compounds having such skeletons have a high hole-transport property to contribute to a reduction in driving voltage.

Although the guest material 132 in the light-emitting layer 130 is not particularly limited, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferred as a fluorescent compound, and for example, the following substances can be used.

Specific examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation:

2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[i]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As the guest material 132 (phosphorescent compound), an iridium-, rhodium-, or platinum-based organometallic complex or metal complex can be used; in particular, an organoiridium complex such as an iridium-based ortho-metalated complex is preferable. Examples of an ortho-metalated ligand include a 4H-triazole ligand, a 1H-triazole ligand, an imidazole ligand, a pyridine ligand, a pyrimidine ligand, a pyrazine ligand, and an isoquinoline ligand. Examples of the metal complex include a platinum complex having a porphyrin ligand.

Examples of the substance that has an emission peak in blue or green include organometallic iridium complexes including a 4H-triazole skeleton, such as tris{2-[5-(2-methylphenyl)-4-(2,6-dimethylphenyl)-4H-1,2,4-triazol-3-yl-κN²]phenyl-κC}iridium(III) (abbreviation: Ir(mpptz-dmp)₃), tris(5-methyl-3,4-diphenyl-4H-1,2,4-triazolato)iridium(III) (abbreviation: Ir(Mptz)₃), tris[4-(3-biphenyl)-5-isopropyl-3-phenyl-4H-1,2,4-triazolato]iridium(III) (abbreviation: Ir(iPrptz-3b)₃), and tris[3-(5-biphenyl)-5-isopropyl-4-phenyl-4H-1,2,4-triazolato]iridium(III) (abbreviation: Ir(iPr5btz)₃); organometallic iridium complexes including a 1H-triazole skeleton, such as tris[3-methyl-1-(2-methylphenyl)-5-phenyl-1H-1,2,4-triazolato]iridium(III) (abbreviation: Ir(Mptzl-mp)₃) and tris(1-methyl-5-phenyl-3-propyl-1H-1,2,4-triazolato)iridium(III) (abbreviation: Ir(Prptzl-Me)₃); organometallic iridium complexes including an imidazole skeleton, such asfac-tris[1-(2,6-diisopropylphenyl)-2-phenyl-1H-imidazole]iridium(III) (abbreviation: Ir(iPrpmi)₃), tris[3-(2,6-dimethylphenyl)-7-methylimidazo[1,2-f]phenanthridinato]iridium(III) (abbreviation: Ir(dmpimpt-Me)₃), and tris{2-[1-(4-cyano-2,6-diisobutylphenyl)-1H-benzimidazol-2-yl-cN³]phenyl-κC}iridium(III) (abbreviation: Ir(pbi-diBuCNp)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III) picolinate (abbreviation: Ir(CF₃ppy)₂(pic)), and bis[2-(4',6'-difluorophenyl)pyridinato-N,C²']iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and luminous efficiency and are thus especially preferable.

Examples of the substance that has an emission peak in green or yellow include organometallic iridium complexes including a pyrimidine skeleton, such as tris(4-methyl-6-phenylpyrimidinato)iridium(III) (abbreviation: Ir(mppm)₃), tris(4-t-butyl-6-phenylpyrimidinato)iridium(III) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[4-(2-norbornyl)-6-phenylpyrimidinato]iridium(III) (abbreviation: Ir(nbppm)₂(acac)), (acetylacetonato)bis[5-methyl-6-(2-methylphenyl)-4-phenylpyrimidinato]iridium(III) (abbreviation: Ir(mpmppm)₂(acac)), (acetylacetonato)bis{4,6-dimethyl-2-[6-(2,6-dimethylphenyl)-4-pyrimidinyl-κN³]phenyl-κC}iridium(III) (abbreviation: Ir(dmppm-dmp)₂(acac), and (acetylacetonato)bis(4,6-diphenylpyrimidinato)iridium(III) (abbreviation: Ir(dppm)₂(acac)); organometallic iridium complexes including a pyrazine skeleton, such as (acetylacetonato)bis(3,5-dimethyl-2-phenylpyrazinato)iridium(III) (abbreviation: Ir(mppr-Me)₂(acac)) and (acetylacetonato)bis(5-isopropyl-3-methyl-2-phenylpyrazinato)iridium(III) (abbreviation: Ir(mppr-iPr)₂(acac)); organometallic iridium complexes including a pyridine skeleton, such as tris(2-phenylpyridinato-N,C²')iridium(III) (abbreviation: Ir(ppy)₃), bis(2-phenylpyridinato-N,C²')iridium(III) acetylacetonate (abbreviation: Ir(ppy)₂(acac)), bis(benzo[h]quinolinato)iridium(III) acetylacetonate (abbreviation: Ir(bzq)₂(acac)), tris(benzo[h]quinolinato)iridium(III) (abbreviation: Ir(bzq)₃), tris(2-phenylquinolinato-N,C²')iridium(III) (abbreviation: Ir(pq)₃), and bis(2-phenylquinolinato-N,C²')iridium(III) acetylacetonate (abbreviation: Ir(pq)₂(acac)); organometallic iridium complexes such as bis(2,4-diphenyl-1,3-oxazolato-N,C²')iridium(III) acetylacetonate (abbreviation: Ir(dpo)₂(acac)), bis{2-[4'-(perfluorophenyl)phenyl]pyridinato-N,C²'}iridium(III) acetylacetonate (abbreviation: Ir(p-PF-ph)₂(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes including a pyrimidine skeleton have distinctively high reliability and luminous efficiency and are thus especially preferable.

Examples of the substance that has an emission peak in yellow or red include organometallic iridium complexes including a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes including a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl) quinoxalinato]iridium(III) (abbreviation: Ir(Fdpq)$_2$(acac)); organometallic iridium complexes including a pyridine skeleton, such as tris(1-phenylisoquinolinato-N,C$^{2'}$)iridium(III) (abbreviation: Ir(piq)$_3$) and bis(1-phenylisoquinolinato-N, C$^{2'}$)iridium(III) acetylacetonate (abbreviation: Ir(piq)$_2$ (acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline) europium(III) (abbreviation: Eu(TTA)$_3$(Phen)). Among the materials given above, the organometallic iridium complexes including a pyrimidine skeleton have distinctively high reliability and luminous efficiency and are thus especially preferable. Furthermore, the organometallic iridium complexes including a pyrazine skeleton can emit red light with favorable chromaticity.

The light-emitting material included in the light-emitting layer 130 is preferably a material that can convert the triplet excitation energy into light emission. Examples of the material that can convert the triplet excitation energy into light emission include a thermally activated delayed fluorescent (TADF) material in addition to the phosphorescent compound. Therefore, it is acceptable that the phosphorescent compound in the description is replaced with the thermally activated delayed fluorescent material. Note that the thermally activated delayed fluorescent material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. Thermally activated delayed fluorescence is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the thermally activated delayed fluorescent material is composed of one kind of material, any of the following materials can be used, for example.

First, a fullerene, a derivative thereof, an acridine derivative such as proflavine, eosin, and the like can be given. Furthermore, a metal-containing porphyrin containing magnesium (Mg), zinc (Zn), cadmium (Cd), tin (Sn), platinum (Pt), indium (In), palladium (Pd), or the like can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$ (Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

As the thermally activated delayed fluorescent material composed of one kind of material, a heterocyclic compound including a π-electron rich heteroaromatic ring and a π-electron deficient heteroaromatic ring can also be used. Specific examples include 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10 OH-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), and 10-phenyl-10H, 10'H-spiro[acridin-9,9'-anthracen]-10'-one (abbreviation: ACRSA). The heterocyclic compound is preferable because of its high electron-transport property and hole-transport property due to the π-electron rich heteroaromatic ring and the π-electron deficient heteroaromatic ring contained therein. Among skeletons having the π-electron deficient heteroaromatic ring, a diazine skeleton (a pyrimidine skeleton, a pyrazine skeleton, or a pyridazine skeleton) and a triazine skeleton are particularly preferable because of their high stability and reliability. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the energy level in the singlet excited state and the energy level in the triplet excited state becomes small.

The light-emitting layer 130 may contain another material in addition to the host material 131 and the guest material 132.

Examples of the material that can be used for the light-emitting layer 130 are, but not limited to, condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a singlet excitation energy level or a triplet excitation energy level higher than the excitation energy level of the guest material 132 are selected from these substances and known substances.

For example, a compound including a heteroaromatic skeleton, such as an oxadiazole derivative, can be used for the light-emitting layer 130. Specific examples include heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), and 4,4'-bis(5-methylbenzoxazol-2-yl)stilbene (abbreviation: BzOs).

In addition, a metal complex (e.g., a zinc- or aluminum-based metal complex) with a heterocycle, for example, can be used for the light-emitting layer 130. Examples include metal complexes having a quinoline ligand, a benzoquinoline ligand, an oxazole ligand, and a thiazole ligand. Specific examples include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. Light-emitting materials included in the first light-emitting layer and the second light-emitting layer may be the same or different from each other, and the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (an oligomer, a dendrimer, a polymer, or the like) may be included.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide having an electron-accepting property, a phthalocyanine derivative, an aromatic amine, a heteropolyacid, or the like. Examples of the transition metal oxide include titanium oxide, vanadium oxide, tantalum oxide, molybdenum oxide, tungsten oxide, rhenium oxide, ruthenium oxide, chromium oxide, zirconium oxide, hafnium oxide, and silver oxide; the transition metal oxide is preferable because it has an excellent electron-accepting property and can be easily deposited by a vacuum evaporation method or a wet process. Examples of the phthalocyanine derivative include phthalocyanine and metal phthalocyanine. Examples of the aromatic amine include a benzidine derivative and a phenylenediamine derivative. It is also possible to use a high molecular compound such as polythiophene or polyaniline; a typical example thereof is poly(ethylenedioxythiophene)/poly(styrenesulfonic acid), which is self-doped polythiophene. Examples of the heteropolyacid include a phosphomolybdic acid, a phosphotungstic acid, a silicomolybdic acid, and a silicotungstic acid. The heteropolyacid and the high molecular compound are preferable because they can be easily deposited by a wet process.

As the hole-injection layer 111, a layer including a composite material of the above-described hole-transport material with a low refractive index and the above-described material having an electron-accepting property is preferably used. With such a structure, a layer with hole-injection and hole-transport properties and a low refractive index can be formed. As the organic material having an electron-accepting property, TCNQ, F4TCNQ, or F6TCNNQ can be suitably used. A stack of a layer containing a material having an electron-accepting property and a layer containing a hole-transport material may also be used. In a steady state or in the presence of an electric field, electric charge can be transferred between these materials. In addition to TCNQ, F4TCNQ, and F6TCNNQ described above, examples of the organic material having an electron-accepting property include organic acceptors such as a quinodimethane derivative, a chloranil derivative, and a hexaazatriphenylene derivative. A specific example is a compound having an electron-withdrawing group (a halogen group or a cyano group), such as chloranil or 2,3,6,7,10,11-hexacyano-1,4,5, 8,9,12-hexaazatriphenylene (abbreviation: HAT-CN). A substance containing oxygen and a transition metal such as titanium, vanadium, tantalum, molybdenum, tungsten, rhenium, ruthenium, chromium, zirconium, hafnium, or silver can also be used. Specific examples include titanium oxide, vanadium oxide, tantalum oxide, molybdenum oxide, tungsten oxide, rhenium oxide, ruthenium oxide, chromium oxide, zirconium oxide, hafnium oxide, silver oxide, a phosphomolybdic acid, molybdenum copper, and tungsten copper. In particular, molybdenum oxide is preferable because it is stable in the air, has a low hygroscopic property, and is easily handled.

As described above, as the hole-transport material with a low refractive index used for the hole-injection layer 111, an organic compound having a structure in which a conjugation between aromatic rings is cut typically by an sp$^3$ bond, or an organic compound including an aromatic ring that has a bulky substituent can be suitably used. Examples of a skeleton having a structure in which a conjugation between aromatic rings is cut include the tetraarylmethane skeleton and the tetraarylsilane skeleton described above. However, these compounds tend to have poor carrier-transport properties and thus are not suitable for a conventional hole-injection layer. On the other hand, the above-described substance containing a transition metal and oxygen itself has an excellent effect of increasing a hole-injection property but has a problem of a high refractive index. However, it is found that when the above-described substance containing a transition metal and oxygen is used, as the material exhibiting an electron-accepting property, in combination with the hole-transport material with a low refractive index for the hole-injection layer 111, the hole-injection layer 111 can have hole-injection and hole-transport properties while keeping its refractive index low. That is, this structure can cancel disadvantages of both of the materials and offer only advantages. This is probably because the substance containing a transition metal oxide has a high electron-accepting property and thus addition of a small amount of the substance can ensure a hole-injection property.

As the hole-transport material, a material having a property of transporting more holes than electrons can be used, and a material having a hole mobility of $1\times10^{-6}$ cm$^2$/Vs or higher is preferable. As described above, the refractive index of the hole-transport material is preferably higher than or equal to 1 and lower than or equal to 1.75, further preferably higher than or equal to 1 and lower than or equal to 1.73, still further preferably higher than or equal to 1 and lower than or equal to 1.70. Specifically, any of the aromatic amine, carbazole derivative, aromatic hydrocarbon, stilbene derivative, and the like described as examples of the hole-transport material that can be used in the light-emitting layer 130 can be used, and the heteroaromatic skeleton having two or more nitrogen atoms and 1 to 20 carbon atoms is particularly preferably included. In particular, a nitrogen-containing five-membered heterocyclic skeleton is preferable. Furthermore, the hole-transport material may be a high molecular compound.

Other examples of the hole-transport material include aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can be used. The aromatic hydrocarbon having a hole mobility of $1\times10^{-6}$ cm$^2$/Vs or higher and having 14 to 42 carbon atoms is particularly preferably used.

The aromatic hydrocarbon may include a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

In addition, thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II) can be used. Among the above compounds, compounds including a pyrrole skeleton, a furan skeleton, a thiophene skeleton, or an aromatic amine skeleton are preferred because of their high stability and reliability. In addition, the compounds including such skeletons have a high hole-transport property to contribute to a reduction in driving voltage.

<<Hole-Transport Layer>>

The hole-transport layer 112 is a layer containing a hole-transport material and can be formed using any of the hole-transport materials described as examples of the material of the hole-injection layer 111. In order that the hole-transport layer 112 can have a function of transporting holes injected into the hole-injection layer 111 to the light-emitting layer 130, the HOMO (Highest Occupied Molecular Orbital) level of the hole-transport layer 112 is preferably equal or close to the HOMO level of the hole-injection layer 111.

A substance having a hole mobility of $1\times10^{-6}$ cm$^2$/Vs or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specific examples include a pyridine derivative, a bipyridine derivative, a pyrimidine derivative, a triazine derivative, a quinoxaline derivative, a dibenzoquinoxaline derivative, a phenanthroline derivative, a triazole derivative, a benzimidazole derivative, and an oxadiazole derivative, which are described above as the electron-transport material that can be used for the light-emitting layer 130, and a heteroaromatic skeleton having two or more nitrogen atoms and 1 to 20 carbon atoms is preferably included. A compound including a pyrimidine skeleton and a triazine skeleton is particularly preferable. A substance having an electron mobility of $1\times10^{-6}$ cm$^2$/Vs or higher is preferable. Note that other substances may also be used for the electron-transport layer 118 as long as they have a property of transporting more electrons than holes. The electron-transport layer 118 is not limited to a single layer, and two or more layers containing the aforementioned substances may be stacked.

In addition, metal complexes with a heterocycle, such as metal complexes having a quinoline ligand, a benzoquinoline ligand, an oxazole ligand, and a thiazole ligand, can be given. Specific examples include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Besides, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

A layer that controls transfer of electron carriers may be provided between the electron-transport layer 118 and the light-emitting layer 130. This layer is formed by addition of a small amount of a substance having a high electron-trapping property to the material having a high electron-transport property described above, and the layer is capable of adjusting carrier balance by suppressing transport of electron carriers. Such a structure is very effective in suppressing a problem (e.g., a decrease in element lifetime) which occurs in the case where the electron-transport property of the electron-transport material is significantly higher than the hole-transport property of the hole-transport material.

<<Electron-Injection Layer>>

The electron-injection layer 119 has a function of reducing a barrier for electron injection from the electrode 102 to promote electron injection and can be formed using a Group 1 metal, a Group 2 metal, or an oxide, a halide, a carbonate, or the like of them, for example. Alternatively, a composite material of the electron-transport material described above and a material having a property of donating electrons thereto can be used. Examples of the material having an electron-donating property include a Group 1 metal, a Group 2 metal, and an oxide of any of them. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Alternatively, a rare earth metal compound such as erbium fluoride ($ErF_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons; specifically, the above-listed substances contained in the electron-transport layer 118 (the metal complexes, heteroaromatic compounds, and the like) can be used, for example. As the electron donor, a substance showing an electron-donating property with respect to the organic compound may be used. Specifically, an alkali metal, an alkaline earth metal, and a rare earth metal are preferable, and examples include lithium, sodium, cesium, magnesium, calcium, erbium, and ytterbium. In addition, an alkali metal oxide or an alkaline earth metal oxide is preferable, and examples include lithium oxide, calcium oxide, and barium oxide. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, gravure printing, or the like. Besides the above-mentioned materials, an inorganic compound such as a quantum dot or a high molecular compound (an oligomer, a dendrimer, a polymer, or the like) may be used for the light-emitting layer, the hole-injection layer, the hole-transport layer, the electron-transport layer, and the electron-injection layer described above.

<<Quantum Dot>>

A quantum dot is a semiconductor nanocrystal with a size of several nanometers to several tens of nanometers and contains approximately $1 \times 10^3$ to $1 \times 10^6$ atoms. Since energy shift of quantum dots depends on their size, quantum dots made of the same substance emit light with different wavelengths depending on their size. Thus, emission wavelengths can be easily adjusted by changing the size of quantum dots to be used.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, the use of a quantum dot as a light-emitting material enables a light-emitting element having high luminous efficiency to be obtained. Furthermore, since a quantum dot, which is an inorganic material, has high inherent stability, a light-emitting element that is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the structure of the quantum dot, any of a core type, a core-shell type, a core-multishell type, and the like may be used. When a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It is also possible to reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl) amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots have a function of emitting directional light; thus, quantum rods can be used as a light-emitting material to obtain a light-emitting element with higher external quantum efficiency.

In most organic EL elements, to improve luminous efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable luminous efficiency to be ensured; thus, a light-emitting element that is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to 3 nm to 100 nm, preferably 10 nm to 100 nm, and the quantum dot content of the light-emitting layer is 1 volume % to 100 volume %. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an inkjet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

<<Pair of Electrodes>>

The electrode 101 and the electrode 102 function as an anode and a cathode of a light-emitting element. The electrode 101 and the electrode 102 can be formed using a metal, an alloy, a conductive compound, a mixture or a stack thereof, or the like.

One of the electrode 101 and the electrode 102 is preferably formed using a conductive material having a function of reflecting light. Examples of the conductive material include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, silver (Ag), an alloy containing Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like may be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Light emitted from the light-emitting layer is extracted through one or both of the electrode 101 and the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrode 101 and the electrode 102 may be formed using a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material having a function of transmitting light, a material that has a function of transmitting visible light and has conductivity is used, and examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1 \times 10^5$ Ω·cm, further preferably lower than or equal to $1 \times 10^4$ Ω·cm.

Alternatively, one or both of the electrode 101 and the electrode 102 may be formed by stacking two or more of these materials.

In order to improve the outcoupling efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used, and stacked layers with a thickness of several nanometers to several tens of nanometers may be used.

In the case where the electrode 101 or the electrode 102 functions as a cathode, the electrode preferably contains a material with a low work function (3.8 eV or lower). For example, it is possible to use an element belonging to Group 1 or Group 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, or the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and the light of a desired wavelength is intensified, which is preferable.

As the method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or the optical element.

In the present invention and the like, a light-emitting element can be formed using any of a variety of substrates, for example. The type of substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of the flexible substrate, the attachment film, the base material film, and the like include substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper.

Alternatively, a flexible substrate may be used as the substrate such that the light-emitting element is formed directly on the flexible substrate. Further alternatively, a separation layer may be provided between the substrate and the light-emitting element. The separation layer can be used when part or the whole of a light-emitting element formed thereover is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Examples of the substrate to which the light-emitting element is transferred include, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. With the use of such a substrate, a light-emitting element with high durability, a light-emitting element with high heat resistance, a light-emitting element with reduced weight, or a light-emitting element with reduced thickness can be formed.

The light-emitting element 150 may be formed over an electrode electrically connected to a field-effect transistor (FET), for example, that is formed over any of the above-described substrates. Accordingly, an active matrix display device in which the FET controls the driving of the light-emitting element 150 can be fabricated.

Components of a solar cell, which is an example of the electronic device of one embodiment of the present invention, are described below.

For the solar cell, the material that can be used for the above-described light-emitting element can be used. In the solar cell, the above-described hole-transport material and electron-transport material can be used for a carrier-transport layer, and the above-described hole-transport material and electron-transport material, a light-emitting material, a perovskite crystal typified by silicon or $CH_3NH_3PbI_3$, and the like can be used for a light-generation layer. For a substrate and an electrode, the materials that can be used for the above-described light-emitting element can be used.

The structure described above in this embodiment can be used as appropriate in combination with any of the other embodiments.

Embodiment 2

In this embodiment, a light-emitting element having a structure different from the structure of the light-emitting element described in Embodiment 1 and a light emission mechanism of the light-emitting element will be described below with reference to FIG. 3 and FIG. 4. Note that in FIG. 3 and FIG. 4, a portion having a function similar to that of a portion denoted by a reference numeral shown in FIG. 2(A) is represented by the same hatch pattern and the reference numeral is omitted in some cases. In addition, common reference numerals are used for portions having similar functions, and a detailed description thereof is omitted in some cases.

Structure Example 1 of Light-Emitting Element

Figure 3A:
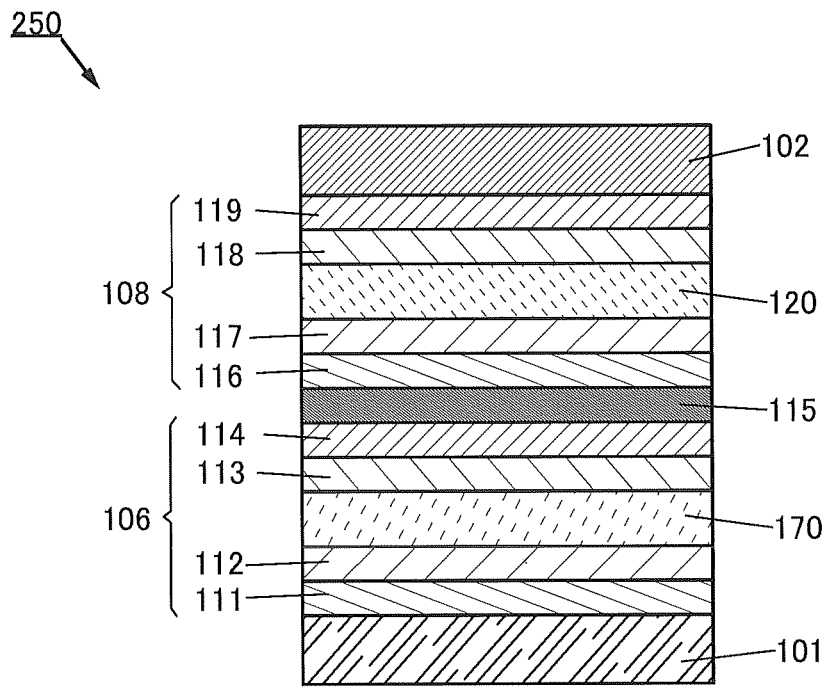
FIGS. 3A-3C are schematic cross-sectional views of a light-emitting element of one embodiment of the present invention, an example of the light-emitting layer, and a view showing correlations of energy levels of a light-emitting layer.

FIG. 3(A) is a schematic cross-sectional view of a light-emitting element 250.

The light-emitting element 250 shown in FIG. 3(A) includes a plurality of light-emitting units (a light-emitting unit 106 and a light-emitting unit 108 in FIG. 3(A)) between a pair of electrodes (the electrode 101 and the electrode 102). Note that the electrode 101 functions as an anode and the electrode 102 functions as a cathode in the light-emitting element 250 in the following description; however, the functions of the electrodes may be reversed as the structure of the light-emitting element 250.

Moreover, in the light-emitting element 250 shown in FIG. 3(A), the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures.

The light-emitting element 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 170. The light-emitting unit 108 includes a hole-injection layer 116, a hole-transport layer 117, the electron-transport layer 118, and the electron-injection layer 119 in addition to the light-emitting layer 120.

The charge-generation layer 115 may have either a structure in which a substance having an acceptor property, which is an electron acceptor, is added to a hole-transport material or a structure in which a substance having a donor property, which is an electron donor, is added to an electron-transport material. Moreover, both of these structures may be stacked.

In the case where the charge-generation layer 115 contains a composite material of an organic compound and a substance having an acceptor property, the composite material that can be used for the hole-injection layer 111 described in Embodiment 1 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1 \times 10^{-6}$ cm$^2$/Vs or higher is preferably used as the organic compound. Note that other substances may also be used as long as they have a property of transporting more holes than electrons. Since the composite material of an organic compound and a substance having an acceptor property has excellent carrier-injection and carrier-transport properties, low-voltage driving or low-current driving can be realized.

Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 3(A), the charge-generation layer 115 injects electrons into the light-emitting unit 106 and injects holes into the light-emitting unit 108 when voltage is applied such that the potential of the electrode 101 is higher than the potential of the electrode 102.

Note that in terms of outcoupling efficiency, the charge-generation layer 115 preferably has a property of transmitting visible light (specifically, the transmittance of visible light through the charge-generation layer 115 is higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in driving voltage in the case where the light-emitting layers are stacked.

The light-emitting element having two light-emitting units has been shown in FIG. 3(A); however, a light-emitting element in which three or more light-emitting units are stacked can be similarly employed. When a plurality of light-emitting units partitioned by the charge-generation layer are arranged between a pair of electrodes as in the light-emitting element 250, it is possible to realize a light-emitting element that can emit high-luminance light with the current density kept low and has a long lifetime. Moreover, a light-emitting element with low power consumption can be realized.

Note that in each of the above structures, the emission colors exhibited by the guest materials used in the light-emitting unit 106 and the light-emitting unit 108 may be the same or different. In the case where guest materials having a function of exhibiting light emission of the same color are used for the light-emitting unit 106 and the light-emitting unit 108, the light-emitting element 250 can exhibit high emission luminance at a small current value, which is preferred. In the case where guest materials having a function of exhibiting light emission of different colors are used for the light-emitting unit 106 and the light-emitting unit 108, the light-emitting element 250 can exhibit multi-color light emission, which is preferred. In this case, with use of a plurality of light-emitting materials with different emission wavelengths in one or both of the light-emitting layer 120 and the light-emitting layer 170, the light-emitting element 250 emits light obtained by synthesizing light emission having different emission peaks; thus, its emission spectrum has at least two maximum values.

The above structure is also suitable for obtaining white light emission. When the light-emitting layer 120 and the light-emitting layer 170 emit light of complementary colors, white light emission can be obtained. It is particularly suitable to select the guest materials so that white light emission with high color rendering properties or light emission of at least red, green, and blue can be obtained.

In the case of a light-emitting element in which three or more light-emitting units are stacked, colors of light emitted from guest materials used in the light-emitting units may be the same or different from each other. In the case where a plurality of light-emitting units that exhibit the same emission color are included, the emission color of the plurality of light-emitting units can have higher emission luminance at a smaller current value than another color. Such a structure can be suitably used for adjustment of emission colors. The structure is particularly suitable when guest materials that emit light of different colors with different luminous efficiencies are used. For example, when three layers of light-emitting units are included, the intensity of fluorescence and phosphorescence can be adjusted with two layers of light-emitting units that contain a fluorescent material for the same color and one layer of a light-emitting unit that contains a phosphorescent material that emits light of a color different from the emission color of the fluorescent material. That is, the intensity of emitted light of each color can be adjusted with the number of light-emitting units.

In the case of the light-emitting element including two layers of fluorescent units and one layer of a phosphorescent unit, it is preferable that the light-emitting element include the two layers of the light-emitting units including a blue fluorescent material and the one layer of the light-emitting unit including a yellow phosphorescent material; that the light-emitting element include the two layers of the light-emitting units including a blue fluorescent material and the one layer of the light-emitting-layer unit including a red phosphorescent material and a green phosphorescent material; or that the light-emitting element include the two layers of the light-emitting units including a blue fluorescent material and the one layer of the light-emitting-layer unit including a red phosphorescent material, a yellow phosphorescent material, and a green phosphorescent material, in which case white light emission can be obtained efficiently.

At least one of the light-emitting layer 120 and the light-emitting layer 170 may further be divided into layers and the divided layers may contain different light-emitting materials. That is, at least one of the light-emitting layer 120 and the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors When any of the structures described in Embodiment 1 is used for at least one of the plurality of units, a light-emitting element with excellent outcoupling efficiency and reduced driving voltage can be provided.

Figure 3B:
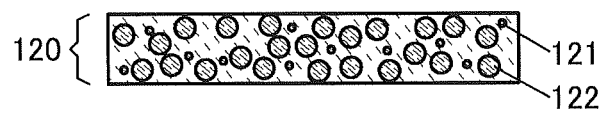

The light-emitting layer 120 included in the light-emitting unit 108 includes a guest material 121 and a host material 122 as shown in FIG. 3(B). Note that the guest material 121 is described below as a fluorescent material.

<<Light Emission Mechanism of Light-Emitting Layer 120>>

The light emission mechanism of the light-emitting layer 120 is described below.

By recombination of the electrons and holes injected from the pair of electrodes (the electrode 101 and the electrode 102) or the charge-generation layer 115 in the light-emitting layer 120, excitons are generated. The amount of the host material 122 is larger than that of the guest material 121; thus, the excited states are formed mostly as those of the host material 122 by the exciton generation. Note that the exciton refers to a pair of carriers (an electron and a hole).

In the case where the formed excited state of the host material 122 is a singlet excited state, singlet excitation energy transfers from the S1 level of the host material 122 to the S1 level of the guest material 121, thereby forming the singlet excited state of the guest material 121.

Since the guest material 121 is a fluorescent material, the formation of a singlet excited state in the guest material 121 makes the guest material 121 immediately emit light. To obtain high luminous efficiency in this case, the fluorescence quantum yield of the guest material 121 is preferably high. The same applies to the case where the excited state formed by carrier recombination in the guest material 121 is a singlet excited state.

Figure 3C:
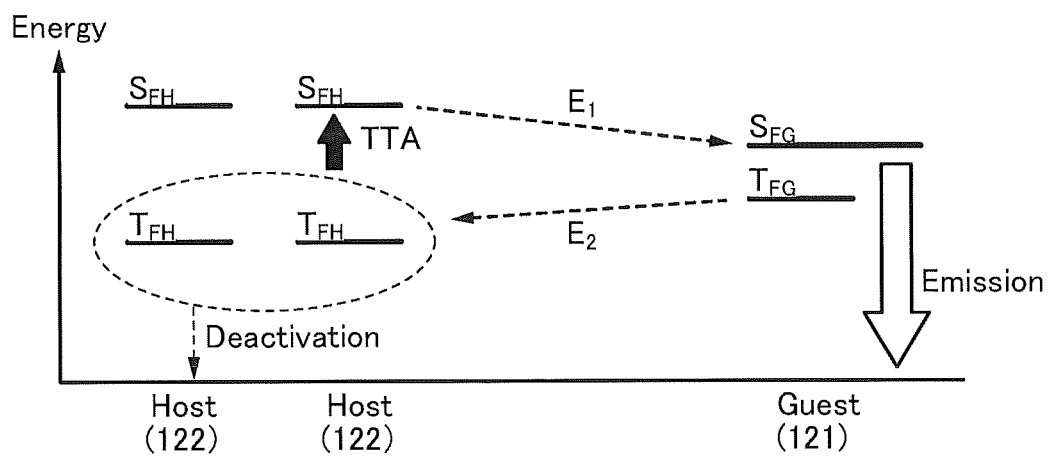

Next, the case where carrier recombination forms a triplet excited state of the host material 122 is described. The correlation between energy levels of the host material 122 and the guest material 121 in this case is shown in FIG. 3(C). The following explains what terms and numerals in FIG. 3(C) represent. Note that it is preferable that the T1 level of the host material 122 be lower than the T1 level of the guest material 121 and thus FIG. 3(C) shows such a case; however, the T1 level of the host material 122 may be higher than the T1 level of the guest material 121.

Guest (121): the guest material 121 (fluorescent material);
Host (122): the host material 122;
$S_{FG}$: the S1 level of the guest material 121 (fluorescent material);
$T_{FG}$: the T1 level of the guest material 121 (fluorescent material);
$S_{FH}$: the S1 level of the host material 122; and
$T_{FH}$: the T1 level of the host material 122.

As shown in FIG. 3(C), triplet-triplet annihilation (TTA) occurs, that is, triplet excitons formed by carrier recombination interact with each other, and excitation energy is transferred and spin angular momenta are exchanged between them; as a result, a reaction in which the triplet excitons are converted into singlet excitons having energy of the S1 level ($S_{FH}$) of the host material 122 is caused (see TTA in FIG. 3(C)). The singlet excitation energy of the host material 122 is transferred from $S_{FH}$ to the S1 level ($S_{FG}$) of the guest material 121 having a lower energy than $S_{FH}$ (see Route $E_1$ in FIG. 3(C)), and a singlet excited state of the guest material 121 is formed, whereby the guest material 121 emits light.

Note that in the case where the density of triplet excitons in the light-emitting layer 120 is sufficiently high (e.g., $1 \times 10^{12}$ cm$^{-3}$ or higher), only the reaction of two triplet excitons close to each other can be considered whereas deactivation of a single triplet exciton is ignored.

In the case where a triplet excited state is formed by carrier recombination in the guest material 121, the triplet excited state of the guest material 121 is thermally deactivated and thus is difficult to use for light emission. However, in the case where the T1 level ($T_{FH}$) of the host material 122 is lower than the T1 level ($T_{FG}$) of the guest material 121, the triplet excitation energy of the guest material 121 can be transferred from the T1 level ($T_{FG}$) of the guest material 121 to the T1 level ($T_{FH}$) of the host material 122 (see Route $E_2$ in FIG. 3(C)) and then is utilized for TTA.

In other words, the host material 122 preferably has a function of converting triplet excitation energy into singlet excitation energy by TTA. Accordingly, the triplet excitation energy generated in the light-emitting layer 120 can be partly converted into singlet excitation energy by TTA in the host material 122; then, the singlet excitation energy can be transferred to the guest material 121 and extracted as fluorescence. In order to achieve this, the S1 level ($S_{FH}$) of the host material 122 is preferably higher than the S1 level ($S_{FG}$) of the guest material 121. In addition, the T1 level ($T_{FH}$) of the host material 122 is preferably lower than the T1 level ($T_{FG}$) of the guest material 121.

Note that particularly in the case where the T1 level ($T_{FG}$) of the guest material 121 is lower than the T1 level ($T_{FH}$) of the host material 122, the weight ratio of the guest material 121 to the host material 122 is preferably low. Specifically, the weight ratio of the guest material 121 to the host material 122 is preferably greater than 0 and less than or equal to 0.05 when the host material 122 is 1. In such a case, the probability of carrier recombination in the guest material 121 can be reduced. In addition, the probability of energy transfer from the T1 level ($T_{FH}$) of the host material 122 to the T1 level ($T_{FG}$) of the guest material 121 can be reduced.

Note that the host material 122 may be composed of a single compound or a plurality of compounds.

In the case where the light-emitting unit 106 and the light-emitting unit 108 contain guest materials with different emission colors, light emitted from the light-emitting layer 120 preferably has an emission peak on the shorter wavelength side than light emitted from the light-emitting layer 170. The luminance of a light-emitting element using a material having a high triplet excitation energy level tends to degrade quickly. With the use of TTA in the light-emitting layer emitting light with a short wavelength, a light-emitting element with small luminance degradation can be provided.

Structure Example 2 of Light-Emitting Element

Figure 4A:
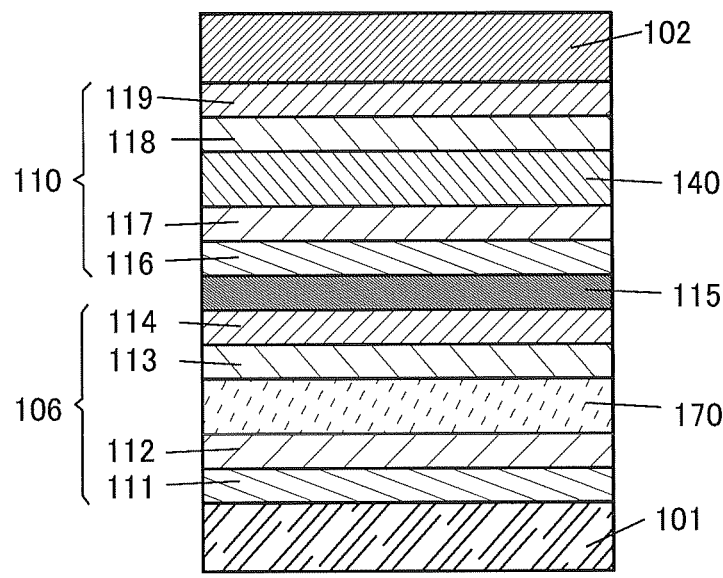
FIGS. 4A-4C are schematic cross-sectional views of a light-emitting element of one embodiment of the present invention, an example of the light-emitting layer, and a view showing correlations of energy levels of a light-emitting layer.

FIG. 4(A) is a schematic cross-sectional view of a light-emitting element 252.

The light-emitting element 252 shown in FIG. 4(A) includes, like the light-emitting element 250 described above, a plurality of light-emitting units (the light-emitting unit 106 and a light-emitting unit 110 in FIG. 4(A)) between a pair of electrodes (the electrode 101 and the electrode 102). At least one of the light-emitting units has a structure similar to that of the EL layer 100. Note that the light-emitting unit 106 and the light-emitting unit 110 may have the same structure or different structures.

Moreover, in the light-emitting element 252 shown in FIG. 4(A), the light-emitting unit 106 and the light-emitting unit 110 are stacked, and the charge-generation layer 115 is provided between the light-emitting unit 106 and the light-emitting unit 110. For example, the EL layer 100 is preferably used in the light-emitting unit 106.

The light-emitting element 252 includes a light-emitting layer 140 and the light-emitting layer 170. The light-emitting unit 106 includes the hole-injection layer 111, the hole-transport layer 112, the electron-transport layer 113, and the electron-injection layer 114 in addition to the light-emitting layer 170. The light-emitting unit 110 includes the hole-injection layer 116, the hole-transport layer 117, the electron-transport layer 118, and the electron-injection layer 119 in addition to the light-emitting layer 140.

When any of the structures described in Embodiment 1 is used for at least one of the plurality of units, a light-emitting element with excellent outcoupling efficiency and reduced driving voltage can be provided.

Figure 4B:
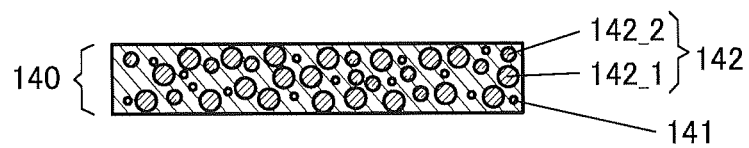

The light-emitting layer 140 included in the light-emitting unit 110 includes a guest material 141 and a host material 142 as shown in FIG. 4(B). The host material 142 includes an organic compound 142_1 and an organic compound 142_2. Note that the guest material 141 included in the light-emitting layer 140 is described below as a phosphorescent material.

<<Light Emission Mechanism of Light-Emitting Layer 140>>

Next, the light emission mechanism of the light-emitting layer 140 is described below.

The organic compound 142_1 and the organic compound 142_2 which are included in the light-emitting layer 140 form an exciplex.

Although it is acceptable as long as the combination of the organic compound 142_1 and the organic compound 142_2 can form an exciplex, it is preferable that one of them be a compound having a hole-transport property and the other be a compound having an electron-transport property.

Figure 4C:
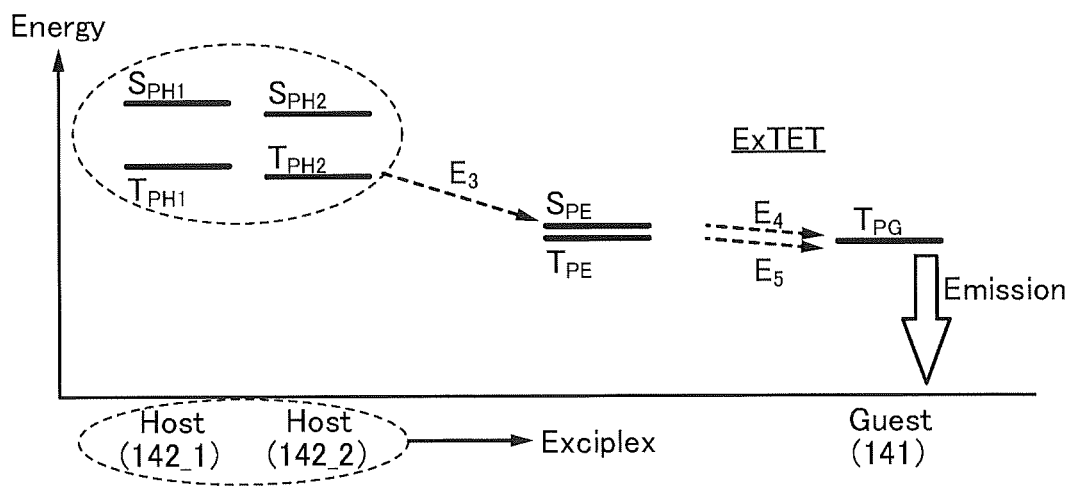

FIG. 4(C) shows a correlation between the energy levels of the organic compound 142_1, the organic compound 142_2, and the guest material 141 in the light-emitting layer 140. The following explains what terms and numerals in FIG. 4(C) represent.

Guest (141): the guest material 141 (phosphorescent material);

Host (142_1): the organic compound 142_1 (host material);

Host (142_2): the organic compound 142_2 (host material);

$T_{PG}$: the T1 level of the guest material 141 (phosphorescent material);

$S_{PH1}$: the S1 level of the organic compound 142_1 (host material);

$T_{PH1}$: the T1 level of the organic compound 142_1 (host material);

$S_{PH2}$: the S1 level of the organic compound 142_2 (host material);

$T_{PH2}$: the T1 level of the organic compound 142_2 (host material);

$S_{PE}$: the S1 level of the exciplex; and $T_{PE}$: the T1 level of the exciplex.

The organic compound 142_1 and the organic compound 142_2 form an exciplex, and the S1 level ($S_{PE}$) and the T1 level ($T_{PE}$) of the exciplex become energies adjacent to each other (see Route $E_3$ in FIG. 4(C)).

One of the organic compound 142_1 and the organic compound 142_2 receives a hole and the other receives an electron to readily form an exciplex. Alternatively, when one of the organic compounds is brought into an excited state, the one immediately interacts with the other to form an exciplex. Consequently, most excitons in the light-emitting layer 140 exist as exciplexes. Because the excitation energy levels ($S_{PE}$ and $T_{PE}$) of the exciplex are lower than the S1 levels ($S_{PH1}$ and $S_{PH2}$) of the host materials (the organic compound 142_1 and the organic compound 142_2) that form the exciplex, the excited state of the host material 142 can be formed with lower excitation energy. This can reduce the driving voltage of the light-emitting element.

Both energies ($S_{PE}$) and ($T_{PE}$) of the exciplex are then transferred to the T1 level of the guest material 141 (phosphorescent material); thus, light emission is obtained (see Routes $E_4$ and $E_5$ in FIG. 4(C)).

Note that the T1 level ($T_{PE}$) of the exciplex is preferably higher than the T1 level ($T_{PG}$) of the guest material 141. In this way, the singlet excitation energy and the triplet excitation energy of the generated exciplex can be transferred from the S1 level ($S_{PE}$) and the T1 level ($T_{PE}$) of the exciplex to the T1 level ($T_{PG}$) of the guest material 141.

In order to efficiently transfer excitation energy from the exciplex to the guest material 141, the T1 level ($T_{PE}$) of the exciplex is preferably lower than or equal to the T1 levels ($T_{PH1}$ and $T_{PH2}$) of the organic compounds (the organic compound 142_1 and the organic compound 142_2) that form the exciplex. Thus, quenching of the triplet excitation energy of the exciplex due to the organic compounds (the organic compound 142_1 and the organic compound 142_2) is less likely to occur, resulting in efficient energy transfer from the exciplex to the guest material 141.

In order to efficiently form an exciplex by the organic compound 142_1 and the organic compound 142_2, it is preferable that the HOMO level of one of the organic compound 142_1 and the organic compound 142_2 be higher than the HOMO level of the other and the LUMO level of the one of the organic compound 142_1 and the organic compound 142_2 be higher than the LUMO level of the other. For example, when the organic compound 142_1 has a hole-transport property and the organic compound 142_2 has an electron-transport property, it is preferable that the HOMO level of the organic compound 142_1 be higher than the HOMO level of the organic compound 142_2 and the LUMO level of the organic compound 142_1 be higher than the LUMO level of the organic compound 142_2. Alternatively, when the organic compound 142_2 has a hole-transport property and the organic compound 142_1 has an electron-transport property, it is preferable that the HOMO level of the organic compound 142_2 be higher than the HOMO level of the organic compound 142_1 and the LUMO level of the organic compound 142_2 be higher than the LUMO level of the organic compound 142_1. Specifically, the energy difference between the HOMO level of the organic compound 142_1 and the HOMO level of the organic compound 142_2 is preferably greater than or equal to 0.05 eV, further preferably greater than or equal to 0.1 eV, still further preferably greater than or equal to 0.2 eV. Moreover, the energy difference between the LUMO level of the organic compound 142_1 and the LUMO level of the organic compound 142_2 is preferably greater than or equal to 0.05 eV, further preferably greater than or equal to 0.1 eV, still further preferably greater than or equal to 0.2 eV.

In the case where the combination of the organic compound 142_1 and the organic compound 142_2 is a combination of a compound having a hole-transport property and a compound having an electron-transport property, the carrier balance can be easily controlled by adjusting the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily.

When the light-emitting layer 140 has the above-described structure, light emission from the guest material 141 (phosphorescent material) of the light-emitting layer 140 can be obtained efficiently.

Note that the above-described processes through Routes $E_3$ to $E_5$ are sometimes referred to as ExTET (Exciplex-Triplet Energy Transfer) in this specification and the like. In other words, in the light-emitting layer 140, excitation energy is transferred from the exciplex to the guest material 141. In this case, the efficiency of reverse intersystem crossing from $T_{PE}$ to $S_{PE}$ is not necessarily high and the emission quantum yield from $S_{PE}$ is not necessarily high; thus, materials can be selected from a wide range of options.

Note that light emitted from the light-emitting layer 170 preferably has an emission peak on the shorter wavelength side than light emitted from the light-emitting layer 140. The luminance of a light-emitting element using a phosphorescent material emitting light with a short wavelength tends to degrade quickly. In view of the above, fluorescence is used for light emission with a short wavelength, so that a light-emitting element with small luminance degradation can be provided.

<Examples of Material that can be Used in Light-Emitting Layers>

Next, materials that can be used in the light-emitting layer 120, the light-emitting layer 140, and the light-emitting layer 170 are described below.

<<Material that can be Used in Light-Emitting Layer 120>>

In the light-emitting layer 120, the host material 122 is present in the highest proportion by weight, and the guest material 121 (fluorescent material) is dispersed in the host material 122. The S1 level of the host material 122 is preferably higher than the S1 level of the guest material 121 (fluorescent material) while the T1 level of the host material 122 is preferably lower than the T1 level of the guest material 121 (fluorescent material).

The guest material 121 in the light-emitting layer 120 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and any of the fluorescent compounds described in Embodiment 1 can be suitably used.

Although there is no particular limitation on a material that can be used as the host material 122 in the light-emitting layer 120, examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or ca-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino] biphenyl (abbreviation: BSPB). Other examples include condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthryl) phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl) diphenanthrene (abbreviation: DPNS2), and 3,3',3''-(benzene-1,3,5-triyl)tripyrene (abbreviation: TPB3). One or more substances having a wider energy gap than the guest material 121 are selected from these substances and known substances.

The light-emitting layer 120 can have a structure in which two or more layers are stacked. For example, in the case where the light-emitting layer 120 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 120, the host material 122 may be composed of one kind of compound or a plurality of compounds. Alternatively, the light-emitting layer 120 may contain another material in addition to the host material 122 and the guest material 121.

<<Material that can be Used in Light-Emitting Layer 140>>

In the light-emitting layer 140, the host material 142 is present in the highest proportion by weight, and the guest material 141 (phosphorescent material) is dispersed in the host material 142. The T1 levels of the host material 142 (the organic compound 142_1 and the organic compound 142_2) of the light-emitting layer 140 are preferably higher than the T1 level of the guest material 141.

Examples of the organic compound 142_1 include, in addition to a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples include an aromatic amine and a carbazole derivative. Specifically, the electron-transport material and the hole-transport material described in Embodiment 1 can be used.

As the organic compound 142_2, a substance that can form an exciplex together with the organic compound 142_1 is preferably used. Specifically, the electron-transport material and the hole-transport material described in Embodiment 1 can be used. In that case, the organic compound 142_1, the organic compound 142_2, and the guest material 141 (phosphorescent material) is preferably selected such that the emission peak of the exciplex formed by the organic compound 142_1 and the organic compound 142_2 overlaps with an absorption band, specifically an absorption band on the longest wavelength side, of a triplet MLCT (Metal to Ligand Charge Transfer) transition of the guest material 141 (phosphorescent material). This makes it possible to provide a light-emitting element with drastically improved luminous efficiency. Note that in the case where a thermally activated delayed fluorescent material is used instead of the phosphorescent material, the absorption band on the longest wavelength side is preferably a singlet absorption band.

An example of the guest material 141 (phosphorescent material) is an iridium-, rhodium-, or platinum-based organometallic complex or metal complex; in particular, an organoiridium complex such as an iridium-based ortho-metalated complex is preferred. Examples of an ortho-metalated ligand include a 4H-triazole ligand, a 1H-triazole ligand, an imidazole ligand, a pyridine ligand, a pyrimidine ligand, a pyrazine ligand, and an isoquinoline ligand. Examples of the metal complex include a platinum complex having a porphyrin ligand. Specifically, the material described in Embodiment 1 as an example of the guest material 132 can be used.

The light-emitting material contained in the light-emitting layer 140 is a material that can convert triplet excitation energy into light emission. Examples of the material that can convert triplet excitation energy into light emission include, in addition to the phosphorescent material, a thermally activated delayed fluorescent material. Therefore, the term "phosphorescent material" in the description may be replaced with "thermally activated delayed fluorescent material".

The material that exhibits thermally activated delayed fluorescence may be a material that can form a singlet excited state from a triplet excited state by reverse intersystem crossing by itself or may be composed of a plurality of materials that form an exciplex.

In the case where the thermally activated delayed fluorescent material is formed of one kind of material, any of the thermally activated delayed fluorescent materials described in Embodiment 1 can be specifically used.

In the case where the thermally activated delayed fluorescent material is used as the host material, it is preferable to use a combination of two kinds of compounds that form an exciplex. In this case, it is particularly preferable to use the above-described combination of a compound that easily accepts electrons and a compound that easily accepts holes, which form an exciplex.

<<Material that can be Used in Light-Emitting Layer 170>>

As a material that can be used in the light-emitting layer 170, a material that can be used in the light-emitting layer in Embodiment 1 can be used, so that a light-emitting element with high luminous efficiency can be formed.

The emission colors of the light-emitting materials contained in the light-emitting layer 120, the light-emitting layer 140, and the light-emitting layer 170 are not limited, and they may be the same or different from each other. Light emitted from the light-emitting materials is mixed and then extracted to the outside of the element; therefore, for example, in the case where their emission colors are complementary colors, the light-emitting element can emit white light. In consideration of the reliability of the light-emitting element, the emission peak wavelength of the light-emitting material contained in the light-emitting layer 120 is preferably shorter than that of the light-emitting material contained in the light-emitting layer 170.

Note that the light-emitting unit 106, the light-emitting unit 108, the light-emitting unit 110, and the charge-generation layer 115 can be formed by a method such as an evaporation method (including a vacuum evaporation method), an inkjet method, a coating method, or gravure printing.

The structures described above in this embodiment can be used in an appropriate combination with any of the structures described in the other embodiments.

Embodiment 3

Figure 5A:
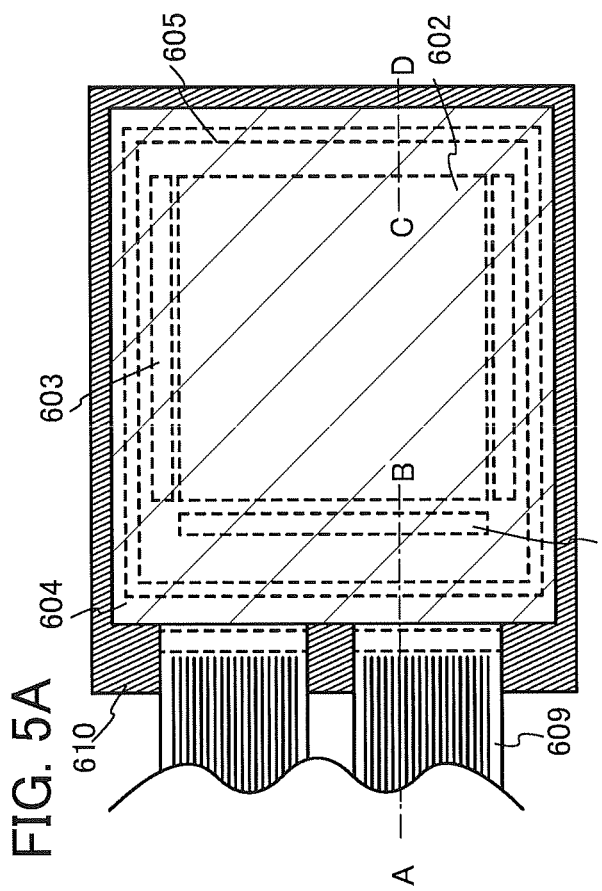
FIGS. 5A and 5B are conceptional views of an active matrix light-emitting device of one embodiment of the present invention.
Figure 5B:
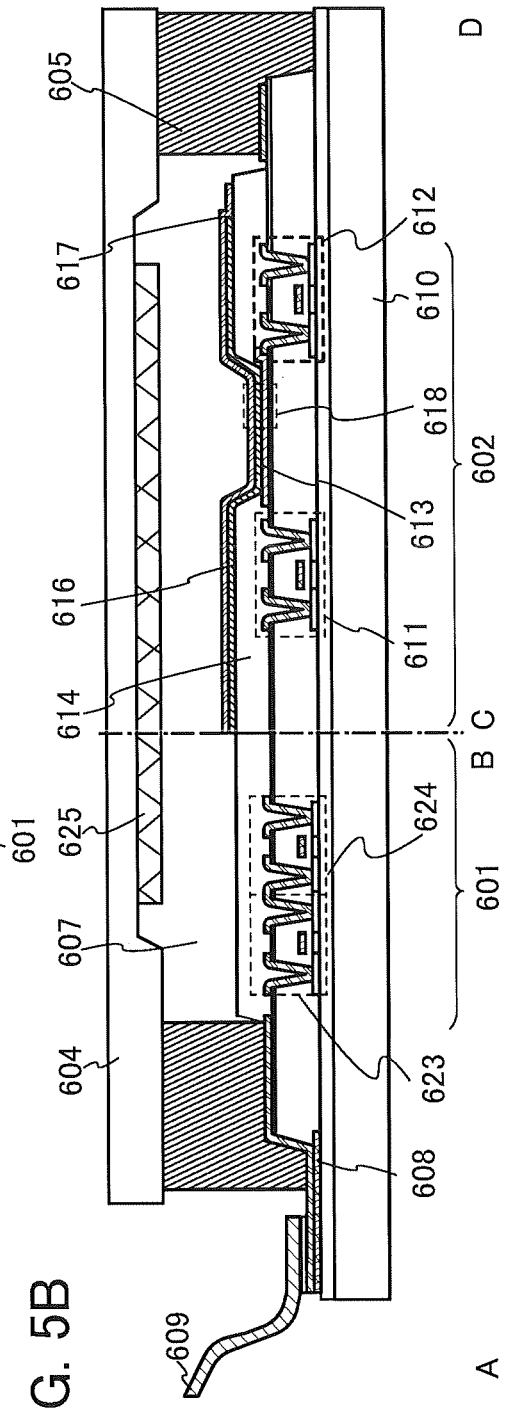

FIG. 5(A) is a top view of a light-emitting device and FIG. 5(B) is a cross-sectional view taken along A-B and C-D in FIG. 5(A). This light-emitting device includes a driver circuit portion (a source side driver circuit) 601, a pixel portion 602, and a driver circuit portion (a gate side driver circuit) 603 which are indicated by dotted lines as components controlling light emission from a light-emitting element. Furthermore, 604 denotes a sealing substrate, 625 denotes a desiccant, 605 denotes a sealing material, and a portion surrounded by the sealing material 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is shown here, a printed wiring board (PWB) may be attached to the FPC. The light-emitting device in this specification includes not only the light-emitting device itself but also the state where the FPC or the PWB is attached thereto.

Next, a cross-sectional structure of the above light-emitting device is described with reference to FIG. 5(B). The driver circuit portion and the pixel portion are formed over an element substrate 610; here, the source side driver circuit 601, which is the driver circuit portion, and one pixel of the pixel portion 602 are shown.

In the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, the driver circuit is not necessarily integrated and can be formed not over the substrate but outside the substrate.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed using a positive photosensitive resin film.

In order to improve the coverage of a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative photosensitive material or a positive photosensitive material can be used as the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of a titanium nitride film and a film containing aluminum as its main component, a three-layer structure including a titanium nitride film, a film containing aluminum as its main component, and a titanium nitride film, or the like can be used. Note that the stacked structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, such as MgAg, MgIn, or AlLi) is preferably used. Note that in the case where light generated in the EL layer 616 passes through the second electrode 617, a stacked layer including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting element 618 is formed with the first electrode 613, the EL layer 616, and the second electrode 617. The light-emitting element 618 is preferably a light-emitting element having any of the structures described in Embodiment 1 and Embodiment 2. The pixel portion includes a plurality of light-emitting elements, and the light-emitting device of this embodiment may include both the light-emitting element with the structure described in Embodiment 1 and Embodiment 2 and a light-emitting element with a different structure.

When the sealing substrate 604 and the element substrate 610 are attached to each other with the sealing material 605, a structure in which the light-emitting element 618 is provided in the space 607 surrounded by the element substrate 610, the sealing substrate 604, and the sealing material 605 is obtained. Note that the space 607 is filled with a filler, and may be filled with an inert gas (nitrogen, argon, or the like) or a resin and/or a desiccant.

Note that an epoxy-based resin or glass frit is preferably used for the sealing material 605. Such a material is desirably a material that transmits moisture or oxygen as little as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting device including the light-emitting element described in Embodiment 1 and Embodiment 2 can be obtained.

Structure Example 1 of Light-Emitting Device

As an example of a light-emitting device, FIG. 6 shows a light-emitting device including a light-emitting element exhibiting white light emission and a coloring layer (a color filter).

FIG. 6(A) shows a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of the light-emitting elements, a partition 1026, an EL layer 1028, a second electrode 1029 of the light-emitting elements, a sealing substrate 1031, a sealing material 1032, and the like.

In FIG. 6(A) and FIG. 6(B), coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 6(A), light emitted from some of the light-emitting layers does not pass through the coloring layers and is extracted to the outside, while light emitted from the other light-emitting layers passes through the coloring layers and is extracted to the outside. Since light that does not pass through the coloring layers is white and light that passes through the coloring layers is red, blue, or green, an image can be displayed by pixels of the four colors.

FIG. 6(B) shows an example in which the red coloring layer 1034R, the green coloring layer 1034G, and the blue coloring layer 1034B are formed between the gate insulating film 1003 and the first interlayer insulating film 1020. As shown in FIG. 6(B), the coloring layers may be provided between the substrate 1001 and the sealing substrate 1031.

The above-described light-emitting device is a light-emitting device having a structure in which light is extracted from the substrate 1001 side where the TFTs are formed (a bottom emission type), but may be a light-emitting device having a structure in which light is extracted from the sealing substrate 1031 side (a top emission type).

Structure Example 2 of Light-Emitting Device

Figure 7:
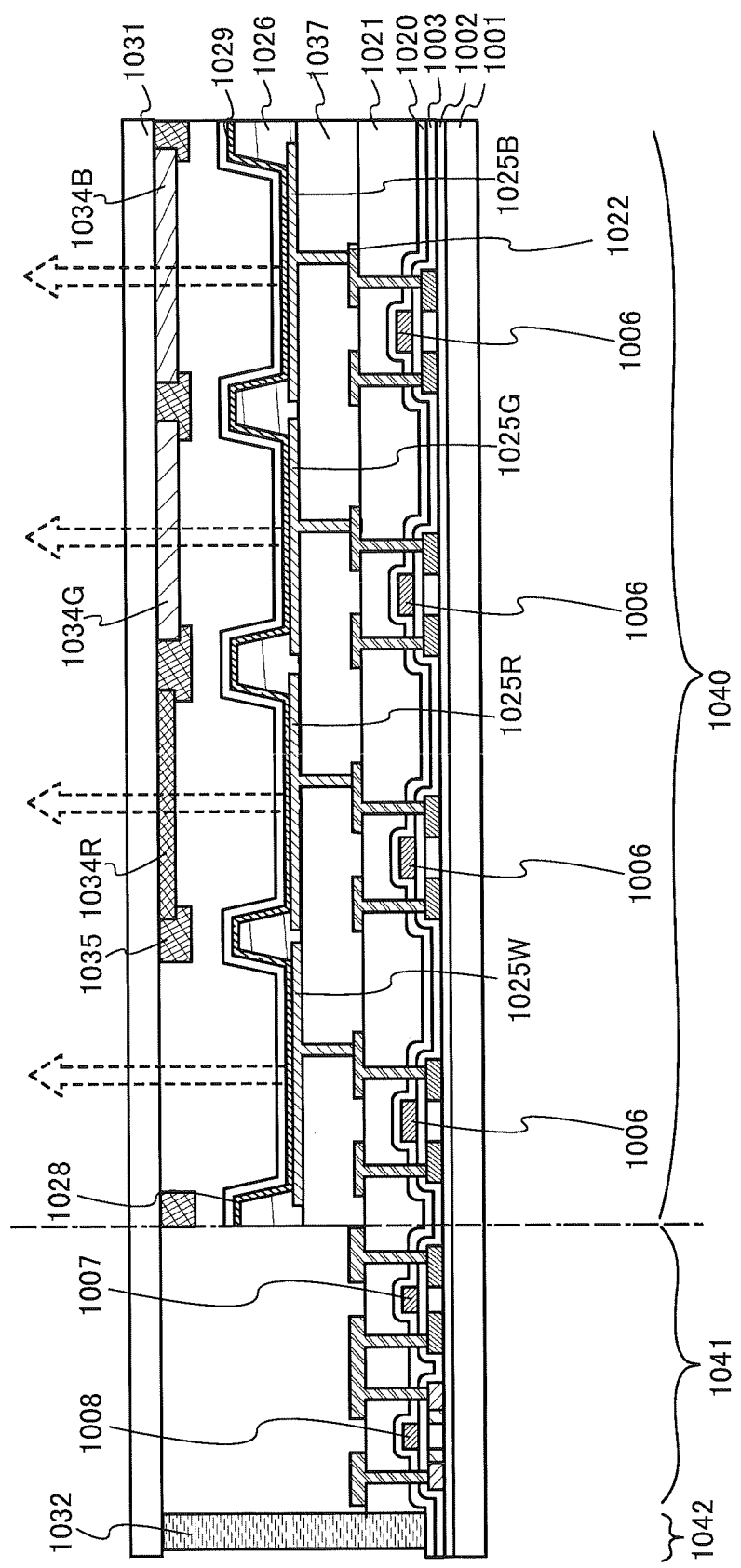
FIG. 7 is a conceptual view of an active matrix light-emitting device of one embodiment of the present invention.

FIG. 7 shows a cross-sectional view of a top-emission light-emitting device. In that case, a substrate that does not transmit light can be used as the substrate 1001. The process up to the formation of a connection electrode that connects the TFT and the anode of the light-emitting element is performed in a manner similar to that of a bottom-emission light-emitting device. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

First lower electrodes 1025W, 1025R, 1025G, and 1025B of the light-emitting element are anodes here, but may be cathodes. Furthermore, in the case of the top-emission light-emitting device as shown in FIG. 7, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light with a specific wavelength is amplified. The EL layer 1028 has a structure similar to the structure described in Embodiment 2, with which white light emission can be obtained.

In FIG. 6(A), FIG. 6(B), and FIG. 7, the structure of the EL layer for providing white light emission can be achieved by, for example, using a plurality of light-emitting layers or using a plurality of light-emitting units. Note that the structure for providing white light emission is not limited thereto.

In a top emission structure as shown in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1035 positioned between pixels. The coloring layers (the red coloring layer 1034R, the green coloring layer 1034G, and the blue coloring layer 1034B) and the black layer (black matrix) may be covered with the overcoat layer. Note that a substrate having a light-transmitting property is used as the sealing substrate 1031.

Although an example in which full color display is performed using four colors of red, green, blue, and white is shown here, there is no particular limitation and full color display using three colors of red, green, and blue may be performed. Alternatively, full color display using four colors of red, green, blue, and yellow may be performed.

As described above, the light-emitting device including the light-emitting element described in Embodiment 1 and Embodiment 2 can be obtained.

Note that this embodiment can be combined as appropriate with any of the other embodiments.

Embodiment 4

In this embodiment, electronic devices of embodiments of the present invention are described.

One embodiment of the present invention is a light-emitting element using organic EL, and thus, an electronic device with a flat surface having high luminous efficiency and high reliability can be manufactured. An electronic device with a curved surface, high luminous efficiency, and high reliability can be manufactured according to one embodiment of the present invention. In addition, an electronic device with flexibility, high luminous efficiency, and high reliability can be manufactured according to one embodiment of the present invention.

Examples of the electronic devices include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The light-emitting device of one embodiment of the present invention can achieve high visibility regardless of the intensity of external light. Thus, the light-emitting device of one embodiment of the present invention can be suitably used for a portable electronic device, a wearable electronic device (wearable device), an e-book reader, or the like.

Figure 8A:
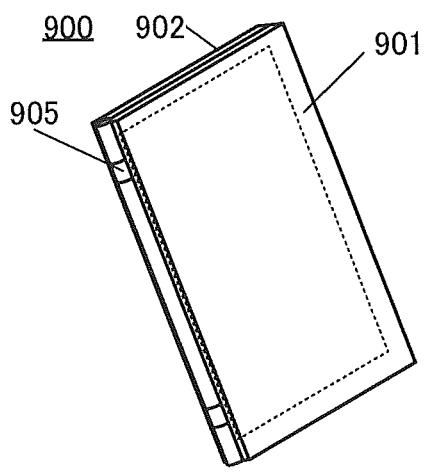
FIGS. 8A-8D are schematic views of electronic appliances of embodiments of the present invention.
Figure 8B:
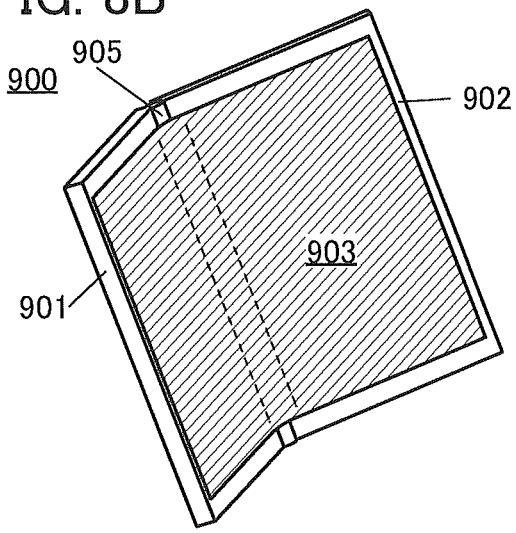

A portable information terminal 900 shown in FIGS. 8(A) and 8(B) includes a housing 901, a housing 902, a display portion 903, a hinge portion 905, and the like.

The housing 901 and the housing 902 are joined together by the hinge portion 905. The portable information terminal 900 can be opened as shown in FIG. 8(B) from a folded state (FIG. 8(A)). Thus, the portable information terminal 900 has high portability when carried and excellent visibility when used because of its large display region.

In the portable information terminal 900, the flexible display portion 903 is provided across the housing 901 and the housing 902 which are joined together by the hinge portion 905.

The light-emitting device manufactured using one embodiment of the present invention can be used for the display portion 903. Thus, the portable information terminal can be manufactured with high yield.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held while being in a significantly curved form. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 900 and less than 180° and can be typically 90°, 120°, 1350, 150°, 175°, or the like. In that case, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be obtained.

A power button, an operation button, an external connection port, a speaker, a microphone, or the like may be provided for the housing 901 and the housing 902.

One of the housing 901 and the housing 902 is provided with a wireless communication module, and data can be transmitted and received through a computer network such as the Internet, a LAN (Local Area Network), or Wi-Fi (registered trademark).

Figure 8C:
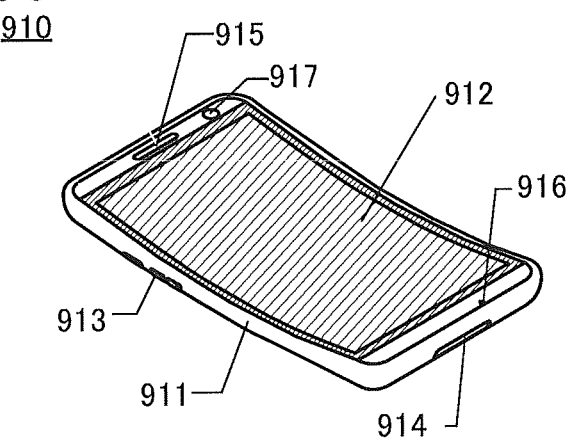

A portable information terminal 910 shown in FIG. 8(C) includes a housing 911, a display portion 912, an operation button 913, an external connection port 914, a speaker 915, a microphone 916, a camera 917, and the like.

The light-emitting device manufactured using one embodiment of the present invention can be used for the display portion 912. Thus, the portable information terminal can be manufactured with high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal 910 can be used as a smartphone. The portable information terminal 910 is capable of executing a variety of applications such as mobile phone calls, e-mailing, text viewing and writing, music replay, video replay, Internet communication, and games, for example.

Figure 8D:
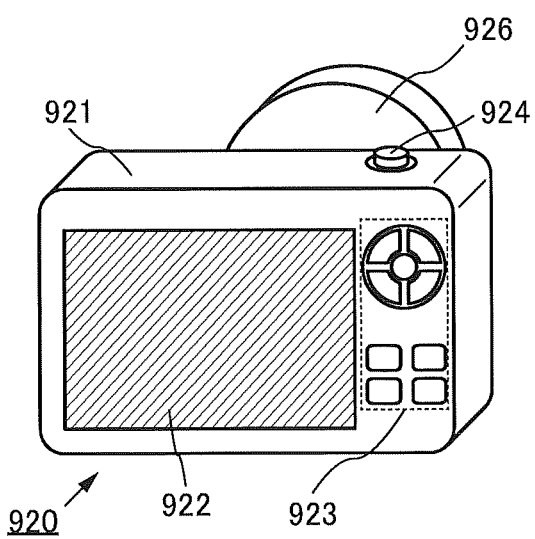

A camera 920 shown in FIG. 8(D) includes a housing 921, a display portion 922, operation buttons 923, a shutter button 924, and the like. Furthermore, a detachable lens 926 is attached to the camera 920.

The light-emitting device manufactured using one embodiment of the present invention can be used for the display portion 922. Thus, the camera can be manufactured with high yield.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

FIGS. 9(A) to 9(E) are diagrams showing electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The light-emitting device manufactured using one embodiment of the present invention can be suitably used for the display portion 9001. Thus, the electronic devices can be manufactured with high yield.

The electronic devices shown in FIGS. 9(A) to 9(E) can have a variety of functions. For example, they can have a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting or receiving a variety of data with a wireless communication function, a function of reading a program or data stored in a storage medium and displaying the program or data on the display portion, and the like. Note that the functions of the electronic devices shown in FIGS. 9(A) to 9(E) are not limited to the above, and the electronic devices may have other functions.

Figure 9A:
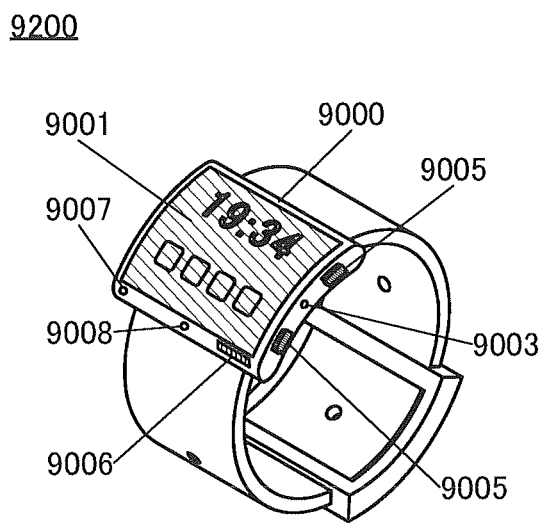
FIGS. 9A-9E are schematic views of electronic appliances of embodiments of the present invention.
Figure 9B:
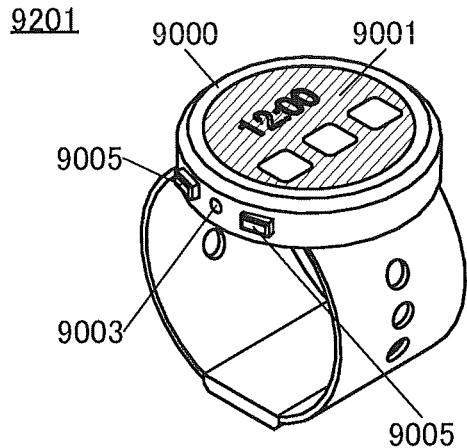

FIG. 9(A) is a perspective view of a wristwatch-type portable information terminal 9200, and FIG. 9(B) is a perspective view of a wristwatch-type portable information terminal 9201.

The portable information terminal 9200 shown in FIG. 9(A) is capable of executing a variety of applications such as mobile phone calls, e-mailing, text viewing and writing, music replay, Internet communication, and computer games. The display surface of the display portion 9001 is curved, and an image can be displayed on the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

Unlike in the portable information terminal shown in FIG. 9(A), the display surface of the display portion 9001 is not curved in the portable information terminal 9201 shown in FIG. 9(B). Furthermore, the external shape of the display portion of the portable information terminal 9201 is a non-rectangular shape (a circular shape in FIG. 9(B)).

Figure 9C:
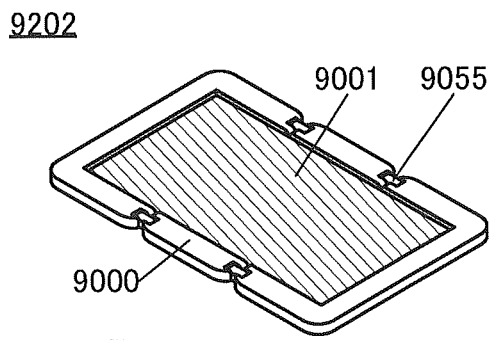
Figure 9D:
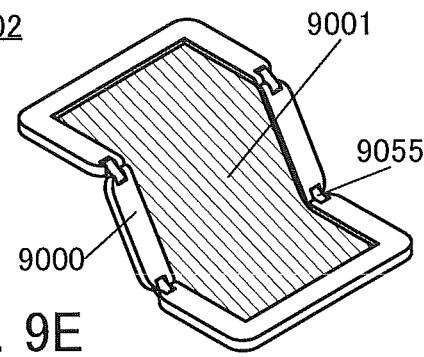
Figure 9E:
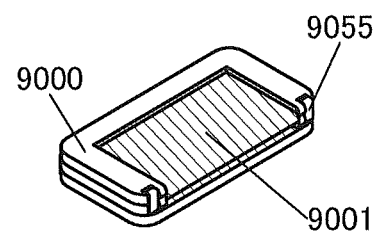

FIGS. 9(C) to 9(E) are perspective views of a foldable portable information terminal 9202. Note that FIG. 9(C) is a perspective view of the portable information terminal 9202 that is opened; FIG. 9(D) is a perspective view of the portable information terminal 9202 that is being changed from one of an opened state and a folded state to the other; and FIG. 9(E) is a perspective view of the portable information terminal 9202 that is folded.

The portable information terminal 9202 is highly portable in the folded state, and is highly browsable in the opened state due to a seamless large display region. The display portion 9001 of the portable information terminal 9202 is supported by three housings 9000 joined together by hinges 9055. By being bent between two housings 9000 with the hinges 9055, the portable information terminal 9202 can be reversibly changed in shape from the opened state to the folded state. For example, the portable information terminal 9202 can be bent with a radius of curvature of greater than or equal to 1 mm and less than or equal to 150 mm.

This embodiment can be combined with any of the other embodiments as appropriate.

Embodiment 5

In this embodiment, examples in which the light-emitting element of one embodiment of the present invention is used for various lighting devices are described with reference to FIG. 10 and FIG. 11. With the use of the light-emitting element of one embodiment of the present invention, a highly reliable lighting device with high luminous efficiency can be manufactured.

Fabricating the light-emitting element of one embodiment of the present invention over a substrate having flexibility enables an electronic device or a lighting device that has a light-emitting region with a curved surface to be obtained.

Furthermore, a light-emitting device in which the light-emitting element of one embodiment of the present invention is used can also be used for lighting for motor vehicles; for example, such lighting can be provided on a windshield, a ceiling, and the like.

Figure 10A:
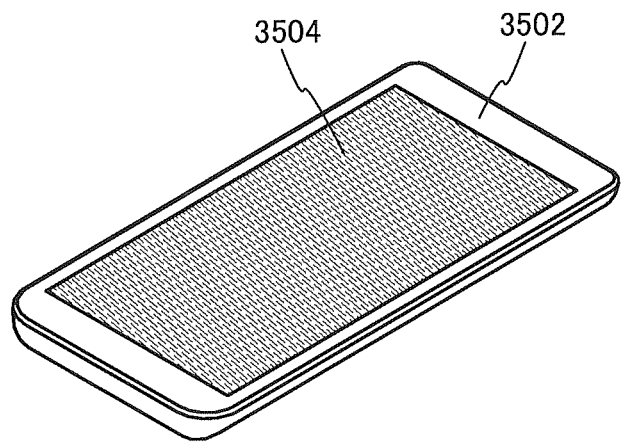
FIGS. 10A-10C are views showing lighting devices of embodiments of the present invention.
Figure 10B:
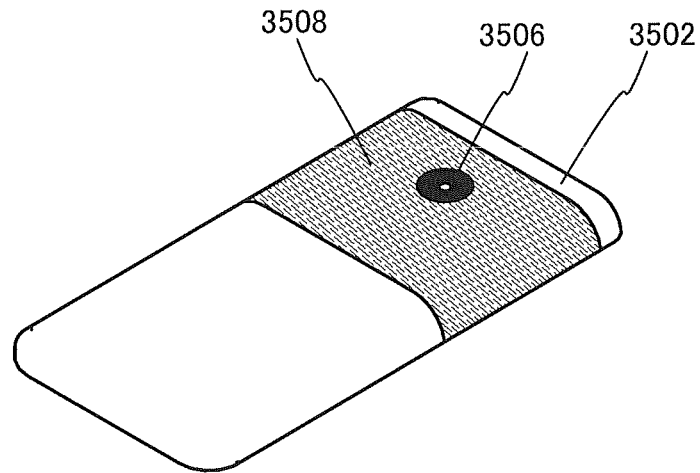

FIG. 10(A) is a perspective view showing one surface of a multifunction terminal 3500, and FIG. 10(B) is a perspective view showing the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED (Light Emitting Diode), the lighting 3508 can provide light emission with low directivity. When the lighting 3508 and the camera 3506 are used in combination, for example, imaging can be performed by the camera 3506 with the lighting 3508 lighting or flashing. Because the lighting 3508 has a function of a planar light source, a photograph as if taken under natural light can be taken.

Note that the multifunction terminal 3500 shown in FIGS. 10(A) and 10(B) can have a variety of functions as in the electronic devices shown in FIGS. 9(A) to 9(C).

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a sensing device including a sensor for detecting inclination, such as a gyroscope sensor or an acceleration sensor, is provided inside the multifunction terminal 3500, display on the screen of the display portion 3504 can be automatically switched by determining the orientation (horizontal or vertical) of the multifunction terminal 3500.

The display portion 3504 can function as an image sensor. For example, an image of a palm print, a fingerprint, or the like is taken by touch on the display portion 3504 with the palm or the finger, whereby personal authentication can be performed. Furthermore, with the use of a backlight that emits near-infrared light or a sensing light source that emits near-infrared light in the display portion 3504, an image of a finger vein, a palm vein, or the like can be taken. Note that the light-emitting device of one embodiment of the present invention may be used for the display portion 3504.

Figure 10C:
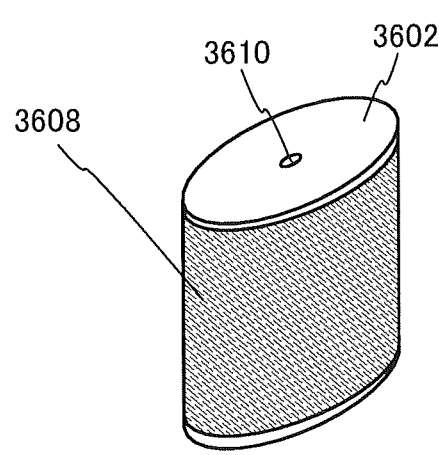

FIG. 10(C) is a perspective view of a security light 3600. The light 3600 includes lighting 3608 on the outside of the housing 3602, and a speaker 3610 and the like are incorporated in the housing 3602. The light-emitting element of one embodiment of the present invention can be used for the lighting 3608.

The light 3600 emits light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The light 3600 can emit light in various directions; therefore, it is possible to intimidate a thug or the like with light, or light and sound. Moreover, the light 3600 may include a camera such as a digital still camera to have a photography function.

Figure 11:
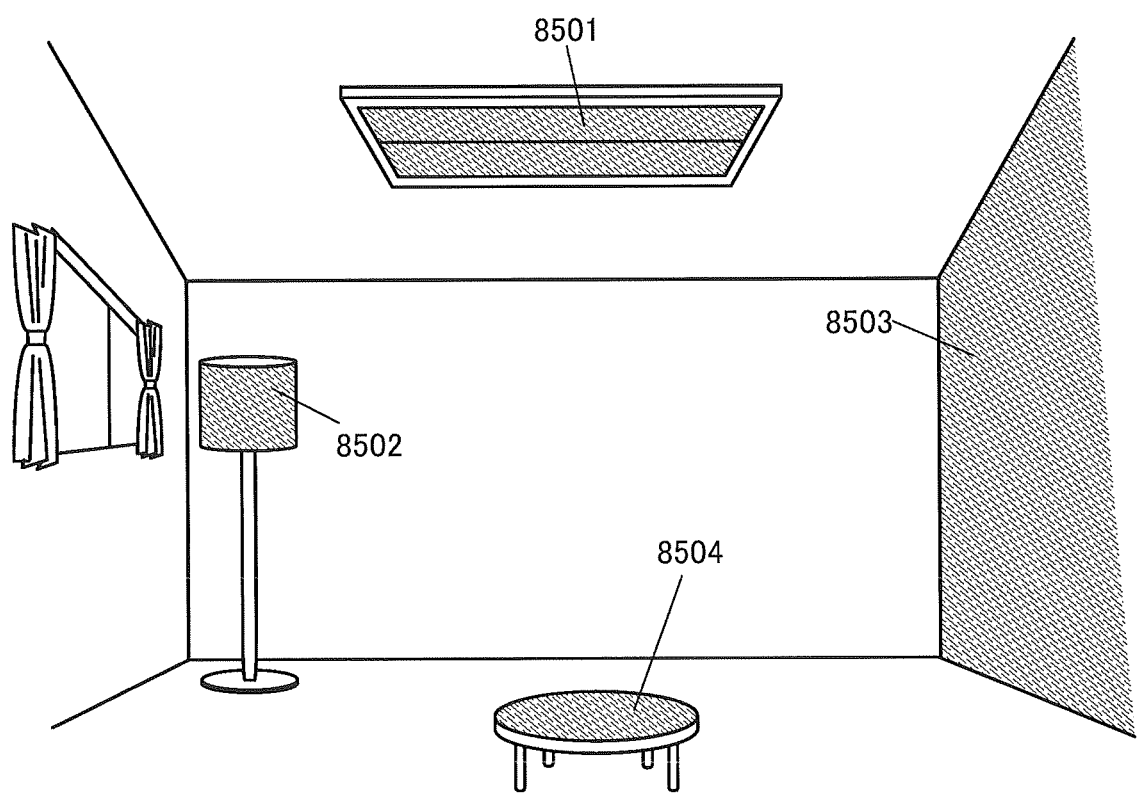
FIG. 11 is a view showing a lighting device of one embodiment of the present invention.

FIG. 11 is an example in which the light-emitting element is used for an indoor lighting device 8501. Note that since the light-emitting element can have a larger area, a lighting device having a large area can also be formed. In addition, a lighting device 8502 in which a light-emitting region has a curved surface can also be formed using a housing with a curved surface. The light-emitting element described in this embodiment is in the form of a thin film, and the degree of design freedom of the housing is high. Therefore, the lighting device can be elaborately designed in a variety of ways. Furthermore, a wall of the room may be provided with a large-sized lighting device 8503. Touch sensors may be provided in the lighting devices 8501, 8502, and 8503 to turn the power on or off.

Moreover, when the light-emitting element is used on the surface side of a table, a lighting device 8504 that has a function of a table can be obtained. Note that when the light-emitting element is used as part of another piece of furniture, a lighting device that has a function of the piece of furniture can be obtained.

As described above, the lighting devices and the electronic devices can be obtained with the use of the light-emitting device of one embodiment of the present invention. Note that the light-emitting device can be used for electronic devices in a variety of fields without being limited to the lighting devices and the electronic devices described in this embodiment.

The structures described in this embodiment can be used in an appropriate combination with any of the structures described in the other embodiments.

Example 1

In this example, examples of fabricating light-emitting elements, each of which is one kind of electronic device of one embodiment of the present invention, and the characteristics of the light-emitting elements are described. A refractive index of an organic compound used for a hole-injection layer and a refractive index of the hole-injection layer are also described. FIG. 2(A) shows a cross-sectional view of a structure of each element fabricated in this example. Table 1 shows the details of the element structures. The structures and abbreviations of compounds used here are shown below.

[Chemical Formulae 7]

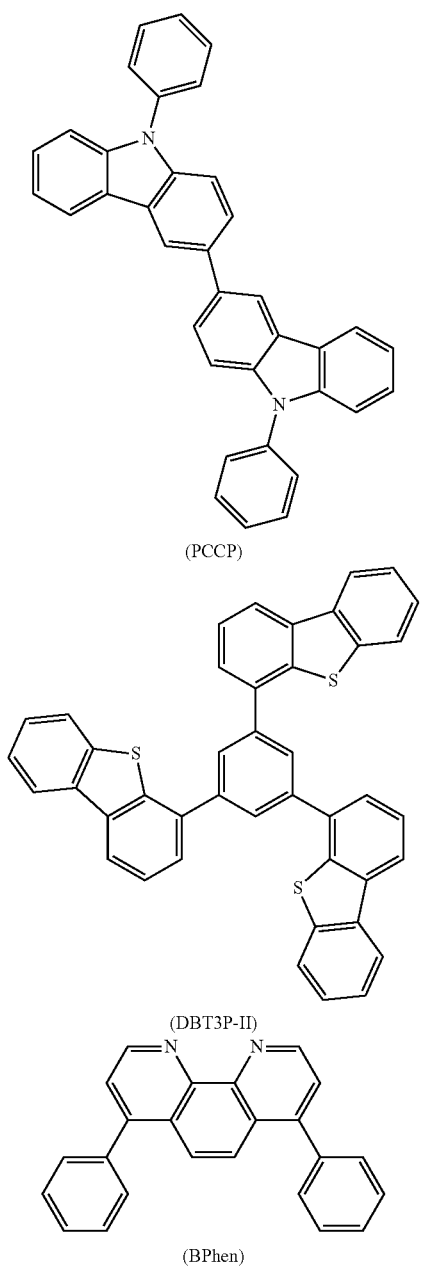

(PCCP)

(DBT3P-II)

(BPhen)

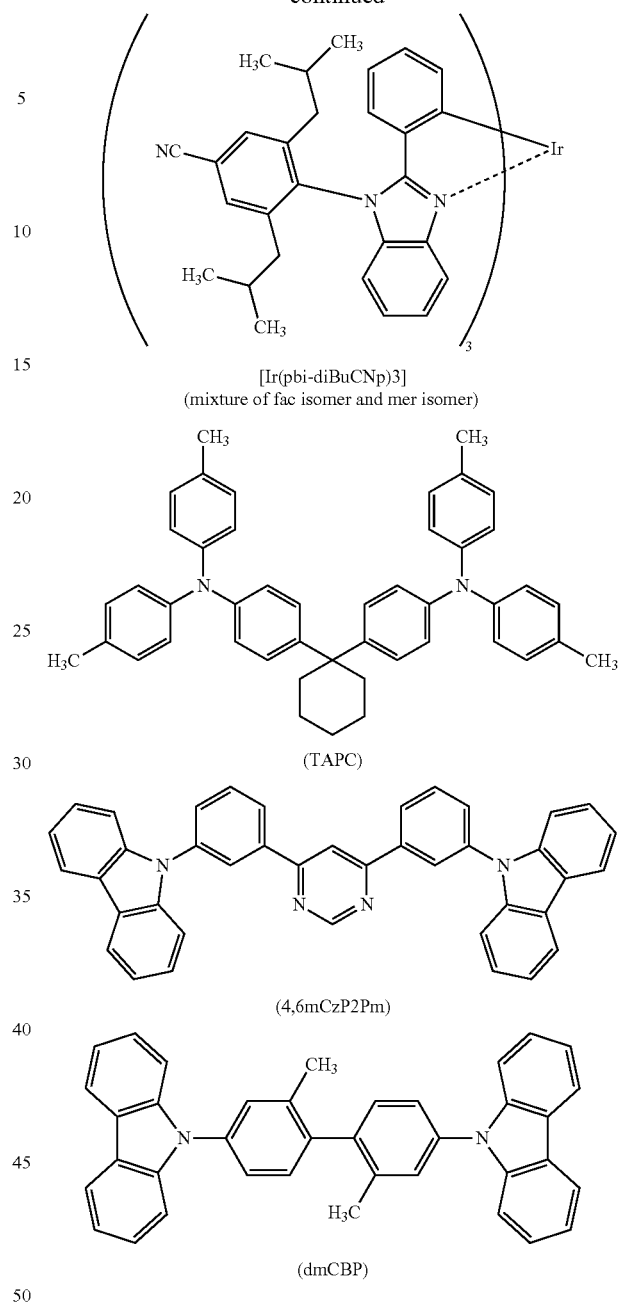

[Ir(pbi-diBuCNp)3]
(mixture of fac isomer and mer isomer)

(TAPC)

(4,6mCzP2Pm)

(dmCBP)

TABLE 1

| | Layer | Reference numeral | Thickness (nm) | Material | Weight ratio |
|---|---|---|---|---|---|
| Comparative light-emitting elements 1 to 4 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(pbi-diBuCNp)$_3$ | 0.8:0.2:0.1 |
| | | 130(1) | 20 | 4,6mCzP2Pm:PCCP:Ir(pbi-diBuCNp)$_3$ | 0.5:0.5:0.1 |
| | Hole-transport layer | 112 | 20 | PCCP | — |
| | Hole-injection layer | 111 | $x_1$ | DBT3P-II:MoO$_3$ | 2:0.5 |
| | Electrode | 101 | 70 | ITSO | — |

TABLE 1-continued

| Layer | | Reference numeral | Thickness (nm) | Material | Weight ratio |
|---|---|---|---|---|---|
| Light-emitting elements 5 to 8 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(pbi-diBuCNp)$_3$ | 0.8:0.2:0.1 |
| | | 130(1) | 20 | 4,6mCzP2Pm:PCCP:Ir(pbi-diBuCNp)$_3$ | 0.5:0.5:0.1 |
| | Hole-transport layer | 112 | 20 | PCCP | — |
| | Hole-injection layer | 111(2) | $x_2$ | DBT3P-II:MoO$_3$ | 2:0.5 |
| | | 111(1) | 35 | dmCBP:MoO$_3$ | 2:0.5 |
| | Electrode | 101 | 70 | ITSO | — |
| Light-emitting elements 9 to 12 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(pbi-diBuCNp)$_3$ | 0.8:0.2:0.1 |
| | | 130(1) | 20 | 4,6mCzP2Pm:PCCP:Ir(pbi-diBuCNp)$_3$ | 0.5:0.5:0.1 |
| | Hole-transport layer | 112 | 20 | PCCP | — |
| | Hole-injection layer | 111(2) | $x_2$ | DBT3P-II:MoO$_3$ | 2:0.5 |
| | | 111(1) | 35 | TAPC:MoO$_3$ | 2:0.5 |
| | Electrode | 101 | 70 | ITSO | — |

TABLE 2

| | Comparative light-emitting element 1 | Comparative light-emitting element 2 | Comparative light-emitting element 3 | Comparative light-emitting element 4 |
|---|---|---|---|---|
| $x_1$ | 35 | 40 | 45 | 50 |

TABLE 3

| | Light-emitting elements 5 and 9 | Light-emitting elements 6 and 10 | Light-emitting elements 7 and 11 | Light-emitting elements 8 and 12 |
|---|---|---|---|---|
| $x_2$ | 0 | 5 | 10 | 15 |

<Measurement of Refractive Index>

The refractive indices of organic compounds used for the hole-injection layers 111 of comparative light-emitting elements 1 to 4, light-emitting elements 5 to 8, and light-emitting elements 9 to 12 and the refractive indices of the hole-injection layers 111 were measured. The refractive indices were measured at room temperature with a rotating compensator variable angle fast spectroscopic ellipsometer (M-2000U) produced by J. A. Woollam. The measurement samples were formed over a quartz substrate by a vacuum evaporation method. Note that n Ordinary and n Extraordinary were measured to calculate n average.

Figure 12:
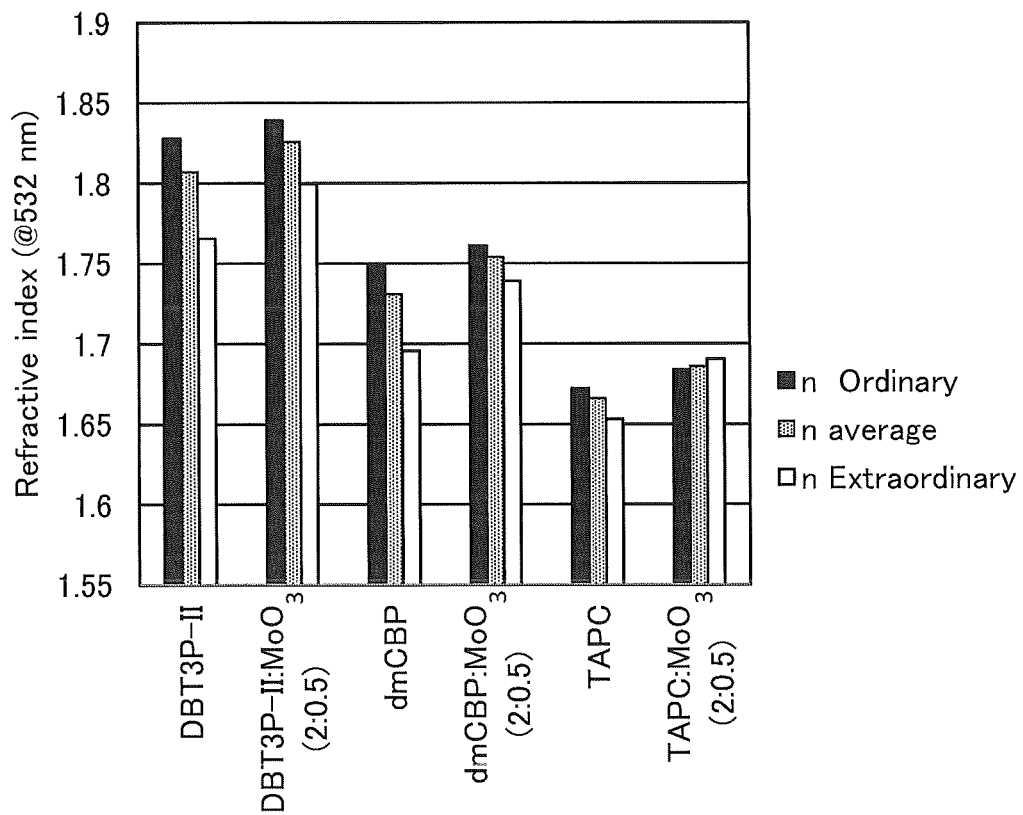
FIG. 12 is a view showing refractive indices in Example.

FIG. 12 shows the measurement results of the refractive indices of the films with respect to light with a wavelength of 532 nm. FIG. 12 reveals that DBT3P-II used for the comparative light-emitting elements 1 to 4 has the highest refractive index. It is also revealed that dmCBP used for the light-emitting elements 5 to 8 is an organic compound with a low refractive index; n Ordinary is lower than or equal to 1.75. It is also revealed that TAPC used for the light-emitting elements 9 to 12 is an organic compound with an extremely low refractive index; n Ordinary is lower than or equal to 1.70.

The hole-injection layer 111 is required to have a hole-injection property and thus preferably contains an electron-donating material. The hole-injection layer 111 of each of the light-emitting elements containing, as the electron-donating material, MoO$_3$ with a high refractive index presumably has a high refractive index. However, as shown in FIG. 12, the refractive indices of the films of the organic compounds to which MoO$_3$ of the hole-injection layer 111 of each of the light-emitting elements is added are found to be slightly higher than the refractive indices of the organic compounds. That is, even when a material with a high refractive index is used as the electron-donating material, the use of an organic compound with a low refractive index for the hole-injection layer 111 enables the hole-injection layer 111 with a low refractive index to be obtained.

FIG. 12 also shows that the difference between n Ordinary and n Extraordinary in the hole-injection layer 111 of each of the light-emitting elements is smaller than that in the film of each of the organic compounds. That is, it is found that the anisotropy of a mixed film of an organic compound and MoO$_3$ that is an electron-accepting material is lower than that of an organic compound film.

<Fabrication of Light-Emitting Element>
<<Fabrication of Comparative Light-Emitting Elements 1 to 4>>

As the electrode 101, an ITSO film was formed to a thickness of 70 nm over a glass substrate. Note that the electrode area of the electrode 101 was set to 4 mm$^2$ (2 mm×2 mm). The refractive index (n Ordinary) of the ITSO film with respect to light with a wavelength of 532 nm is 2.07.

Next, as the hole-injection layer 111, 1,3,5-tri-(4-dibenzothiophenyl)-benzene (abbreviation: DBT3P-II) and MoO$_3$ were deposited over the electrode 101 by co-evaporation at a weight ratio (DBT3P-II: MoO$_3$) of 2:0.5 to a thickness of $x_1$ nm. Note that the value $x_1$ differs between the light-emitting elements, and Table 2 shows the value $x_1$ in each of the light-emitting elements.

Next, as the hole-transport layer 112, PCCP was deposited over the hole-injection layer 111 by evaporation to a thickness of 20 nm.

As a light-emitting layer 130(1), 4,6mCzP2Pm, PCCP, and Ir(pbi-diBuCNp)$_3$ (a mixture of fac isomer: mer isomer=3:2) were deposited over the hole-transport layer 112 by co-evaporation at a weight ratio (4,6mCzP2Pm: PCCP: Ir(pbi-diBuCNp)$_3$) of 0.5:0.5:0.1 to a thickness of 20 nm, and successively, as a light-emitting layer 130(2), 4,6mCzP2Pm, PCCP, and Ir(pbi-diBuCNp)$_3$ were deposited by co-evaporation at a weight ratio of 0.8:0.2:0.1 to a thickness of 20 nm. Note that in the light-emitting layer 130(1) and the light-emitting layer 130(2), Ir(pbi-diBuCNp)$_3$ is a guest material that emits phosphorescence.

Next, as a first electron-transport layer 118(1), 4,6mCzP2Pm was deposited over the light-emitting layer 130(2) by co-evaporation to a thickness of 20 nm. Subsequently, as a second electron-transport layer 118(2), bathophenanthroline (abbreviation: BPhen) was deposited over the first electron-transport layer 118(1) by evaporation to a thickness of 10 nm.

Next, as the electron-injection layer 119, lithium fluoride (LiF) was deposited over the second electron-transport layer 118(2) by evaporation to a thickness of 1 nm.

Next, as the electrode 102, aluminum (Al) was formed over the electron-injection layer 119 to a thickness of 200 nm.

Next, in a glove box containing a nitrogen atmosphere, the comparative light-emitting elements 1 to 4 were sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the comparative light-emitting elements 1 to 4 were obtained.

<<Fabrication of Light-Emitting Elements 5 to 8>>

The light-emitting elements 5 to 8 were formed through the same steps as the steps of forming the comparative light-emitting elements 1 to 4 except for the step of forming the hole-injection layer 111.

As a hole-injection layer 111(1), dmCBP and MoO$_3$ were deposited over the electrode 101 by co-evaporation at a weight ratio (dmCBP: MoO$_3$) of 2:0.5 to a thickness of 35 nm, and successively, DBT3P-II and MoO$_3$ were deposited by co-evaporation at a weight ratio (DBT3P-II: MoO$_3$) of 2:0.5 to a thickness of x$_2$ nm. Note that the value x$_2$ differs between the light-emitting elements, and Table 3 shows the value x$_2$ in each of the light-emitting elements.

<<Fabrication of Light-Emitting Elements 9 to 12>>

The light-emitting elements 9 to 12 were formed through the same steps as the steps of forming the comparative light-emitting elements 1 to 4 except for the step of forming the hole-injection layer 111.

As the hole-injection layer 111(1), TAPC and MoO$_3$ were deposited over the electrode 101 by co-evaporation at a weight ratio (TAPC: MoO$_3$) of 2:0.5 to a thickness of 35 nm, and successively, DBT3P-II and MoO$_3$ were deposited by co-evaporation at a weight ratio (DBT3P-II: MoO$_3$) of 2:0.5 to a thickness of x$_2$ nm. Note that the value x$_2$ differs between the light-emitting elements, and Table 3 shows the value x$_2$ in each of the light-emitting elements.

<Characteristics of Light-Emitting Elements>

Next, the characteristics of the fabricated comparative light-emitting elements 1 to 4 and light-emitting elements 5 to 12 were measured. A luminance colorimeter (manufactured by TOPCON TECHNOHOUSE CORPORATION, BM-5A) was used for measuring luminance and CIE chromaticity, and a multi-channel spectrometer (manufactured by Hamamatsu Photonics K.K., PMA-11) was used for measuring electroluminescence spectra. Note that the measurements of the light-emitting elements were performed at room temperature (in an atmosphere kept at 23° C.).

Figure 13:
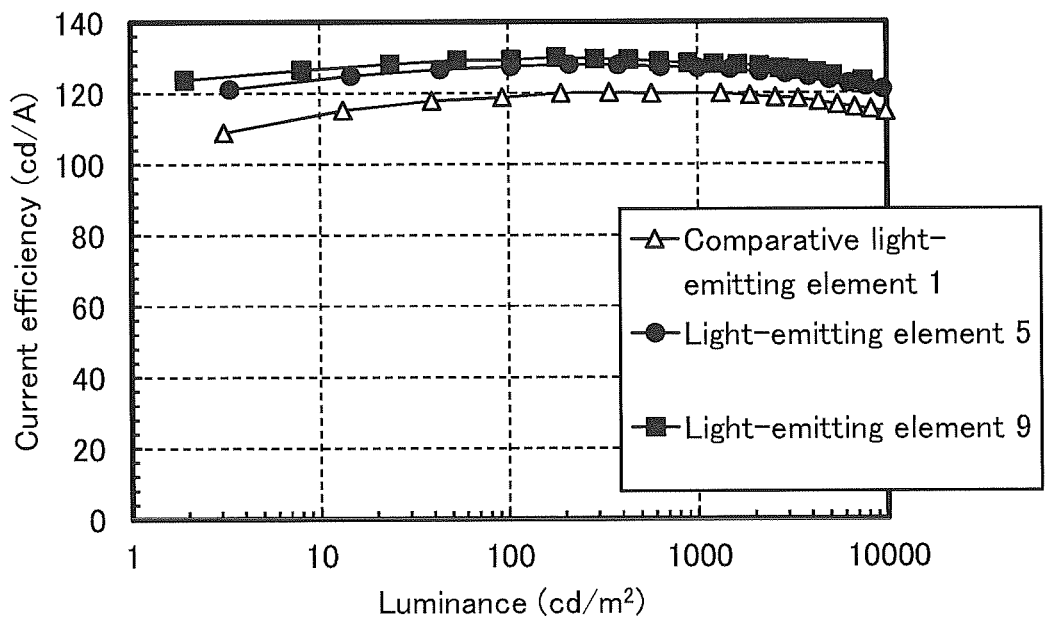
FIG. 13 is a view showing current efficiencyluminance characteristics of light-emitting elements in Example.
Figure 14:
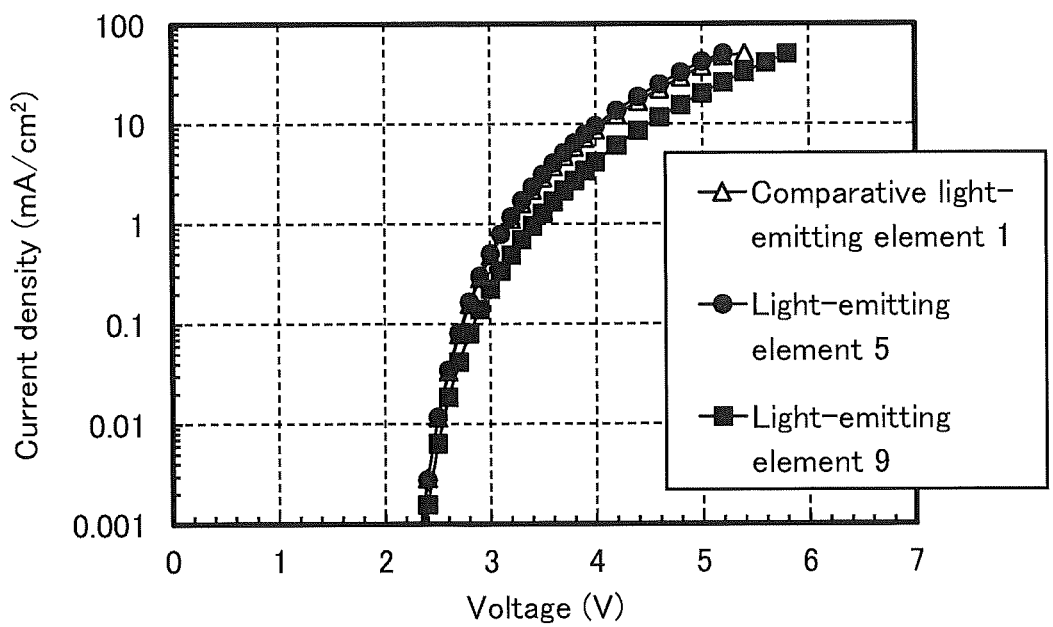
FIG. 14 is a view showing current density voltage characteristics of light-emitting elements in Example.
Figure 15:
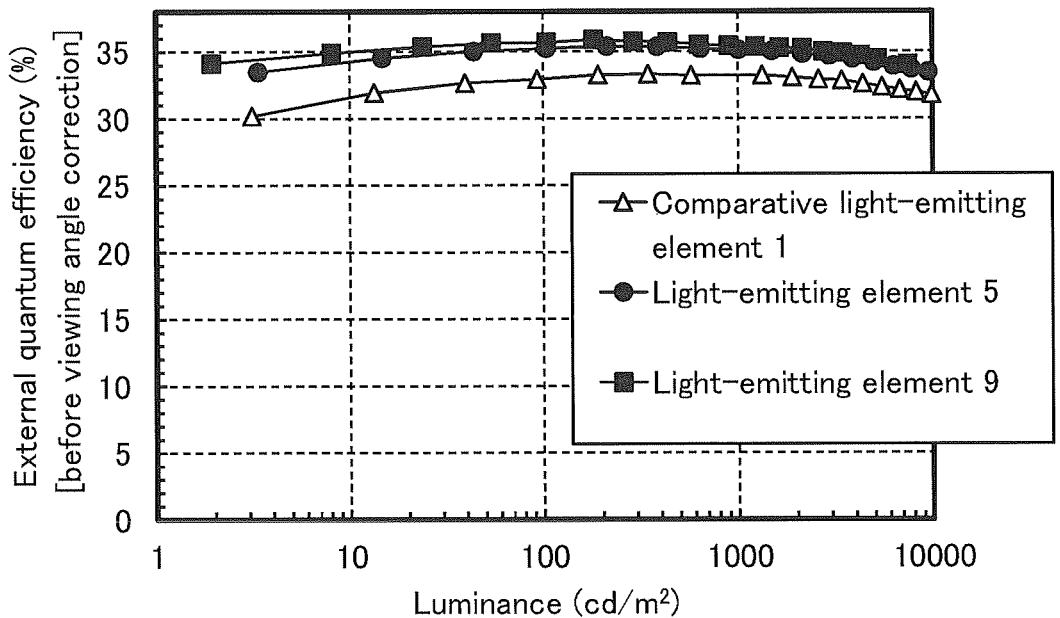
FIG. 15 is a view showing external quantum efficiency-luminance characteristics of light-emitting elements in Example.

FIG. 13 shows the current efficiency-luminance characteristics of the comparative light-emitting element 1, the light-emitting element 5, and the light-emitting element 9 among the fabricated light-emitting elements. FIG. 14 shows the current density-voltage characteristics. FIG. 15 shows the external quantum efficiency-luminance characteristics. The values of the external quantum efficiency shown in FIG. 15 are obtained when the light-emitting elements are not subjected to the viewing angle correction and are measured from the front direction. As the organic compound in the hole-injection layer 111, DBT3P-II was used in the comparative light-emitting element 1, dmCBP was used in the light-emitting element 5, and TAPC was used in the light-emitting element 9, and these elements have the same element structure except for the hole-injection layer 111.

FIG. 14 shows that the current density-voltage characteristics of the comparative light-emitting element 1, the light-emitting element 5, and the light-emitting element 9 are equivalent to each other. Thus, even when an organic compound with a low refractive index is used for the hole-injection layer 111, these elements have excellent hole-injection properties.

FIG. 13 and FIG. 15 show that the comparative light-emitting element 1, the light-emitting element 5, and the light-emitting element 9 have current efficiency higher than 100 cd/A and external quantum efficiency higher than 30%. The light-emitting element 5 and the light-emitting element 9 containing dmCBP and TAPC, respectively, that are organic compounds with low refractive indices in the hole-injection layers 111 have higher efficiency than the comparative light-emitting element 1 containing DBT3P-II that is a material with a high refractive index.

Figure 16:
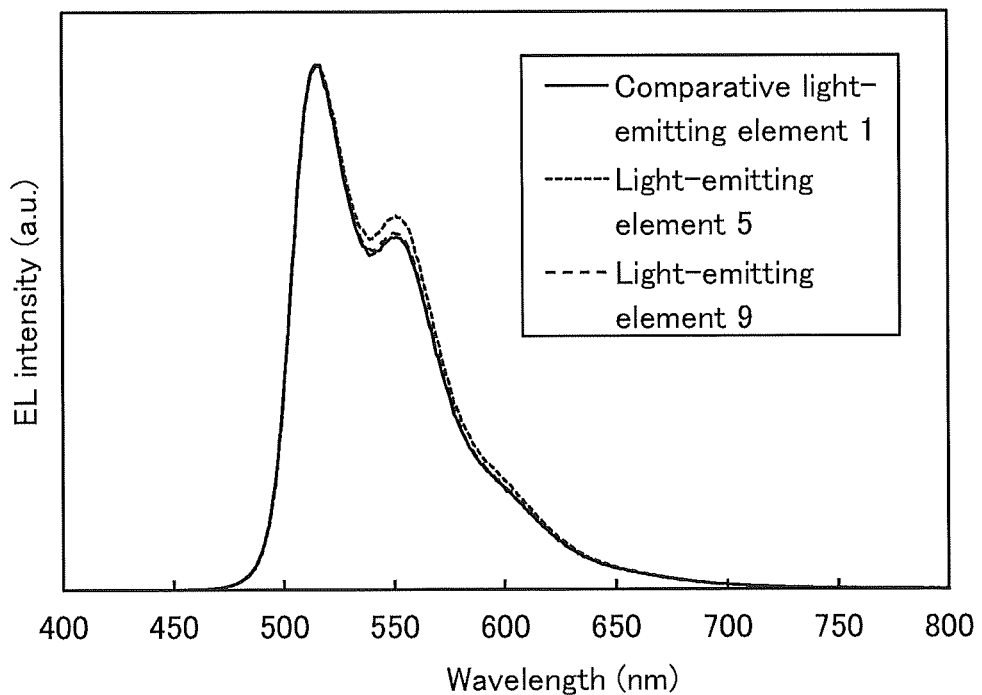
FIG. 16 is a view showing emission spectra in Example.

FIG. 16 shows emission spectra when current at a current density of 25 mA/cm$^2$ was applied to the comparative light-emitting element 1, the light-emitting element 5, and the light-emitting element 9. As shown in FIG. 16, the emission spectra of the comparative light-emitting element 1, the light-emitting element 5, and the light-emitting element 9 have peaks at around 515 nm and 550 nm, which are derived from light emission of a guest material Ir(pbi-diBuCNp)$_3$ contained in the light-emitting layer 130.

Table 4 shows the element characteristics of the comparative light-emitting elements 1 to 4 and the light-emitting elements 5 to 12 at around 1000 cd/m$^2$. The external quantum efficiency shown in Table 4 is obtained after the viewing angle correction.

TABLE 4

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
|---|---|---|---|---|---|---|---|
| Comparative light-emitting element 1 | 3.00 | 0.48 | (0.308, 0.649) | 575 | 120 | 125 | 28.9 |

TABLE 4-continued

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
|---|---|---|---|---|---|---|---|
| Comparative light-emitting element 2 | 3.10 | 0.79 | (0.317, 0.643) | 941 | 119 | 120 | 29.9 |
| Comparative light-emitting element 3 | 3.00 | 0.51 | (0.326, 0.637) | 596 | 116 | 121 | 30.5 |
| Comparative light-emitting element 4 | 3.00 | 0.54 | (0.334, 0.629) | 600 | 111 | 116 | 30.4 |
| Light-emitting element 5 | 3.10 | 0.79 | (0.309, 0.649) | 1004 | 127 | 129 | 30.5 |
| Light-emitting element 6 | 3.00 | 0.50 | (0.319, 0.642) | 615 | 124 | 130 | 31.2 |
| Light-emitting element 7 | 3.10 | 0.80 | (0.329, 0.634) | 938 | 118 | 119 | 31.2 |
| Light-emitting element 8 | 3.00 | 0.51 | (0.339, 0.627) | 575 | 112 | 117 | 31.1 |
| Light-emitting element 9 | 3.30 | 0.70 | (0.313, 0.646) | 898 | 128 | 122 | 31.5 |
| Light-emitting element 10 | 3.10 | 0.80 | (0.324, 0.639) | 986 | 123 | 125 | 31.8 |
| Light-emitting element 11 | 3.00 | 0.52 | (0.334, 0.631) | 613 | 117 | 123 | 31.8 |
| Light-emitting element 12 | 3.10 | 0.80 | (0.346, 0.622) | 863 | 108 | 109 | 31.0 |

The above results demonstrate that the comparative light-emitting elements 1 to 4 and the light-emitting elements 5 to 12 fabricated in this example have favorable driving voltage and luminous efficiency regardless of the structure of the hole-injection layer 111.

<Relation Between Refractive Index of Hole-Injection Layer 111 and External Quantum Efficiency>

Figure 17:
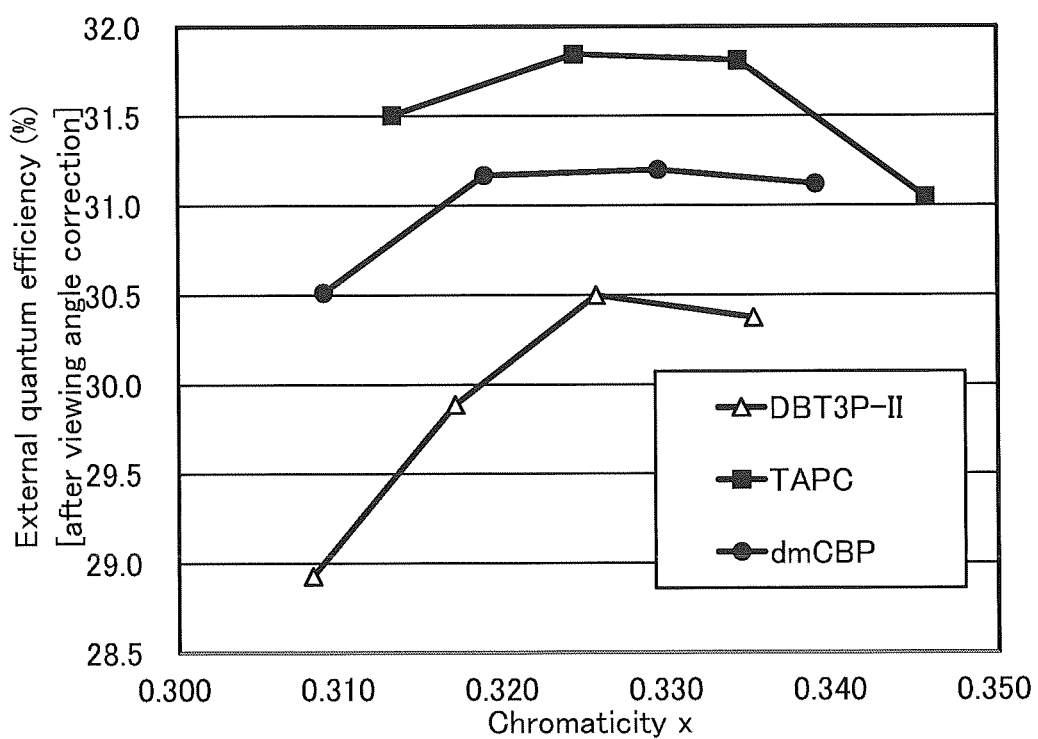
FIG. 17 is a view showing external quantum efficiency-chromaticity x characteristics of light-emitting elements in Example.

FIG. 17 shows a relation between chromaticity x and external quantum efficiency with the organic materials used for the hole-injection layers 111 with the use of the values of the elements shown in Table 4. In FIG. 17, the values of the comparative light-emitting elements 1 to 4 were used for data on the "DBT3P-II" curve, the values of the light-emitting elements 5 to 8 were used for data on the "dmCBP" curve, and the values of the light-emitting elements 9 to 12 were used for data on the "TAPC" curve. Even when the hole-injection layers 111 in the comparative light-emitting elements 1 to 4 and the light-emitting elements 5 to 12 have the same thickness, the refractive indices differ depending on the organic compounds used therein; thus, the optical path length from the light-emitting region to the substrate differs between the light-emitting elements. A change in the optical path length changes the external quantum efficiency; thus, the optical path length of each of the light-emitting elements needs to be adjusted in examining the relation between the refractive index of the hole-injection layer 111 and the external quantum efficiency; however, it is difficult to perform minor adjustment on the thickness of the EL layer in formation of the light-emitting element.

In the case where an optical path length from a light-emitting region to a substrate differs between light-emitting elements formed using the same light-emitting material, emission spectra and chromaticity obtained from the light-emitting elements are also different from each other. By contrast, when the light-emitting elements have the same chromaticity, the emission spectra exhibited by the light-emitting elements are probably the same. In other words, when the light-emitting elements have the same chromaticity, the optical path lengths from the light-emitting regions to the substrates in the light-emitting elements can be regarded as the same. Thus, the relation between the refractive index of the hole-injection layer 111 and the external quantum efficiency can be examined by consideration of the relation between external quantum efficiency and chromaticity x or chromaticity y.

As shown in FIG. 12, the refractive indices of the organic compounds used for the hole-injection layers 111 are high in the following order: DBT3P-II, dmCBP, and TAPC. FIG. 17 shows that the lower refractive index of the organic compound used for the hole-injection layer 111 results in higher external quantum efficiency. This is because light attenuation due to an evanescent mode is reduced and thus outcoupling efficiency is improved.

As described above, the use of an organic compound with a low refractive index for the hole-injection layer 111 enables a light-emitting element with excellent outcoupling efficiency to be obtained while a hole-injection property is maintained.

<Relation Between Volume Ratio of Electron-Accepting Substance to Electron-Donating Substance in Hole-Injection Layer 111 and External Quantum Efficiency>

Here, the relation between the volume ratio of an electron-accepting substance ($MoO_3$) to an electron-donating substance (hereinafter, referred to as the volume ratio of $MoO_3$)

in the hole-injection layer 111 and external quantum efficiency was examined. Table 5 shows the details of the element structures. The structures and abbreviations of compounds used here are shown below. Note that refer to the compounds described above for other organic compounds.

[Chemical Formula 8]

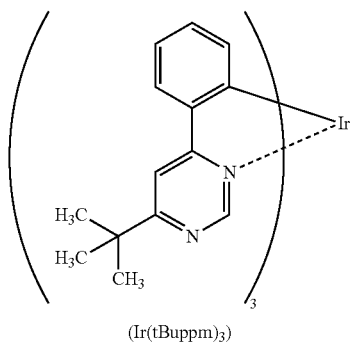

(Ir(tBuppm)$_3$)

port layer 112 by co-evaporation at a weight ratio (4,6mCzP2Pm: PCCP: Ir(tBuppm)$_3$) of 0.5:0.5:0.075 to a thickness of 20 nm, and successively, as the light-emitting layer 130(2), 4,6mCzP2Pm, PCCP, and Ir(tBuppm)$_3$ were deposited by co-evaporation at a weight ratio of 0.8:0.2:0.075 to a thickness of 20 nm. Note that in the light-emitting layer 130(1) and the light-emitting layer 130(2), Ir(tBuppm)$_3$ is a guest material that emits phosphorescence.

<Characteristics of Light-Emitting Elements>

Next, the luminance-external quantum efficiency characteristics of the fabricated light-emitting elements 13 to 18 were measured. The measurement was performed by the above-described method.

Figure 18:
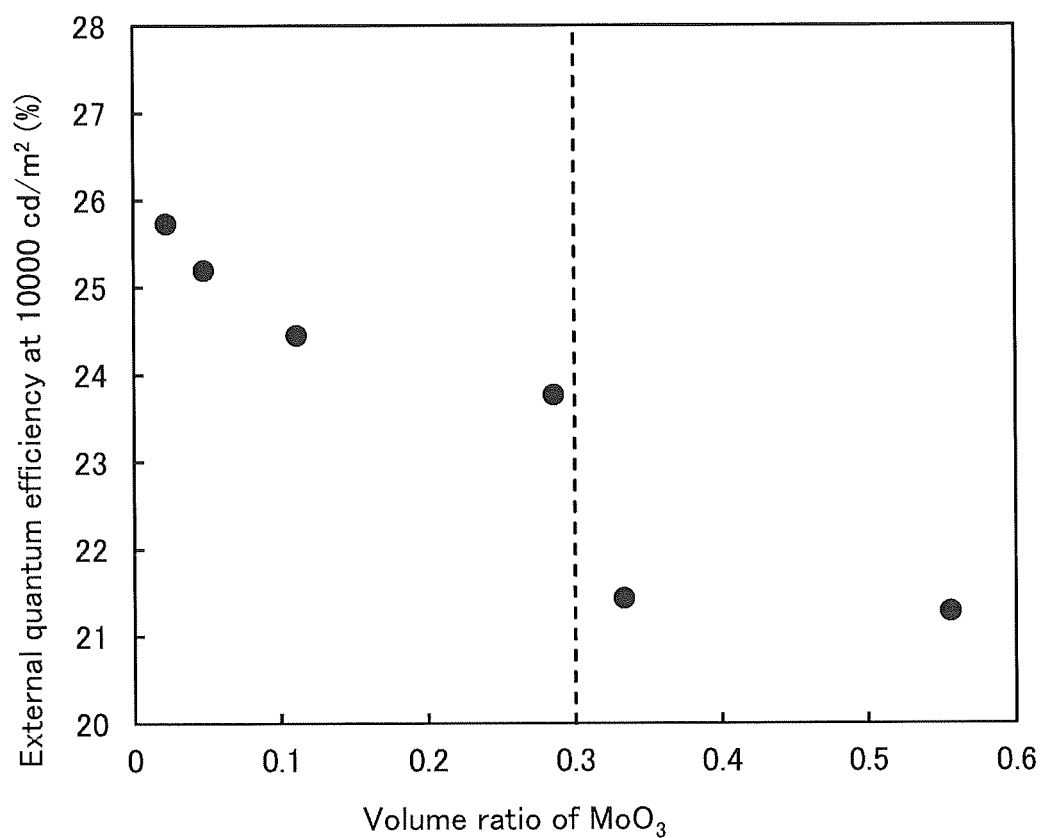
FIG. 18 is a view showing a relation between external quantum efficiency and a volume ratio of $MoO_3$ in Example.

FIG. 18 shows the relation between external quantum efficiency at around 10000 cd/m$^2$ and the volume ratio of MoO$_3$ in the hole-injection layer 111 in each of the elements. FIG. 18 reveals that the external quantum efficiency is as high as 24% to 26% in a region where the volume ratio of MoO$_3$ to the electron-donating substance is greater than 0 and less than or equal to 0.3, whereas the efficiency decreases in a region where the volume ratio is greater than 0.3. This is probably because the outcoupling efficiency

TABLE 5

| | Layer | Reference numeral | Thickness (nm) | Material | Weight ratio |
|---|---|---|---|---|---|
| Light-emitting elements 13 to 18 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(tBuppm)$_3$ | 0.8:0.2:0.075 |
| | | 130(1) | 20 | 4,6mCzP2Pm:PCCP:Ir(tBuppm)$_3$ | 0.5:0.5:0.075 |
| | Hole-transport layer | 112 | 20 | PCCP | — |
| | Hole-injection layer | 111 | 40 | DBT3P-n:MoO$_3$ | 3-y:y |
| | Electrode | 101 | 70 | ITSO | — |

TABLE 6

| | Light-emitting element 13 | Light-emitting element 14 | Light-emitting element 15 | Light-emitting element 16 | Light-emitting element 17 | Light-emitting element 18 |
|---|---|---|---|---|---|---|
| y | 0.25 | 0.5 | 1.0 | 1.5 | 2 | 2.5 |
| Volume ratio of MoO$_3$ | 0.02 | 0.05 | 0.1 | 0.29 | 0.33 | 0.56 |

<<Fabrication of Light-Emitting Elements 13 to 18>>

The light-emitting elements 13 to 18 were formed through the same steps as the steps of forming the comparative light-emitting elements 1 to 4 except for the steps of forming the hole-injection layer 111 and the light-emitting layer 130.

As the hole-injection layer 111, DBT3P-II and MoO$_3$ were deposited over the electrode 101 by co-evaporation at a weight ratio (DBT3P-II:MoO$_3$) of 3-y:y to a thickness of 40 nm. Note that the value y differs between the light-emitting elements, and Table 6 shows the value y in each of the light-emitting elements. Table 6 also shows the results of converting the weight ratio into the volume ratio of MoO$_3$.

Next, as the light-emitting layer 130(1), 4,6mCzP2Pm, PCCP, and Ir(tBuppm)$_3$ were deposited over the hole-transdecreases due to the refractive index of the hole-injection layer 111 that is increased by the influence of the electron-accepting substance (MoO$_3$) with a high refractive index in the region where the volume ratio of MoO$_3$ is greater than 0.3. On the other hand, it is probable that the outcoupling efficiency is excellent in the region where the volume ratio of MoO$_3$ is greater than 0 and less than or equal to 0.3 because the refractive index of the hole-injection layer 111 is less affected by the electron-accepting substance (MoO$_3$) with a high refractive index and largely affected by the refractive index of the electron-donating substance having a lower refractive index than the electron-accepting substance (MoO$_3$). That is, with the use of the hole-injection layer 111 in which the volume ratio of MoO$_3$ is greater than 0 and less than or equal to 0.3, a light-emitting element with excellent outcoupling efficiency can be fabricated.

Example 2

In this example, examples of fabricating light-emitting elements, each of which is the electronic device of one embodiment of the present invention and different from those in Example 1, and the characteristics of the light-emitting elements are described. A refractive index of an organic compound used for the hole-injection layer 111 and a refractive index of the hole-injection layer are also described. Table 7 shows the details of the element structures. The structures and abbreviations of compounds used here are shown below. Refer to Example 1 above for other organic compounds.

[Chemical Formulae 9]

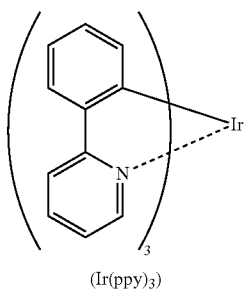

(Ir(ppy)$_3$)

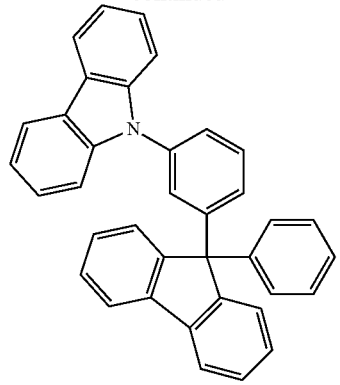

(mCzFLP)

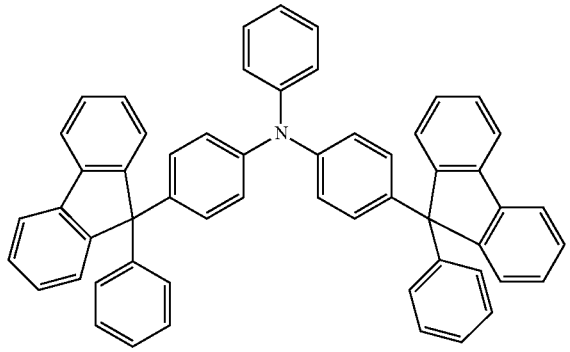

(FLP2A)

TABLE 7

| | Layer | Reference numeral | Thickness (nm) | Material | Weight ratio |
|---|---|---|---|---|---|
| Comparative light-emitting elements 19 to 22 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111 | $z_1$ | DBT3P-II:MoO$_3$ | 2:0.5 |
| | Electrode | 101 | 70 | ITSO | — |
| Light-emitting elements 23 to 26 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111(2) | $z_2$ | DBT3P-II:MoO$_3$ | 2:0.5 |
| | | 111(1) | 35 | mCzFLP:MoO$_3$ | 2:0.5 |
| | Electrode | 101 | 70 | ITSO | — |
| Light-emitting elements 27 to 30 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111(2) | $z_2$ | DBT3P-II:MoO$_3$ | 2:0.5 |
| | | 111(1) | 35 | FLP2A:MoO$_3$ | 2:0.5 |
| | Electrode | 101 | 70 | ITSO | — |

TABLE 8

|  | Comparative light-emitting element 19 | Comparative light-emitting element 20 | Comparative light-emitting element 21 | Comparative light-emitting element 22 |
| --- | --- | --- | --- | --- |
| $z_1$ | 35 | 40 | 45 | 50 |

TABLE 9

|  | Light-emitting elements 23 and 27 | Light-emitting elements 24 and 28 | Light-emitting elements 25 and 29 | Light-emitting elements 26 and 30 |
| --- | --- | --- | --- | --- |
| $z_2$ | 0 | 5 | 10 | 15 |

<Measurement of Refractive Index>

The refractive indices of organic compounds used for the hole-injection layers 111 of comparative light-emitting elements 19 to 22, light-emitting elements 23 to 26, and light-emitting elements 27 to 30 were measured. The measurement of the refractive indices was performed in a manner similar to that described in Example 1.

Figure 19:
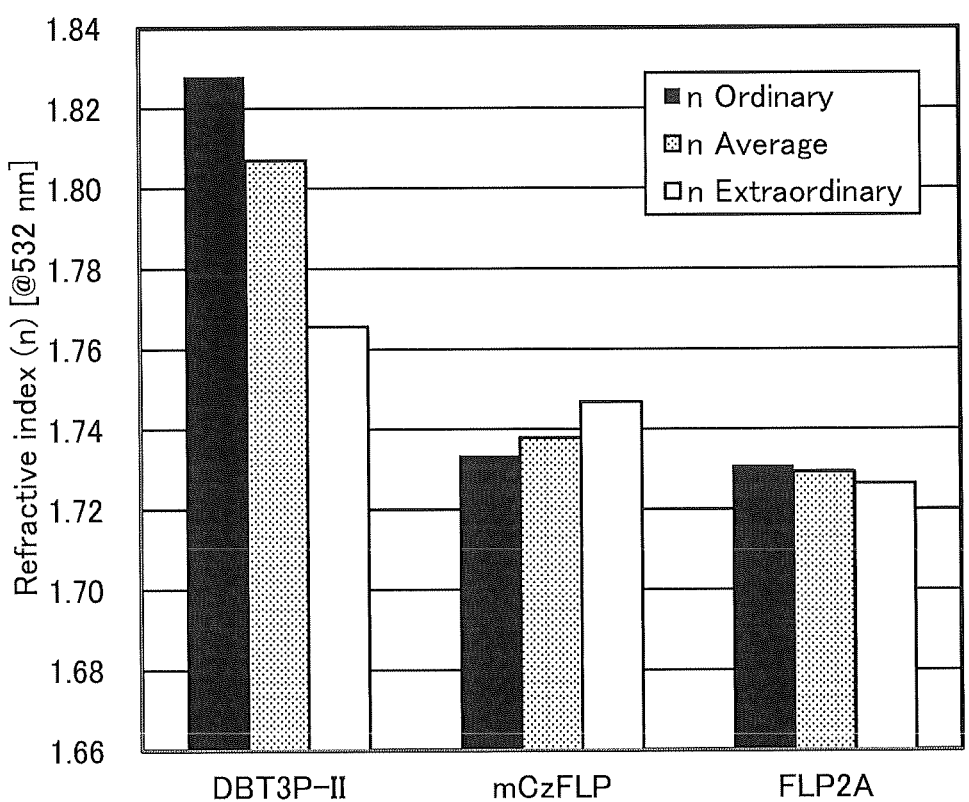
FIG. 19 is a view showing refractive indices in Example.

FIG. 19 shows the measurement results of the refractive indices of the films with respect to light with a wavelength of 532 nm. FIG. 19 reveals that DBT3P-II used for the comparative light-emitting elements 19 to 22 has the highest refractive index. It is also revealed that 9-[3-(9-phenyl-9H-fluoren-9-yl)phenyl]-9H-carbazole (abbreviation: mCzFLP) used for the light-emitting elements 23 to 26 is an organic compound with a low refractive index; n Ordinary is lower than or equal to 1.75. It is also revealed that 4,4'-[bis(9-phenylfluoren-9-yl)]-triphenylamine (abbreviation: FLP2A) used for the light-emitting elements 27 to 30 is an organic compound with a low refractive index; n Ordinary is lower than or equal to 1.75.

It is presumed from the results in Example 1 that a mixed film of $MoO_3$ and mCzFLP or FLP2A, which is the hole-injection layer 111 of each of the light-emitting elements 23 to 30, has approximately the same refractive index as the respective organic compounds, and has a lower refractive index than a mixed film of $MoO_3$ and DBT3P-II, which is the hole-injection layer 111 of each of the comparative light-emitting elements 19 to 22.

<Fabrication of Light-Emitting Elements>

<<Fabrication of Comparative Light-Emitting Elements 19 to 22>>

The comparative light-emitting elements 19 to 22 were formed through the same steps as the steps of forming the comparative light-emitting elements 1 to 4 except for the steps of forming the hole-injection layer 111 and the light-emitting layer 130.

As the hole-injection layer 111, DBT3P-II and $MoO_3$ were deposited over the electrode 101 by co-evaporation at a weight ratio (DBT3P-II: $MoO_3$) of 2:0.5 to a thickness of $z_1$ nm. Note that the value $z_1$ differs between the light-emitting elements, and Table 8 shows the value $z_1$ in each of the light-emitting elements.

As the light-emitting layer 130(1), 4,6mCzP2Pm, PCCP, and Ir(ppy)$_3$ were deposited over the hole-transport layer 112 by co-evaporation at a weight ratio (4,6mCzP2Pm: PCCP: Ir(ppy)$_3$) of 0.5:0.5:0.1 to a thickness of 20 nm, and successively, as the light-emitting layer 130(2), 4,6mCzP2Pm, PCCP, and Ir(ppy)$_3$ were deposited by co-evaporation at a weight ratio of 0.8:0.2:0.1 to a thickness of 20 nm. Note that in the light-emitting layer 130(1) and the light-emitting layer 130(2), Ir(ppy)$_3$ is a guest material that emits phosphorescence.

<<Fabrication of Light-Emitting Elements 23 to 26>>

The light-emitting elements 23 to 26 were formed through the same steps as the steps of forming the comparative light-emitting elements 19 to 22 except for the step of forming the hole-injection layer 111.

As the hole-injection layer 111(1), mCzFLP and $MoO_3$ were deposited over the electrode 101 by co-evaporation at a weight ratio (mCzFLP: $MoO_3$) of 2:0.5 to a thickness of 35 nm, and successively, DBT3P-II and $MoO_3$ were deposited by co-evaporation at a weight ratio (DBT3P-II: $MoO_3$) of 2:0.5 to a thickness of $z_2$ nm. Note that the value $z_2$ differs between the light-emitting elements, and Table 9 shows the value $x_2$ in each of the light-emitting elements.

<<Fabrication of Light-Emitting Elements 27 to 30>>

The light-emitting elements 27 to 30 were formed through the same steps as the steps of forming the comparative light-emitting elements 19 to 22 except for the step of forming the hole-injection layer 111.

As the hole-injection layer 111(1), FLP2A and $MoO_3$ were deposited over the electrode 101 by co-evaporation at a weight ratio (FLP2A: $MoO_3$) of 2:0.5 to a thickness of 35 nm, and successively, DBT3P-II and $MoO_3$ were deposited by co-evaporation at a weight ratio (DBT3P-II: $MoO_3$) of 2:0.5 to a thickness of $z_2$ nm. Note that the value $z_2$ differs between the light-emitting elements, and Table 9 shows the value $z_2$ in each of the light-emitting elements.

<Characteristics of Light-Emitting Elements>

Next, the characteristics of the fabricated comparative light-emitting elements 19 to 22 and light-emitting elements 23 to 30 were measured. The measurement was performed in a manner similar to that in Example 1.

Figure 20:
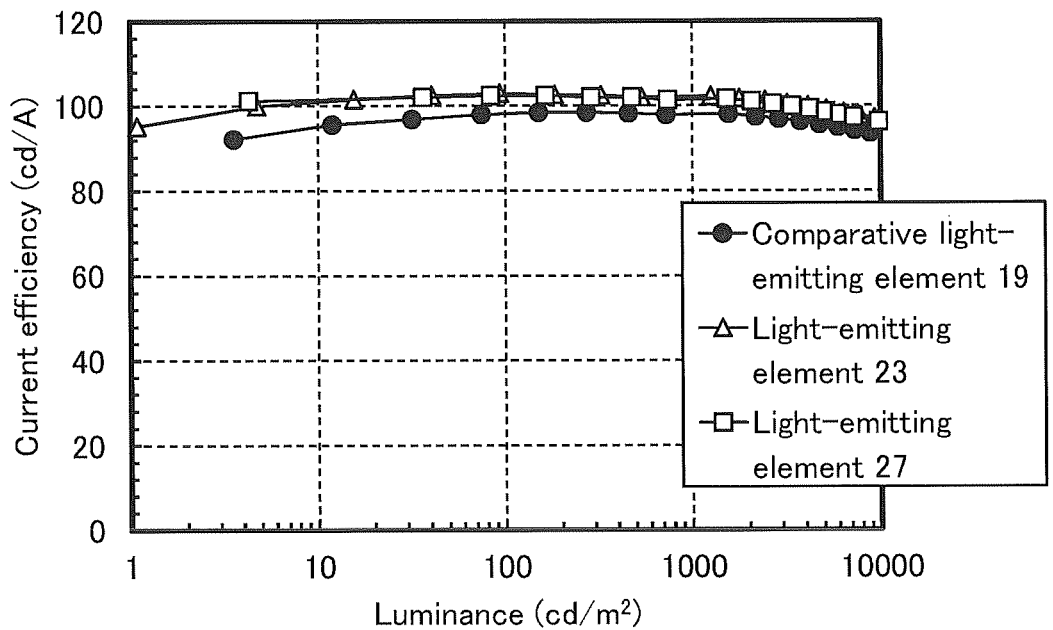
FIG. 20 is a view showing current efficiency-luminance characteristics of light-emitting elements in Example.
Figure 21:
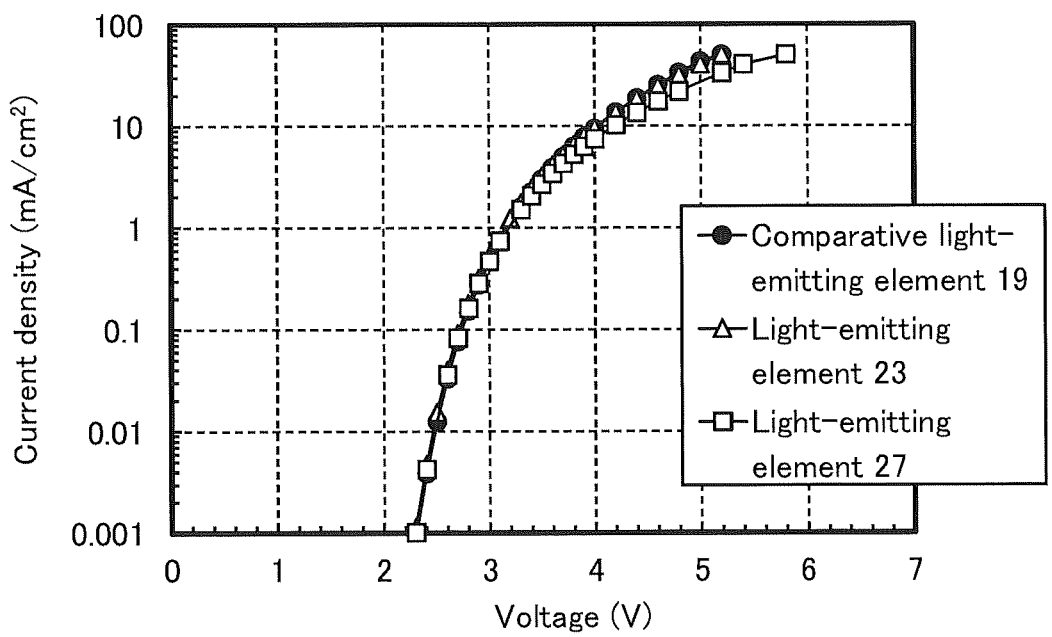
FIG. 21 is a view showing current density voltage characteristics of light-emitting elements in Example.
Figure 22:
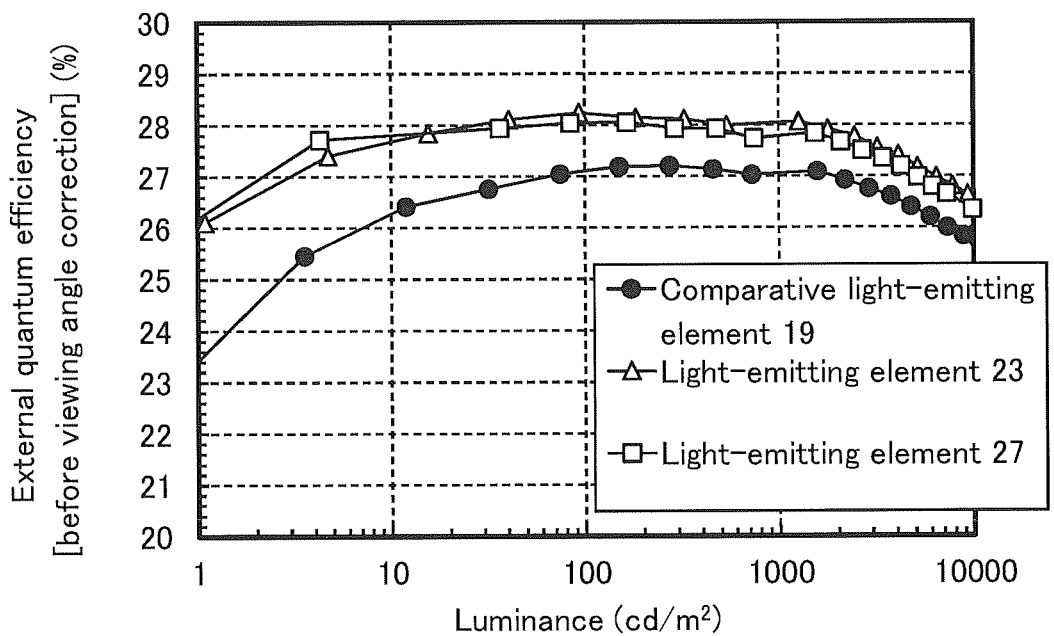
FIG. 22 is a view showing external quantum efficiency-luminance characteristics of light-emitting elements in Example.

FIG. 20 shows the current efficiency-luminance characteristics of the comparative light-emitting element 19, the light-emitting element 23, and the light-emitting element 27 among the fabricated light-emitting elements. FIG. 21 shows the current density-voltage characteristics. FIG. 22 shows the external quantum efficiency-luminance characteristics. The values of the external quantum efficiency shown in FIG. 22 are obtained when the light-emitting elements are not subjected to the viewing angle correction and are measured from the front direction. As the organic compound in the hole-injection layer 111, DBT3P-II was used in the comparative light-emitting element 19, mCzFLP was used in the light-emitting element 23, and FLP2A was used in the light-emitting element 27, and these elements have the same element structure except for the hole-injection layer 111.

FIG. 21 shows that the current density-voltage characteristics of the comparative light-emitting element 19, the light-emitting element 23, and the light-emitting element 27 are equivalent to each other. Thus, even when an organic compound with a low refractive index is used for the hole-injection layer 111, these elements have excellent hole-injection properties as in Example 1.

FIG. 20 and FIG. 22 show that the comparative light-emitting element 19, the light-emitting element 23, and the light-emitting element 27 each have a high current efficiency of approximately 100 cd/A and external quantum efficiency higher than 25%. The light-emitting element 23 and the light-emitting element 27 containing mCzFLP and FLP2A, respectively, that are organic compounds with low refractive indices in the hole-injection layers 111 have higher efficiency than the comparative light-emitting element 19 containing DBT3P-II that is a material with a high refractive index.

Figure 23:
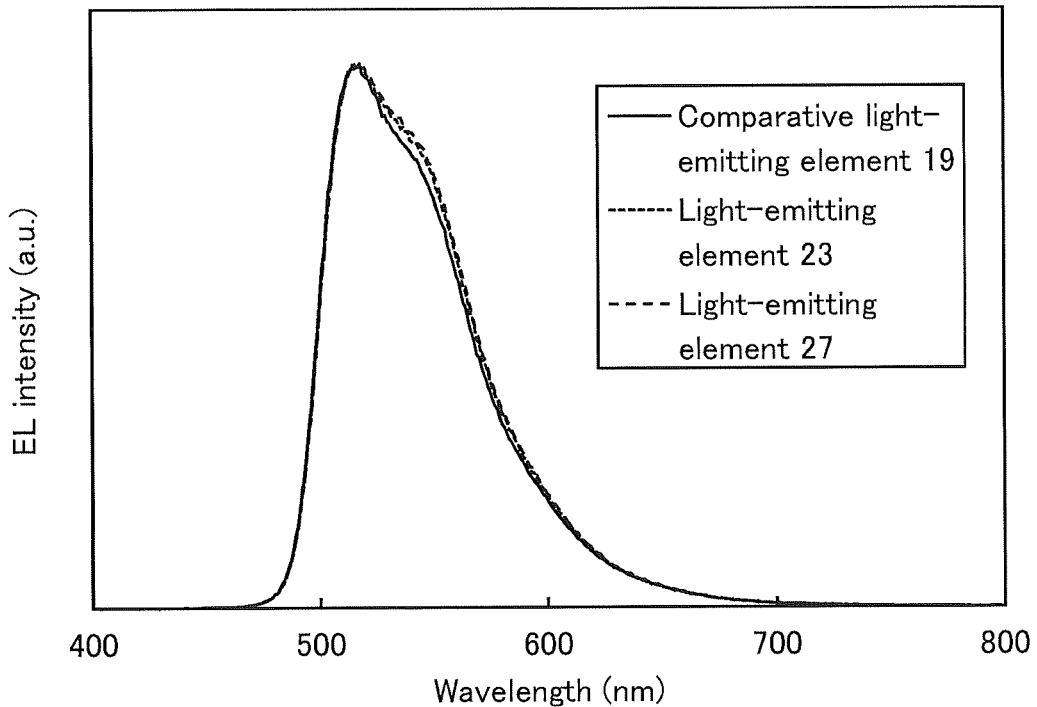
FIG. 23 is a view showing emission spectra in Example.

FIG. 23 shows emission spectra when current at a current density of 25 mA/cm$^2$ was applied to the comparative light-emitting element 19, the light-emitting element 23, and the light-emitting element 27. As shown in FIG. 23, the emission spectra of the comparative light-emitting element 19, the light-emitting element 23, and the light-emitting element 27 have peaks at around 518 nm, which are derived from light emission of a guest material Ir(ppy)$_3$ contained in the light-emitting layer 130.

Table 10 shows the element characteristics of the comparative light-emitting elements 19 to 22 and the light-emitting elements 23 to 30 at around 1000 cd/m$^2$.

TABLE 10

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
|---|---|---|---|---|---|---|---|
| Comparative light-emitting element 19 | 3.10 | 0.74 | (0.310, 0.637) | 727 | 97.9 | 99.2 | 24.8 |
| Comparative light-emitting element 20 | 3.20 | 1.10 | (0.316, 0.634) | 1050 | 95.9 | 94.1 | 25.1 |
| Comparative light-emitting element 21 | 3.20 | 1.10 | (0.324, 0.628) | 1016 | 92.4 | 90.7 | 25.0 |
| Comparative light-emitting element 22 | 3.20 | 1.09 | (0.333, 0.622) | 961 | 87.9 | 86.3 | 24.9 |
| Light-emitting element 23 | 3.00 | 0.53 | (0.313, 0.636) | 538 | 102 | 107 | 25.6 |
| Light-emitting element 24 | 3.20 | 1.09 | (0.320, 0.632) | 1081 | 98.8 | 97.0 | 26.1 |
| Light-emitting element 25 | 3.20 | 1.08 | (0.331, 0.624) | 1001 | 92.8 | 91.1 | 25.4 |
| Light-emitting element 26 | 3.20 | 1.09 | (0.339, 0.618) | 953 | 87.2 | 85.6 | 25.0 |
| Light-emitting element 27 | 3.10 | 0.73 | (0.315, 0.635) | 742 | 101 | 103 | 25.8 |
| Light-emitting element 28 | 3.20 | 1.00 | (0.323, 0.631) | 981 | 97.8 | 96.0 | 26.0 |
| Light-emitting element 29 | 3.20 | 0.98 | (0.332, 0.624) | 902 | 92.4 | 90.7 | 25.8 |
| Light-emitting element 30 | 3.20 | 1.01 | (0.340, 0.617) | 876 | 86.8 | 85.2 | 25.3 |

The above results demonstrate that the comparative light-emitting elements 19 to 22 and the light-emitting elements 23 to 30 fabricated in this example have favorable driving voltage and luminous efficiency regardless of the structure of the hole-injection layer 111.

<Relation Between Refractive Index of Hole-Injection Layer 111 and External Quantum Efficiency>

Figure 24:
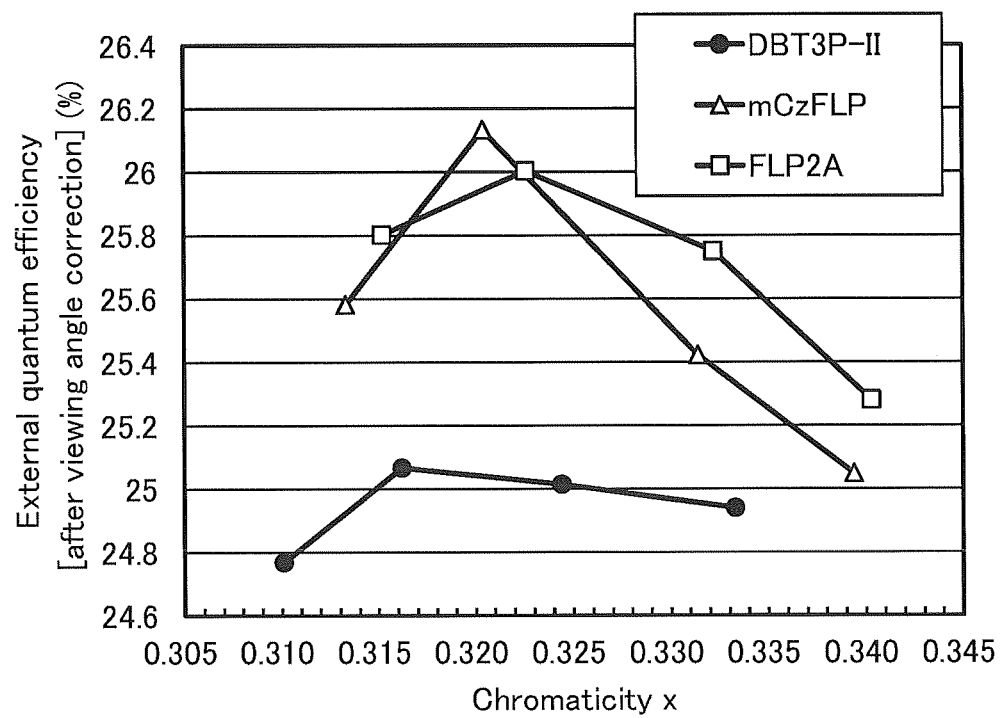
FIG. 24 is a view showing external quantum efficiency-chromaticity x characteristics of light-emitting elements in Example.

FIG. 24 shows a relation between chromaticity x and external quantum efficiency with the organic materials used for the hole-injection layers 111 with the use of the values of the elements shown in Table 10. In FIG. 24, the values of the comparative light-emitting elements 19 to 22 were used for data on the "DBT3P-II" curve, the values of the light-emitting elements 23 to 26 were used for data on the "mCzFLP" curve, and the values of the light-emitting elements 27 to 30 were used for data on the "FLP2A" curve.

As shown in FIG. 19, the refractive indices of the organic compounds used for the hole-injection layers 111 are high in the following order: DBT3P-II, mCzFLP, and FLP2A. FIG. 24 shows that the lower refractive index of the organic compound used for the hole-injection layer 111 results in higher external quantum efficiency as in Example 1. This is because light attenuation due to an evanescent mode is reduced and thus outcoupling efficiency is improved.

As described above, the use of an organic compound with a low refractive index for the hole-injection layer 111 enables a light-emitting element with excellent outcoupling efficiency to be obtained while a hole-injection property is maintained.

Example 3

In this example, examples of fabricating light-emitting elements, each of which is one kind of electronic device of one embodiment of the present invention, and the characteristics of the light-emitting elements are described. A refractive index of an organic compound used for a hole-injection layer and a refractive index of the hole-injection layer are also described. FIG. 2(A) shows a cross-sectional view of a structure of each element fabricated in this example. Tables 11 to 14 show the details of the element structures. Refer to the above embodiments and examples for the structures and abbreviations of compounds used here.

TABLE 11

|  | Layer | Reference numeral | Thickness (nm) | Material | Weight ratio |
|---|---|---|---|---|---|
| Comparative light-emitting elements 31 to 34 | Electrode | 102 | 200 | Al | — |
|  | Electron-injection layer | 119 | 1 | LiF | — |

TABLE 11-continued

|  | Layer | Reference numeral | Thickness (nm) | Material | Weight ratio |
|---|---|---|---|---|---|
|  | Electron-transport layer | 118(2) | 10 | BPhen | — |
|  |  | 118(1) | 20 | 4,6mCzP2Pm | — |
|  | Light-emitting layer | 130(2) | 20 | 4,6mCzP2Pm:PCCP:Ir(ppy)$_3$ | 0.8:0.2:0.1 |
|  |  | 130(1) | 20 | 4,6mCzP2Pm:PCCP:Ir(ppy)$_3$ | 0.5:0.5:0.1 |
|  | Hole-transport layer | 112 | 20 | PCCP | — |
|  | Hole-injection layer | 111 | $x_3$ | DBT3P-II:MoO$_3$ | 2:0.5 |
|  | Electrode | 101 | 70 | ITSO | — |
| Light-emitting elements 35 to 38 | Electrode | 102 | 200 | Al | — |
|  | Electron-injection layer | 119 | 1 | LiF | — |
|  | Electron-transport layer | 118(2) | 10 | BPhen | — |
|  |  | 118(1) | 20 | 4,6mCzP2Pm | — |
|  | Light-emitting layer | 130(2) | 20 | 4,6mCzP2Pm:PCCP:Ir(ppy)$_3$ | 0.8:0.2:0.1 |
|  |  | 130(1) | 20 | 4,6mCzP2Pm:PCCP:Ir(ppy)$_3$ | 0.5:0.5:0.1 |
|  | Hole-transport layer | 112 | 20 | PCCP | — |
|  | Hole-injection layer | 111(2) | $x_4$ | DBT3P-II:MoO$_3$ | 2:0.5 |
|  |  | 111(1) | 35 | CzC:MoO$_3$ | 2:0.5 |
|  | Electrode | 101 | 70 | ITSO | — |
| Light-emitting elements 39 to 42 | Electrode | 102 | 200 | Al | — |
|  | Electron-injection layer | 119 | 1 | LiF | — |
|  | Electron-transport layer | 118(2) | 10 | BPhen | — |
|  |  | 118(1) | 20 | 4,6mCzP2Pm | — |
|  | Light-emitting layer | 130(2) | 20 | 4,6mCzP2Pm:PCCP:Ir(ppy)$_3$ | 0.8:0.2:0.1 |
|  |  | 130(1) | 20 | 4,6mCzP2Pm:PCCP:Ir(ppy)$_3$ | 0.5:0.5:0.1 |
|  | Hole-transport layer | 112 | 20 | PCCP | — |
|  | Hole-injection layer | 111(2) | $x_4$ | DBT3P-II:MoO$_3$ | 2:0.5 |
|  |  | 111(1) | 35 | CzSi:MoO$_3$ | 2:0.5 |
|  | Electrode | 101 | 70 | ITSO | — |

TABLE 12

|  | Layer | Reference numeral | Thickness (nm) | Material | Weight ratio |
|---|---|---|---|---|---|
| Light-emitting elements 43 to 46 | Electrode | 102 | 200 | Al | — |
|  | Electron-injection layer | 119 | 1 | LiF | — |
|  | Electron-transport layer | 118(2) | 10 | BPhen | — |
|  |  | 118(1) | 20 | 4,6mCzP2Pm | — |
|  | Light-emitting layer | 130(2) | 20 | 4,6mCzP2Pm:PCCP:Ir(ppy)$_3$ | 0.8:0.2:0.1 |
|  |  | 130(1) | 20 | 4,6mCzP2Pm:PCCP:Ir(ppy)$_3$ | 0.5:0.5:0.1 |
|  | Hole-transport layer | 112 | 20 | PCCP | — |
|  | Hole-injection layer | 111(2) | $x_4$ | DBT3P-II:MoO$_3$ | 2:0.5 |
|  |  | 111(1) | 35 | FATPA:MoO$_3$ | 2:0.5 |
|  | Electrode | 101 | 70 | ITSO | — |
| Comparative light-emitting elements 47 to 50 | Electrode | 102 | 200 | Al | — |
|  | Electron-injection layer | 119 | 1 | LiF | — |
|  | Electron-transport layer | 118(2) | 10 | BPhen | — |
|  |  | 118(1) | 20 | 4,6mCzP2Pm | — |
|  | Light-emitting layer | 130(2) | 20 | 4,6mCzP2Pm:PCCP:Ir(ppy)$_3$ | 0.8:0.2:0.1 |
|  |  | 130(1) | 20 | 4,6mCzP2Pm:PCCP:Ir(ppy)$_3$ | 0.5:0.5:0.1 |
|  | Hole-transport layer | 112 | 20 | PCCP | — |
|  | Hole-injection layer | 111(2) | $x_4$ | DBT3P-II:MoO$_3$ | 2:0.5 |
|  |  | 111(1) | 35 | UGH-2:MoO$_3$ | 2:0.5 |
|  | Electrode | 101 | 70 | ITSO | — |

TABLE 13

|  | Comparative light-emitting element 31 | Comparative light-emitting element 32 | Comparative light-emitting element 33 | Comparative light-emitting element 34 |
|---|---|---|---|---|
| $x_3$ | 35 | 40 | 45 | 50 |

TABLE 14

|  | Light-emitting elements 35, 39, and 43 and comparative light-emitting element 47 | Light-emitting elements 36, 40, and 44 and comparative light-emitting element 48 | Light-emitting elements 37, 41, and 45 and comparative light-emitting element 49 | Light-emitting elements 38, 42, and 46 and comparative light-emitting element 50 |
|---|---|---|---|---|
| $x_4$ | 0 | 5 | 10 | 15 |

<Measurement of Refractive Index>

The refractive indices of organic compounds used for the hole-injection layers 111 of comparative light-emitting elements 31 to 34, light-emitting elements 35 to 38, light-emitting elements 39 to 42, light-emitting elements 43 to 46, and comparative light-emitting elements 47 to 50 and the refractive indices of the hole-injection layers 111 used in the comparative light-emitting elements 31 to 34, the light-emitting elements 35 to 38, the light-emitting elements 39 to 42, the light-emitting elements 43 to 46, and the comparative light-emitting elements 47 to 50 were measured. The measurement of the refractive indices was performed in a manner similar to that described in Example 1.

Figure 25:
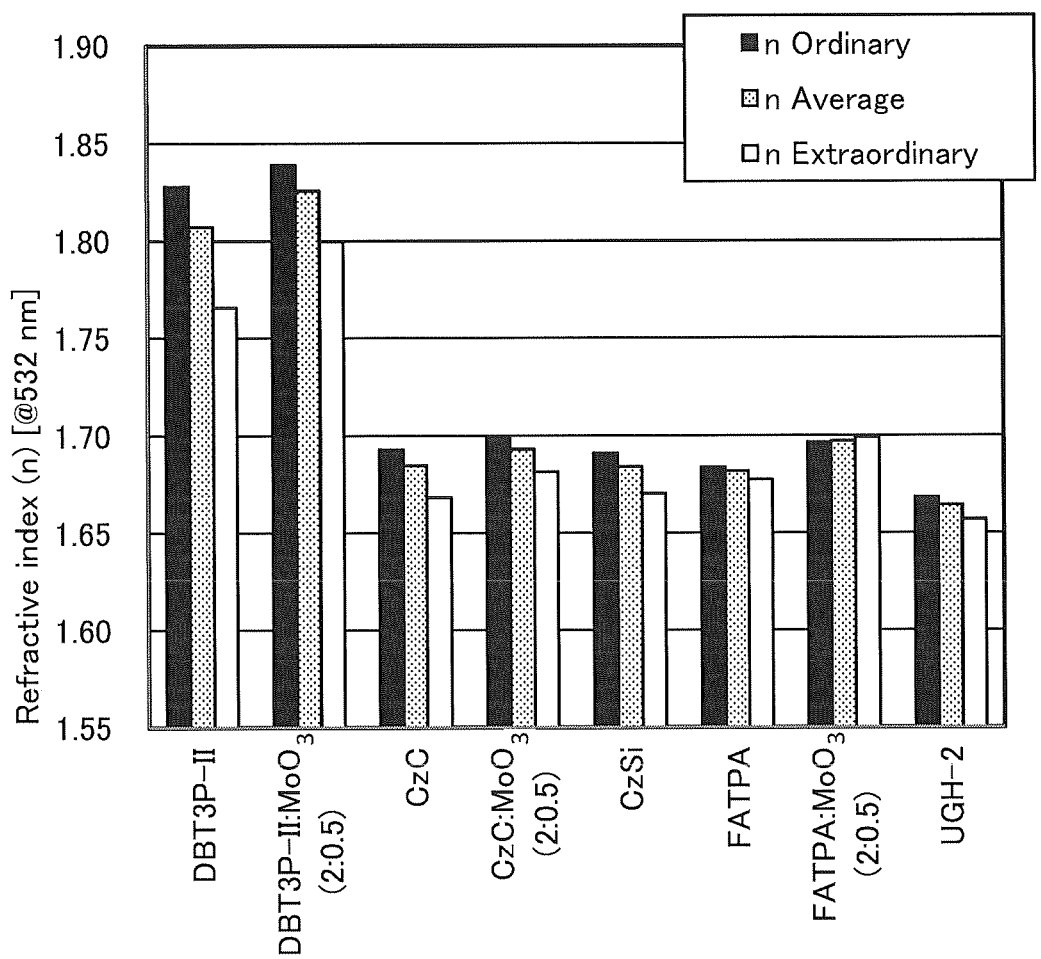
FIG. 25 is a view showing refractive indices in Example.

FIG. 25 shows the measurement results of the refractive indices of the films with respect to light with a wavelength of 532 nm. FIG. 25 reveals that DBT3P-II used for the comparative light-emitting elements 31 to 34 has the highest refractive index. It is also revealed that CzC used for the light-emitting elements 35 to 38, CzSi used for the light-emitting elements 39 to 42, FATPA used for the light-emitting elements 43 to 46, and 1,4-di(triphenylsilyl)benzene (abbreviation: UGIH-2) used for the comparative light-emitting elements 47 to 50 are each an organic compound with an extremely low refractive index; n Ordinary is lower than or equal to 1.70.

The hole-injection layer 111 is required to have a hole-injection property and thus preferably contains an electron-donating material. The hole-injection layer 111 of each of the light-emitting elements containing, as the electron-donating material, $MoO_3$ with a high refractive index presumably has a high refractive index. However, as shown in FIG. 25, the refractive indices of the films of the organic compounds to which $MoO_3$ of the hole-injection layer 111 of each of the light-emitting elements is added are found to be slightly higher than the refractive indices of the organic compounds. That is, even when a material with a high refractive index is mixed into the material having an electron-donating property, the use of a material with a low refractive index and an electron-donating property for the hole-injection layer 111 enables the hole-injection layer 111 with a low refractive index to be obtained.

FIG. 25 also shows that the difference between n Ordinary and n Extraordinary in the hole-injection layer 111 of each of the light-emitting elements is smaller than that in the film of each of the organic compounds. That is, it is found that the anisotropy of a mixed film of an organic compound and $MoO_3$ that is an electron-donating material is lower than that of an organic compound film.

It is presumed that a mixed film of $MoO_3$ and CzSi, which is the organic compound used for the hole-injection layers 111 of the light-emitting elements 39 to 42, and a mixed film of $MoO_3$ and UGH-2, which is the organic compound used for the hole-injection layers 111 of the comparative light-emitting elements 47 to 50, have approximately the same refractive indices as the respective organic compounds, and have lower refractive indices than a mixed film of $MoO_3$ and DBT3P-II, which is the hole-injection layer 111 of each of the comparative light-emitting elements 1 to 4.

<Fabrication of Light-Emitting Elements>

<<Fabrication of Comparative Light-Emitting Elements 31 to 34>>

As the electrode 101, an ITSO film was formed to a thickness of 70 nm over a glass substrate. Note that the electrode area of the electrode 101 was set to 4 mm² (2 mm×2 mm).

Next, as the hole-injection layer 111, 1,3,5-tri-(4-dibenzothiophenyl)-benzene (abbreviation: DBT3P-II) and $MoO_3$ were deposited over the electrode 101 by co-evaporation at a weight ratio (DBT3P-II: $MoO_3$) of 2:0.5 to a thickness of $x_3$ nm. Note that the value $x_3$ differs between the light-emitting elements, and Table 13 shows the value $x_3$ in each of the light-emitting elements.

Next, as the hole-transport layer 112, PCCP was deposited over the hole-injection layer 111 by evaporation to a thickness of 20 nm.

Next, as the light-emitting layer 130(1), 4,6mCzP2Pm, PCCP, and Ir(ppy)$_3$ were deposited over the hole-transport layer 112 by co-evaporation at a weight ratio (4,6mCzP2Pm: PCCP: Ir(ppy)$_3$) of 0.5:0.5:0.1 to a thickness of 20 nm, and successively, as the light-emitting layer 130(2), 4,6mCzP2Pm, PCCP, and Ir(ppy)$_3$ were deposited by co-evaporation at a weight ratio of 0.8:0.2:0.1 to a thickness of 20 nm. Note that in the light-emitting layer 130(1) and the light-emitting layer 130(2), Ir(ppy)$_3$ is a guest material that emits phosphorescence.

Next, as the first electron-transport layer 118(1), 4,6mCzP2Pm was deposited over the light-emitting layer 130(2) by co-evaporation to a thickness of 20 nm. Subsequently, as the second electron-transport layer 118(2), bathophenanthroline (abbreviation: BPhen) was deposited over the first electron-transport layer 118(1) by evaporation to a thickness of 10 nm.

Next, as the electron-injection layer 119, lithium fluoride (LiF) was deposited over the second electron-transport layer 118(2) by evaporation to a thickness of 1 nm.

Next, as the electrode 102, aluminum (Al) was formed over the electron-injection layer 119 to a thickness of 200 nm.

Next, in a glove box containing a nitrogen atmosphere, the comparative light-emitting elements 31 to 34 were sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm² was performed, and heat treatment at 80° C. for one hour was performed. Through the above steps, the comparative light-emitting elements 31 to 34 were obtained.

<<Fabrication of Light-Emitting Elements 35 to 46 and Comparative Light-Emitting Elements 47 to 50>>

The light-emitting elements 35 to 46 and the comparative light-emitting elements 47 to 50 were formed through the same steps as the steps of forming the comparative light-emitting elements 31 to 34 except for the step of forming the hole-injection layer 111. The details of the element structures are shown in Tables 11 to 14; thus, the details of the fabrication methods are omitted.

<Characteristics of Light-Emitting Elements>

Next, the characteristics of the fabricated comparative light-emitting elements 31 to 34, light-emitting elements 35 to 46, and comparative light-emitting elements 47 to 50 were measured. The measurement was performed in a manner similar to that in Example 1.

Figure 26:
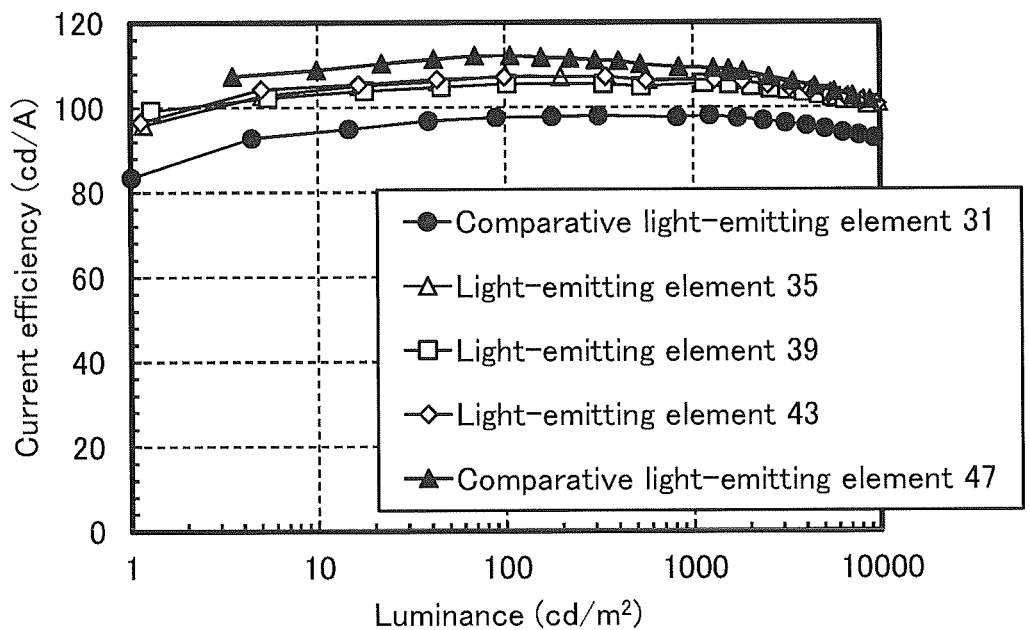
FIG. 26 is a view showing current efficiency-luminance characteristics of light-emitting elements in Example.
Figure 27:
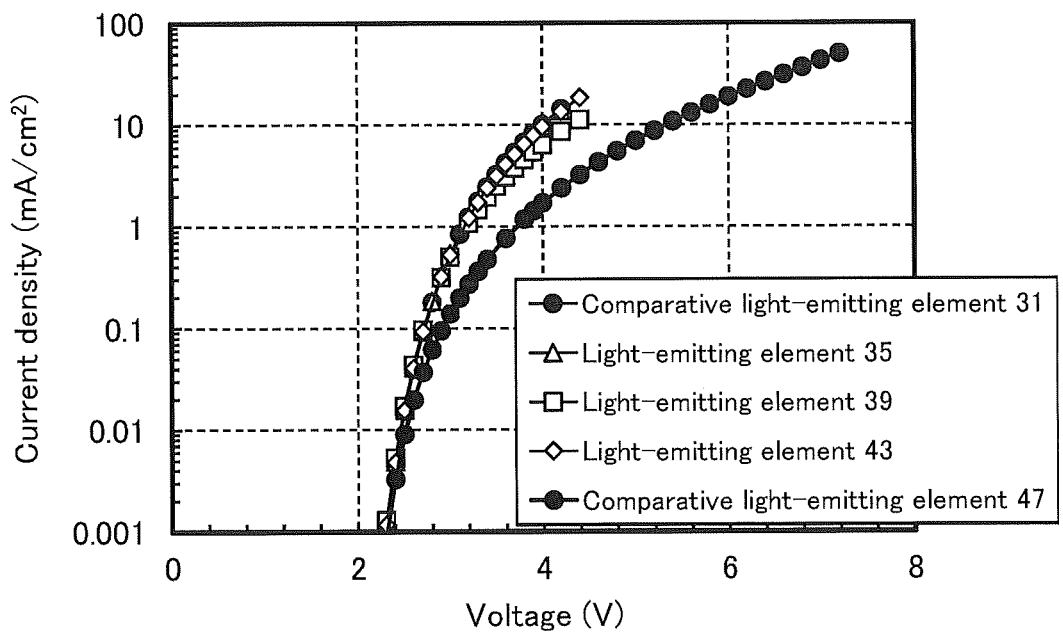
FIG. 27 is a view showing current density-voltage characteristics of light-em itting elements in Example.
Figure 28:
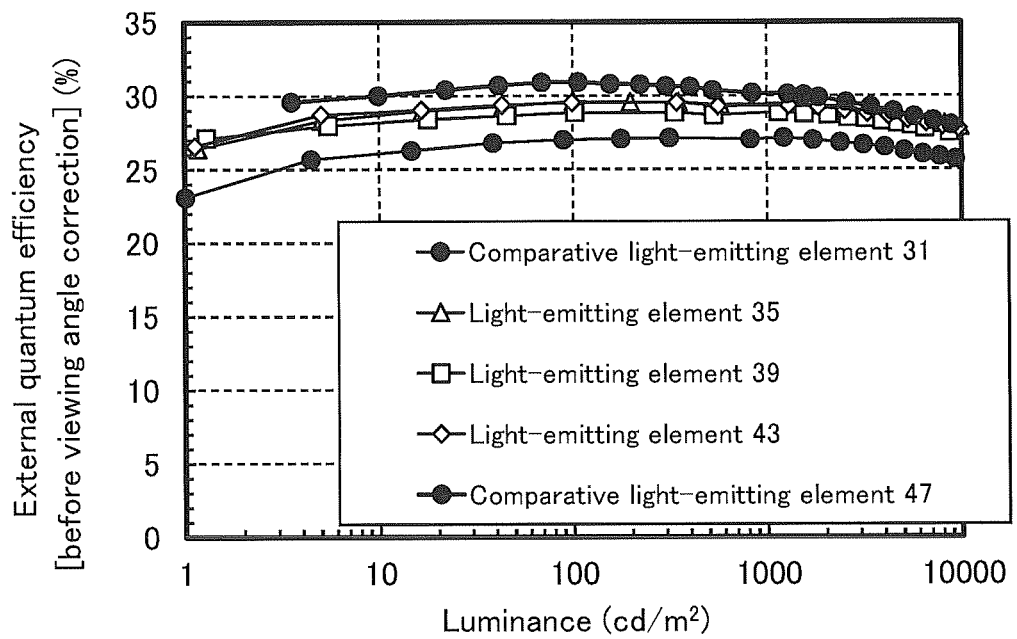
FIG. 28 is a view showing external quantum efficiency-luminance characteristics of light-emitting elements in Example.

FIG. 26 shows the current efficiency-luminance characteristics of the comparative light-emitting element 31, the light-emitting element 35, the light-emitting element 39, the light-emitting element 43, and the comparative light-emitting element 47 among the fabricated light-emitting elements. FIG. 27 shows the current density-voltage characteristics. FIG. 28 shows the external quantum efficiency-luminance characteristics. The values of the external quantum efficiency shown in FIG. 28 are obtained when the light-emitting elements are not subjected to the viewing angle correction and are measured from the front direction. As the organic compound in the hole-injection layer 111, DBT3P-II was used in the comparative light-emitting element 31, CzC was used in the light-emitting element 35, CzSi was used in the light-emitting element 39, FATPA was used in the light-emitting element 43, and UGH-2 was used in the comparative light-emitting element 47, and these elements have the same element structure except for the hole-injection layer 111.

FIG. 26 and FIG. 28 show that the comparative light-emitting element 31, the light-emitting element 35, the light-emitting element 39, the light-emitting element 43, and the comparative light-emitting element 47 have current efficiency higher than 90 cd/A and external quantum efficiency higher than 25%. The light-emitting element 35, the light-emitting element 39, the light-emitting element 43, and the comparative light-emitting element 47 that contain organic compounds with low refractive indices in the hole-injection layers 111 have higher efficiency than the comparative light-emitting element 31 containing DBT3P-II that is a material with a high refractive index. This suggests that the use of an organic compound with a low refractive index for the hole-injection layer 111 inhibits light attenuation due to an evanescent wave.

FIG. 27 shows that the current density-voltage characteristics of the comparative light-emitting element 31, the light-emitting element 35, the light-emitting element 39, and the light-emitting element 43 are excellent and equivalent to each other. On the other hand, the current density-voltage characteristics of the comparative light-emitting element 47 degrade as compared with those of the comparative light-emitting element 31, the light-emitting element 35, the light-emitting element 39, and the light-emitting element 43, which demonstrates that the comparative light-emitting element 47 has a low hole-injection property. This is because UGH-2 does not have an electron-donating group in its molecule. Thus, an electron-donating group in a molecule enables formation of the hole-injection layer 111 having an excellent hole-injection property even when a material with a low refractive index is used for the hole-injection layer 111.

Figure 29:
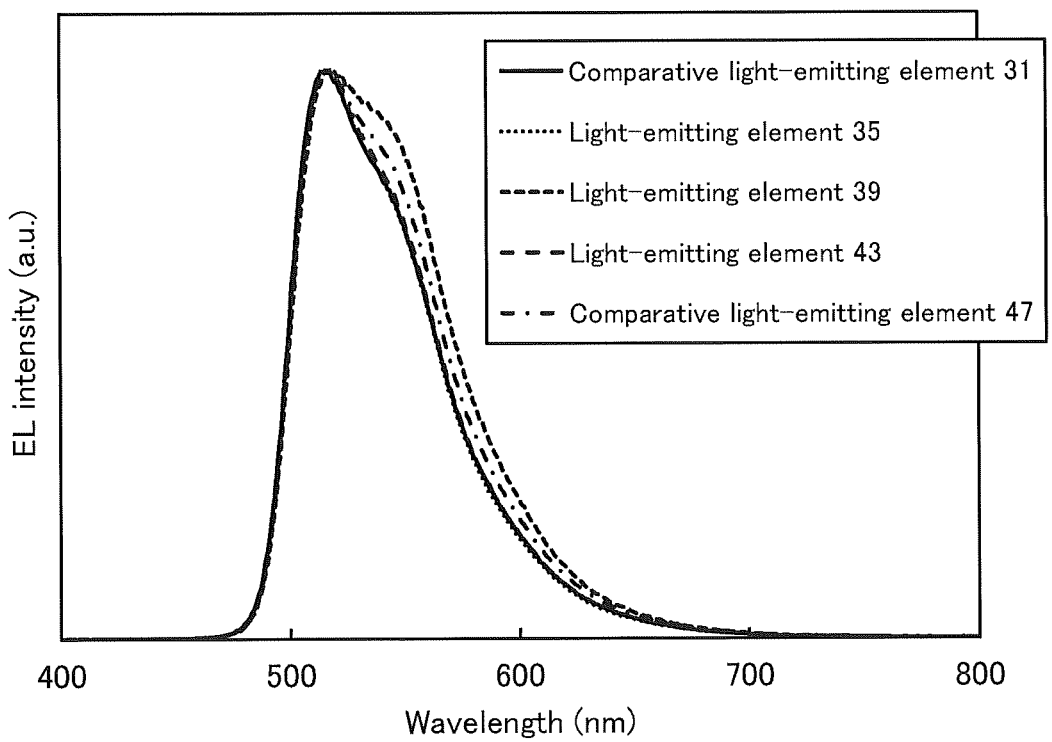
FIG. 29 is a view showing emission spectra in Example.

FIG. 29 shows emission spectra when current at a current density of 25 mA/cm$^2$ was applied to the comparative light-emitting element 31, the light-emitting element 35, the light-emitting element 39, the light-emitting element 43, and the comparative light-emitting element 47. As shown in FIG. 29, the emission spectra of the comparative light-emitting element 31, the light-emitting element 35, the light-emitting element 39, the light-emitting element 43, and the comparative light-emitting element 47 have peaks at around 518 nm, which are derived from light emission of a guest material Ir(ppy)$_3$ contained in the light-emitting layer 130.

Table 15 shows the element characteristics of the comparative light-emitting elements 31 to 34, the light-emitting elements 35 to 46, and the comparative light-emitting elements 47 to 50 at around 1000 cd/m$^2$. The external quantum efficiency shown in Table 15 is obtained after the viewing angle correction.

TABLE 15

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
| --- | --- | --- | --- | --- | --- | --- | --- |
| Comparative light-emitting element 31 | 3.10 | 0.84 | (0.305, 0.639) | 821 | 97.6 | 98.9 | 23.5 |
| Comparative light-emitting element 32 | 3.20 | 1.20 | (0.310, 0.640) | 1174 | 97.9 | 96.1 | 24.4 |
| Comparative light-emitting element 33 | 3.20 | 1.21 | (0.318, 0.635) | 1154 | 95.1 | 93.3 | 24.5 |
| Comparative light-emitting element 34 | 3.10 | 0.81 | (0.330, 0.624) | 736 | 91.1 | 92.3 | 24.4 |
| Light-emitting element 35 | 3.00 | 0.54 | (0.303, 0.641) | 575 | 106 | 112 | 25.1 |
| Light-emitting element 16 | 3.00 | 0.51 | (0.312, 0.637) | 531 | 105 | 110 | 25.7 |
| Light-emitting element 37 | 3.20 | 1.18 | (0.320, 0.635) | 1193 | 101 | 99.3 | 26.0 |
| Light-emitting element 38 | 3.10 | 0.80 | (0.333, 0.623) | 764 | 95.1 | 96.4 | 25.7 |
| Light-emitting element 39 | 3.20 | 1.09 | (0.321, 0.633) | 1147 | 106 | 104 | 27.5 |
| Light-emitting element 40 | 3.20 | 1.02 | (0.334, 0.623) | 1004 | 98.2 | 96.4 | 27.0 |
| Light-emitting element 41 | 3.20 | 1.02 | (0.343, 0.616) | 923 | 90.6 | 88.9 | 26.2 |
| Light-emitting element 42 | 3.20 | 1.02 | (0.351, 0.609) | 847 | 83.2 | 81.7 | 25.3 |
| Light-emitting element 43 | 3.00 | 0.53 | (0.306, 0.640) | 561 | 106 | 111 | 25.6 |
| Light-emitting element 44 | 3.00 | 0.51 | (0.317, 0.634) | 525 | 103 | 108 | 26.0 |
| Light-emitting element 45 | 3.20 | 1.20 | (0.321, 0.633) | 1193 | 99.3 | 97.5 | 25.9 |
| Light-emitting element 46 | 3.10 | 0.81 | (0.337, 0.620) | 742 | 92.1 | 93.4 | 25.5 |
| Comparative |  |  |  |  |  |  |  |

TABLE 15-continued

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
| --- | --- | --- | --- | --- | --- | --- | --- |
| light-emitting element 47 | 3.60 | 0.77 | (0.316, 0.634) | 841 | 109 | 95.5 | 27.8 |
| Comparative light-emitting element 48 | 3.80 | 0.83 | (0.324, 0.629) | 873 | 105 | 86.9 | 27.9 |
| Comparative light-emitting element 49 | 3.80 | 0.77 | (0.333, 0.623) | 777 | 101 | 83.8 | 28.1 |
| Comparative light-emitting element 50 | 3.80 | 0.84 | (0.342, 0.616) | 803 | 95.5 | 78.9 | 27.7 |

The above results demonstrate that the comparative light-emitting elements 31 to 34, the light-emitting elements 35 to 46, and the comparative light-emitting elements 47 to 50 fabricated in this example have favorable driving voltage and luminous efficiency regardless of the structure of the hole-injection layer 111.

<Reliability of Light-Emitting Elements>

Figure 30:
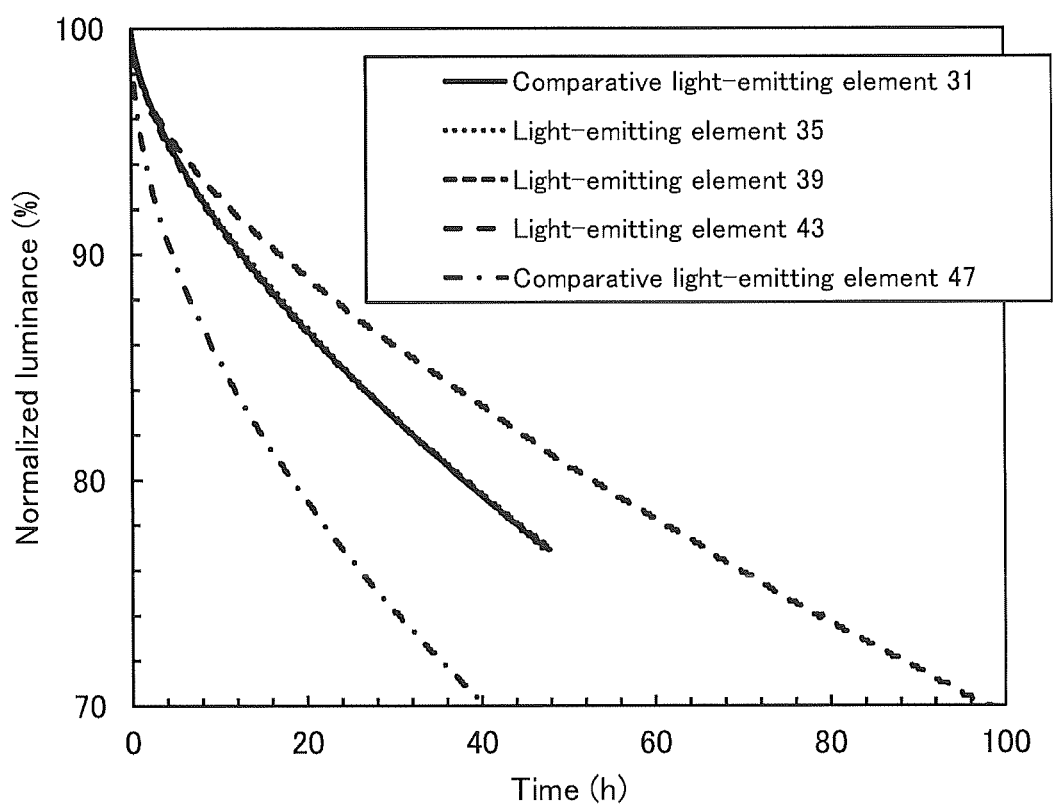
FIG. 30 is a view showing reliability test results in Example.

Next, driving tests at a constant current of 2 mA were performed on the comparative light-emitting element 31, the light-emitting element 35, the light-emitting element 39, the light-emitting element 43, and the comparative light-emitting element 47. FIG. 30 shows the results. FIG. 30 indicates that the reliability of the comparative light-emitting element 31, the light-emitting element 35, the light-emitting element 39, and the light-emitting element 43 is higher than the reliability of the comparative light-emitting element 47. The reliability of the light-emitting element 43 is particularly high. As described above, this is probably because the organic compounds used for the hole-injection layers 111 of the comparative light-emitting element 31, the light-emitting element 35, the light-emitting element 39, and the light-emitting element 43 have electron-donating groups in their molecules and thus have higher hole-injection properties than UGH-2 used for the comparative light-emitting element 47. Thus, it is found that a higher hole-injection property of the hole-injection layer 111 results in higher reliability of a light-emitting element. Note that in FIG. 30, the reliability test results of the comparative light-emitting element 31, the light-emitting element 35, and the light-emitting element 39 overlap with each other.

<Relation Between Refractive Index of Hole-Injection Layer 111 and External Quantum Efficiency>

Figure 31:
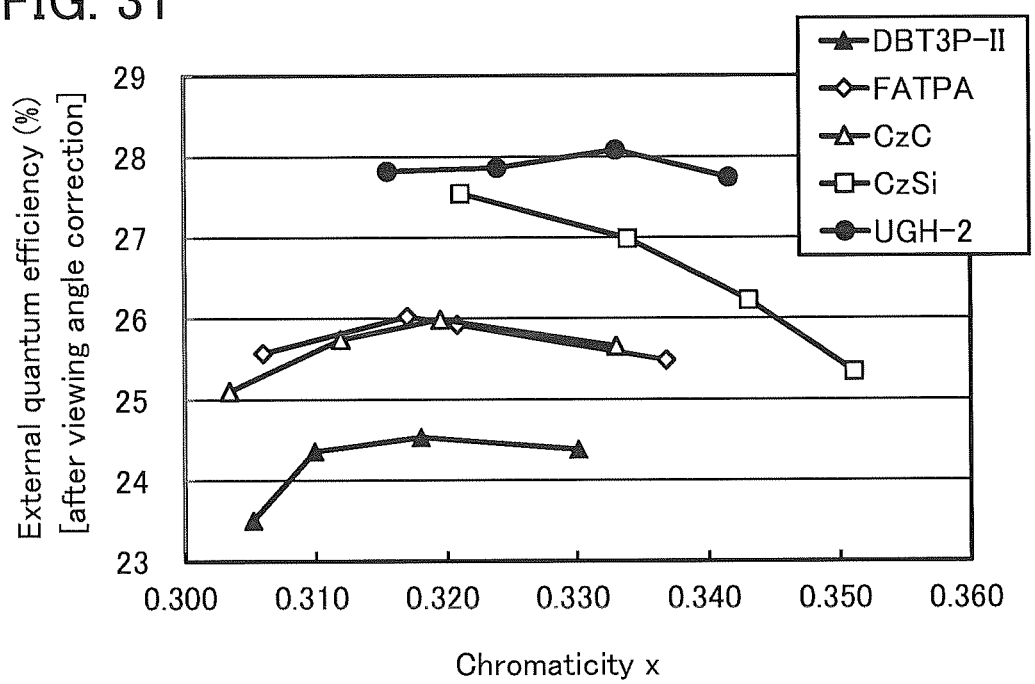
FIG. 31 is a view showing external quantum efficiency-chromaticity x characteristics of light-emitting elements in Example.

FIG. 31 shows a relation between chromaticity x and external quantum efficiency with the organic materials used for the hole-injection layers 111 with the use of the values of the elements shown in Table 15. In FIG. 31, the values of the comparative light-emitting elements 31 to 34 were used for data on the "DBT3P-II" curve, the values of the light-emitting elements 35 to 38 were used for data on the "CzC" curve, the values of the light-emitting elements 39 to 42 were used for data on the "CzSi" curve, the values of the light-emitting elements 43 to 46 were used for data on the "FATPA" curve, and the values of the comparative light-emitting elements 47 to 50 were used for data on the "UGH-2" curve.

As shown in FIG. 25, DBT3P-II, which is an organic compound used for the hole-injection layer 111, has a refractive index higher than 1.80, whereas CzC, CzSi, FATPA, and UGH-2 are organic compounds with refractive indices lower than or equal to 1.70. FIG. 31 indicates that the light-emitting element using an organic compound with a low refractive index for the hole-injection layer 111 has higher external quantum efficiency than the light-emitting element using DBT3P-II for the hole-injection layer 111. This is because light attenuation due to an evanescent mode is reduced and thus outcoupling efficiency is improved.

As described above, with the use of an organic compound including an electron-donating group and one of the tetraarylmethane skeleton and the tetraarylsilane skeleton for the hole-injection layer 111, a light-emitting element having excellent outcoupling efficiency and excellent reliability can be obtained while maintaining its hole-injection characteristics.

Example 4

In this example, examples of fabricating light-emitting elements, each of which is one kind of electronic device of one embodiment of the present invention, and the characteristics of the light-emitting elements are described. A refractive index of an organic compound used for a hole-injection layer and a refractive index of the hole-injection layer are also described. FIG. 2(A) shows a cross-sectional view of a structure of each element fabricated in this example. Table 16 and Table 17 show the details of the element structures. The structures and abbreviations of compounds used here are shown below. Refer to the above examples and embodiments for other organic compounds. Note that in each of the light-emitting elements described in this example, the hole-injection layer 111 does not use a metal oxide and includes only an organic compound.

[Chemical Formulae 10]

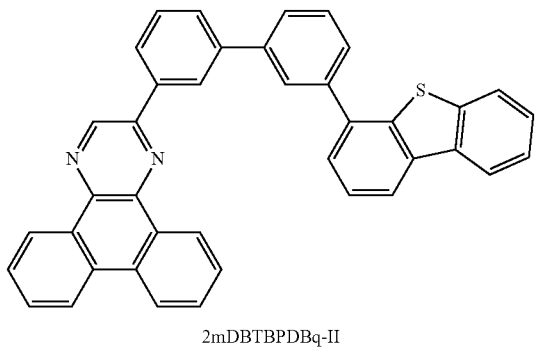

2mDBTBPDBq-II

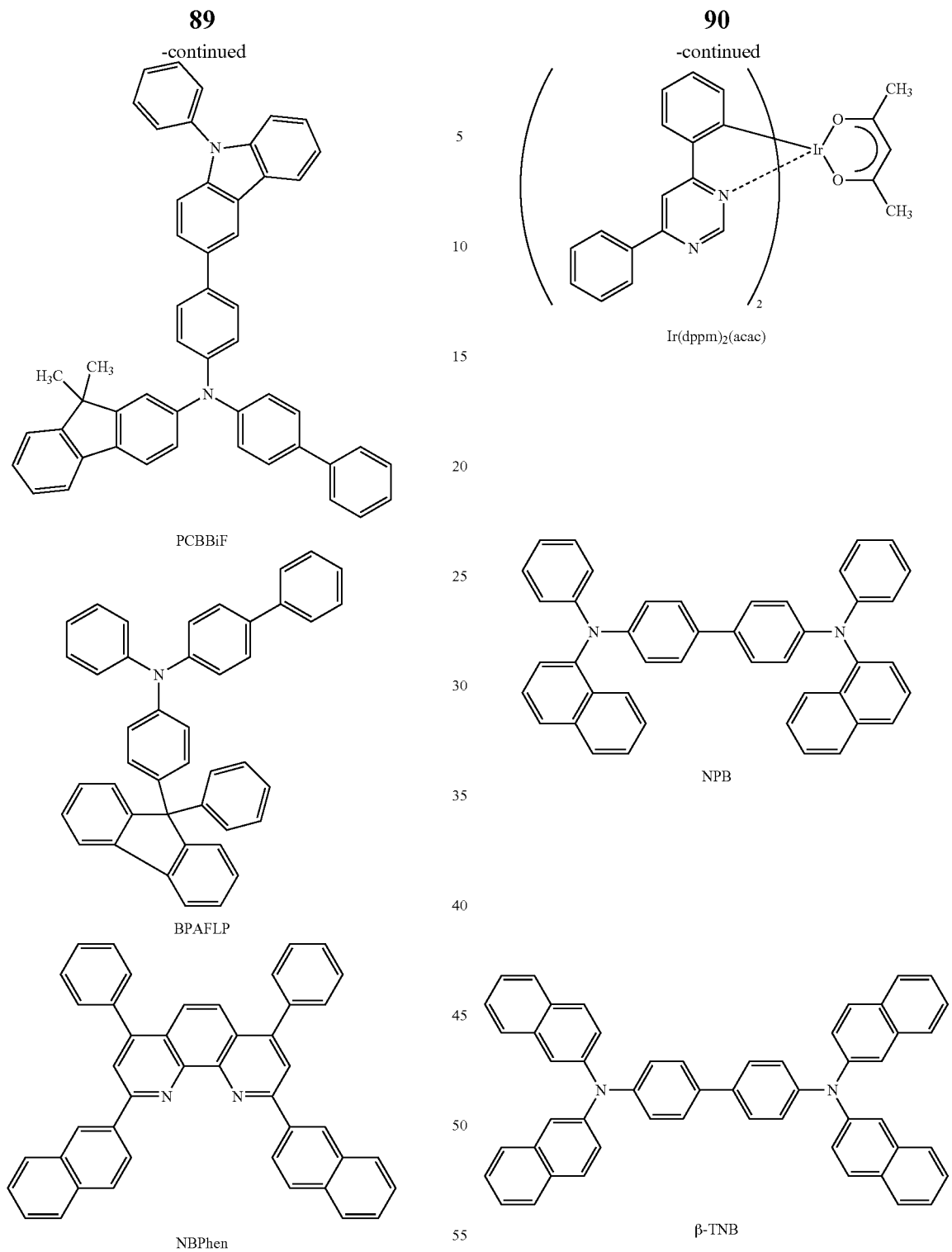
| | Layer | Reference numeral | Thickness (nm) | Material | Weight ratio |
|---|---|---|---|---|---|
| Comparative light-emitting elements 51 to 54 | Electrode | 102 | 200 | Al | — |
| | Electron-injection layer | 119 | 1 | LiF | — |
| | Electron-transport layer | 118(2) | 20 | NBPhen | — |
| | | 118(1) | 20 | 2mDBTBPDBq-II | — |
TABLE 16

TABLE 16-continued

| Layer | | Reference numeral | Thickness (nm) | Material | Weight ratio |
|---|---|---|---|---|---|
| | Light-emitting layer | 130(2) | 20 | 2mDBTBPDBq-II:PCBBiF:Ir(dppm)$_2$(acac) | 0.8:0.2:0.06 |
| | | 130(1) | 20 | 2mDBTBPDBa-II:PCBBiF:Ir(dppm)$_2$(acac) | 0.7:0.3:0.06 |
| | Hole-transport layer | 112 | $z_1$ | PCBBiF | — |
| | Hole-injection layer | 111 | 60 | β-TNB:p-dopant | 1:0.01 |
| | Electrode | 101 | 70 | ITSO | — |
| Comparative light-emitting elements 55 to 58 | Electrode | 102 | 200 | Al | — |
| | Electron-injection layer | 119 | 1 | LiF | — |
| | Electron-transport layer | 118(2) | 20 | NBPhen | — |
| | | 118(1) | 20 | 2mDBTBPDBq-II | — |
| | Light-emitting layer | 130(2) | 20 | 2mDBTBPDBq-II:PCBBiF:Ir(dppm)$_2$(acac) | 0.8:0.2:0.06 |
| | | 130(1) | 20 | 2mDBTBPDBq-II:PCBBiF:Ir(dppm)$_2$(acac) | 0.7:0.3:0.06 |
| | Hole-transport layer | 112 | $z_1$ | PCBBiF | — |
| | Hole-injection layer | 111(2) | 60 | NPBp-dopant | 1:0.01 |
| | Electrode | 101 | 70 | ITSO | — |
| Light-emitting elements 59 to 62 | Electrode | 102 | 200 | Al | — |
| | Electron-injection layer | 119 | 1 | LiF | — |
| | Electron-transport layer | 118(2) | 20 | NBPhen | — |
| | | 118(1) | 20 | 2mDBTBPDBq-II | — |
| | Light-emitting layer | 130(2) | 20 | 2mDBTBPDBq-II:PCBBiF:Ir(dppm)$_2$(acac) | 0.8:0.2:0.06 |
| | | 130(1) | 20 | 2mDBTBPDBq-II:PCBBiF:Ir(dppm)$_2$(acac) | 0.7:0.3:0.06 |
| | Hole-transport layer | 112 | $z_1$ | PCBBiF | — |
| | Hole-injection layer | 111(2) | 60 | BPAFLP:p-dopant | 1:0.01 |
| | Electrode | 101 | 70 | ITSO | — |
| Light-emitting elements 63 to 66 | Electrode | 102 | 200 | Al | — |
| | Electron-injection layer | 119 | 1 | LiF | — |
| | Electron-transport layer | 118(2) | 20 | NBPhen | — |
| | | 118(1) | 20 | 2mDBTBPDBq-II | — |
| | Light-emitting layer | 130(2) | 20 | 2mDBTBPDBq-II:PCBBiF:Ir(dppm)$_2$(acac) | 0.8:0.2:0.06 |
| | | 130(1) | 20 | 2mDBTBPDBq-II:PCBBiF:Ir(dppm)$_2$(acac) | 0.7:0.3:0.06 |
| | Hole-transport layer | 112 | $z_1$ | PCBBiF | — |
| | Hole-injection layer | 111(2) | 60 | TAPC:p-dopant | 1:0.01 |
| | Electrode | 101 | 70 | ITSO | — |

TABLE 17

| | Comparative light-emitting elements 51 and 55 and light-emitting elements 59 and 63 | Comparative light-emitting elements 52 and 56 and light-emitting elements 60 and 64 | Comparative light-emitting elements 53 and 57 and light-emitting elements 61 and 65 | Comparative light-emitting elements 54 and 58 and light-emitting elements 62 and 66 |
|---|---|---|---|---|
| $z_1$ | 20 | 25 | 30 | 35 |

<Measurement of Refractive Index>

The refractive indices of the hole-injection layers 111 of comparative light-emitting elements 51 to 54, comparative light-emitting elements 55 to 58, light-emitting elements 59 to 62, and light-emitting elements 63 to 66 were measured. The measurement of the refractive indices was performed in a manner similar to that described in Example 1. Table 18 shows the refractive indices (n Ordinary) of the films with respect to light with a wavelength of 633 nm.

TABLE 18

| Hole-injection layer 111 (weight ratio) | n Ordinary |
|---|---|
| β-TNB:p-dopant (1:0.01) | 1.77 |
| NPB:p-dopant (1:0.01) | 1.77 |
| BPAFLP:p-dopant (1:0.01) | 1.73 |
| TAPC:p-dopant (1:0.01) | 1.67 |

Table 18 reveals that the mixed film of N,N,N′,N′-tetra-naphthalen-2-yl-benzidine (abbreviation: β-TNB) and a p-dopant (purchased from Analysis Atelier Corporation) that is used for the comparative light-emitting elements 51 to 54 and the mixed film of NPB and a p-dopant that is used for the comparative light-emitting elements 55 to 58 each have a refractive index higher than 1.75. By contrast, it is revealed that the mixed film of BPAFLP and a p-dopant that is used for the light-emitting elements 59 to 62 and the mixed film of TAPC and a p-dopant that is used for the light-emitting elements 63 to 66 each have a refractive index lower than 1.75.

<Fabrication of Light-Emitting Elements>
<<Fabrication of Comparative Light-Emitting Elements 51 to 54>>

As the electrode 101, an ITSO film was formed to a thickness of 70 nm over a glass substrate. Note that the electrode area of the electrode 101 was set to 4 mm² (2 mm×2 mm).

Next, as the hole-injection layer 111, β-TNB and a p-dopant were deposited over the electrode 101 by co-evaporation at a weight ratio (β-TNB: p-dopant) of 1:0.01 to a thickness of 60 nm.

Next, as the hole-transport layer 112, PCBBiF was deposited over the hole-injection layer 111 by evaporation to a thickness of $z_1$ nm. Note that the value $z_1$ differs between the light-emitting elements, and Table 17 shows the value $z_1$ in each of the light-emitting elements.

Next, as the light-emitting layer 130(1), 2mDBTBPDBq-II, PCBBiF, and Ir(dppm)$_2$(acac) were deposited over the hole-transport layer 112 by co-evaporation at a weight ratio (2mDBTBPDBq-II: PCBBiF: Ir(dppm)$_2$(acac)) of 0.7:0.3:0.06 to a thickness of 20 nm, and successively, as the light-emitting layer 130(2), 2mDBTBPDBq-II, PCBBiF, and Ir(dppm)$_2$(acac) were deposited by co-evaporation at a weight ratio of 0.8:0.2:0.06 to a thickness of 20 nm. Note that in the light-emitting layer 130(1) and the light-emitting layer 130(2), Ir(dppm)$_2$(acac) is a guest material that emits phosphorescence.

Next, as the first electron-transport layer 118(1), 2mDBTBPDBq-II was deposited over the light-emitting layer 130(2) by co-evaporation to a thickness of 20 nm. Subsequently, as the second electron-transport layer 118(2), 2,9-bis(naphthalen-2-yl)-4,7-diphenyl-1,10-phenanthroline (abbreviation: NBPhen) was deposited over the first electron-transport layer 118(1) by evaporation to a thickness of 20 nm.

Next, as the electron-injection layer 119, lithium fluoride (LiF) was deposited over the second electron-transport layer 118(2) by evaporation to a thickness of 1 nm.

Next, as the electrode 102, aluminum (Al) was formed over the electron-injection layer 119 to a thickness of 200 nm.

Next, in a glove box containing a nitrogen atmosphere, the comparative light-emitting elements 51 to 54 were sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the comparative light-emitting elements 51 to 54 were obtained.

<<Fabrication of Comparative Light-Emitting Elements 55 to 58 and Light-Emitting Elements 59 to 66>>

The comparative light-emitting elements 55 to 58 and the light-emitting elements 59 to 66 were formed through the same steps as the steps of forming the comparative light-emitting elements 51 to 54 except for the step of forming the hole-injection layer 111. The details of the element structures are shown in Table 16 and Table 17; thus, the details of the fabrication methods are omitted.

<Characteristics of Light-Emitting Elements>

Next, the characteristics of the fabricated comparative light-emitting elements 51 to 58 and light-emitting elements 59 to 66 were measured. The measurement was performed in a manner similar to that in Example 1. Table 19 shows the characteristics of the light-emitting elements at around 1000 cd/m$^2$. The external quantum efficiency shown in Table 19 is obtained before the viewing angle correction.

TABLE 19

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) (after viewing angle correction) |
|---|---|---|---|---|---|---|---|
| Comparative light-emitting element 51 | 2.90 | 1.49 | (0.558, 0.443) | 1145 | 76.7 | 83.1 | 31.0 |
| Comparative light-emitting element 52 | 2.90 | 1.45 | (0.562, 0.438) | 1035 | 71.5 | 77.5 | 29.7 |
| Comparative light-emitting element 53 | 2.90 | 1.38 | (0.562, 0.436) | 918 | 66.6 | 72.1 | 28.5 |
| Comparative light-emitting element 54 | 2.90 | 1.35 | (0.563, 0.435) | 833 | 61.9 | 67.1 | 27.1 |
| Comparative light-emitting element 55 | 2.90 | 1.46 | (0.558, 0.442) | 1129 | 77.4 | 83.9 | 31.1 |
| Comparative light-emitting element 56 | 2.90 | 1.46 | (0.561, 0.439) | 1058 | 72.3 | 78.3 | 30.0 |
| Comparative light-emitting element 57 | 2.90 | 1.49 | (0.563, 0.437) | 1019 | 68.2 | 73.9 | 28.9 |
| Comparative light-emitting element 58 | 2.90 | 1.46 | (0.564, 0.435) | 922 | 63.2 | 68.4 | 27.5 |
| Light-emitting element 59 | 4.20 | 1.24 | (0.560, 0.438) | 930 | 75.0 | 56.1 | 30.9 |
| Light-emitting element 60 | 4.20 | 1.24 | (0.562, 0.436) | 861 | 69.5 | 52.0 | 29.5 |
| Light-emitting element 61 | 4.40 | 1.65 | (0.565, 0.435) | 1054 | 63.8 | 45.6 | 27.9 |
| Light-emitting element 62 | 4.40 | 1.69 | (0.566, 0.434) | 995 | 58.8 | 42.0 | 26.4 |
| Light-emitting element 63 | 3.10 | 1.59 | (0.565, 0.435) | 1113 | 70.1 | 71.1 | 30.2 |
| Light-emitting element 64 | 3.10 | 1.64 | (0.567, 0.433) | 1031 | 62.8 | 63.6 | 27.9 |
| Light-emitting element 65 | 3.10 | 1.68 | (0.569, 0.432) | 948 | 56.5 | 57.3 | 25.7 |
| Light-emitting element 66 | 3.10 | 1.73 | (0.568, 0.431) | 897 | 51.7 | 52.4 | 24.0 |

The above results demonstrate that the comparative light-emitting elements 51 to 58 and the light-emitting elements 59 to 66 fabricated in this example have favorable driving voltage and luminous efficiency regardless of the structure of the hole-injection layer 111.

<Relation Between Refractive Index of Hole-Injection Layer 111 and External Quantum Efficiency>

Figure 32:
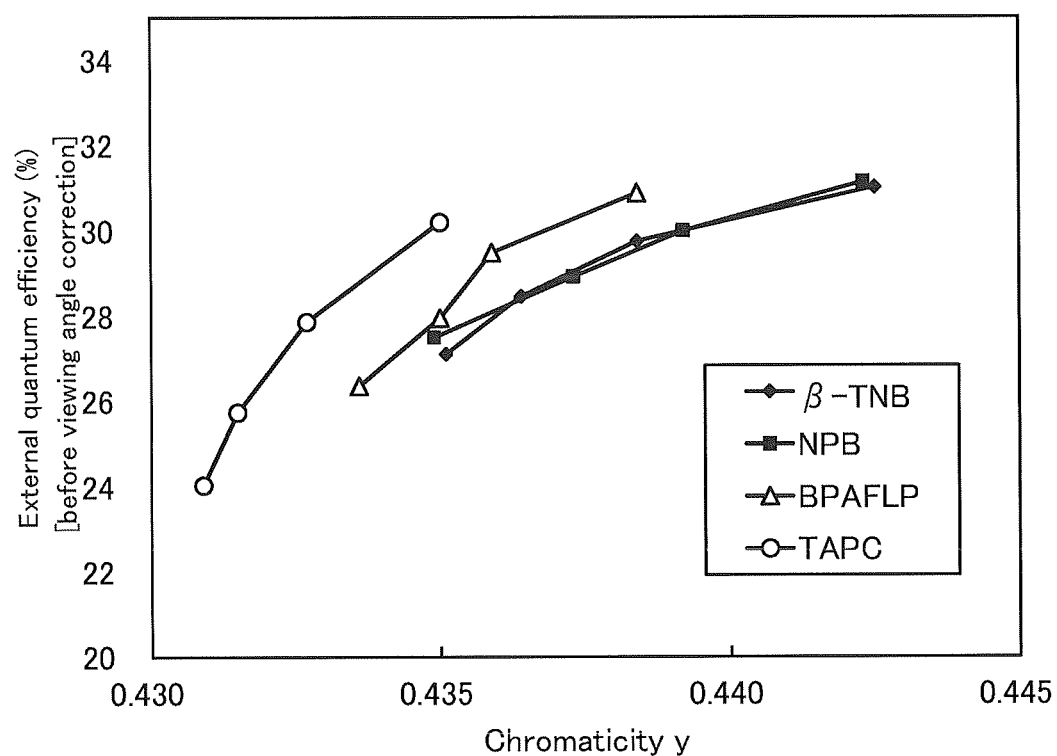
FIG. 32 is a view showing external quantum efficiency-chromaticity y characteristics of light-emitting elements in Example.

FIG. 32 shows a relation between chromaticity y and external quantum efficiency with the organic materials used for the hole-injection layers 111 with the use of the values of the elements shown in Table 19. In FIG. 32, the values of the comparative light-emitting elements 51 to 54 were used for data on the "β-TNB" curve, the values of the comparative light-emitting elements 55 to 58 were used for data on the "NPB" curve, the values of the light-emitting elements 59 to 62 were used for data on the "BPAFLP" curve, and the values of the light-emitting elements 63 to 66 were used for data on the "TAPC" curve.

As shown in Table 18, the refractive index of the hole-injection layer 111 containing β-TNB or NPB is higher than 1.75, whereas the refractive index of the hole-injection layer 111 containing BPAFLP or TAPC is lower than or equal to 1.75. FIG. 32 shows that when the external quantum efficiencies of the light-emitting elements at chromaticity y of approximately 0.435 are compared with each other, for example, the light-emitting element including the hole-injection layer 111 with a low refractive index has higher external quantum efficiency. Thus, it is found that the light-emitting element including the hole-injection layer 111 with a low efractive index has higher luminous efficiency at the same chromaticity. This is because light attenuation due to an evanescent mode is reduced and thus outcoupling efficiency is improved.

Reference Example 1

In this reference example, a synthesis method of Ir(pbi-diBuCNp)₃ used in Example 1 is described.

Step 1; Synthesis of
4-amino-3,5-diisobutylbenzonitrile

Into a 3000 mL three-neck flask were put 52 g (280 mmol) of 4-amino-3,5-dichlorobenzonitrile, 125 g (1226 mmol) of isobutylboronic acid, 260 g (1226 mmol) of tripotassium phosphate, 5.4 g (13.1 mmol) of 2-dicyclohexylphosphino-2',6'-dimethoxybiphenyl (S-phos), and 1500 mL of toluene, the air in the flask was replaced with nitrogen, and the mixture was degassed by being stirred while the pressure in the flask was reduced. After the degassing, 4.8 g (5.2 mmol) of tris(dibenzylideneacetone)dipalladium(0) was added, and the mixture was stirred under a nitrogen stream at 130° C. for 12 hours. Toluene was added to the obtained reaction solution, and the mixture was suction-filtered through a filter aid in which Celite (manufactured by Wako Pure Chemical Industries, Ltd., Catalog No. 531-16855), Florisil (manufactured by Wako Pure Chemical Industries, Ltd., Catalog No. 540-00135), and aluminum oxide were stacked in this order. The obtained filtrate was concentrated to give an oily substance. The obtained oily substance was purified by silica column chromatography. Toluene was used as the developing solvent. The resulting fraction was concentrated to give 61 g of a yellow oily substance in a yield of 95%. The obtained yellow oily substance was identified as 4-amino-3,5-diisobutylbenzonitrile by nuclear magnetic resonance (NMR) spectroscopy. The synthesis scheme of Step 1 is shown in (a-1) below.

[Chemical Formula 11]

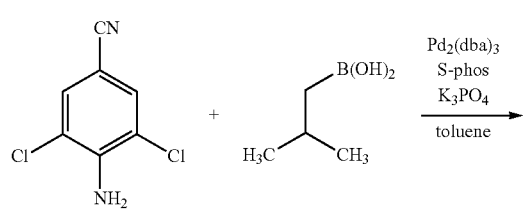

(a-1)

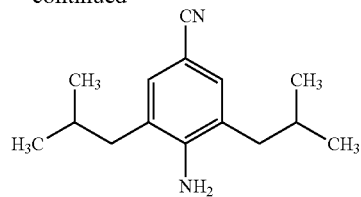

Step 2; Synthesis of 4-[N-(2-nitrophenyl)amino]-3,5-diisobutylbenzonitrile

Into a 1000 mL three-neck flask were put 30 g (131 mmol) of 4-amino-3,5-diisobutylbenzonitrile synthesized in Step 1, 86 g (263 mmol) of cesium carbonate, 380 mL of dimethylsulfoxide (DMSO), and 19 g (131 mmol) of 2-fluoronitrobenzene, and the mixture was stirred under a nitrogen stream at 120° C. for 20 hours. After the predetermined time elapsed, the reaction solution was subjected to extraction with chloroform to give a crude product. The obtained crude product was purified by silica column chromatography. As the developing solvent, a 7:1 hexane-ethyl acetate mixed solvent was used. The obtained fraction was concentrated to give an orange solid. Hexane was added to the obtained solid, which was then suction-filtered to give 16 g of a yellow solid in a yield of 35%. The obtained yellow solid was identified as 4-[N-(2-nitrophenyl)amino]-3,5-diisobutylbenzonitrile by nuclear magnetic resonance (NMR) spectroscopy. The synthesis scheme of Step 2 is shown in (a-2) below.

[Chemical Formula 12]

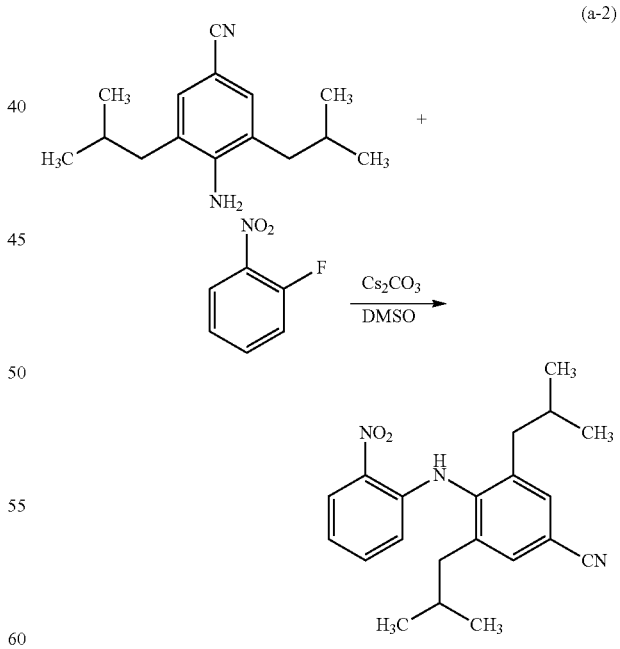

(a-2)

Step 3; Synthesis of 4-[N-(2-aminophenyl)amino]-3,5-diisobutylbenzonitrile

Into a 2000 mL three-neck flask were put 21 g (60.0 mmol) of 4-[N-(2-nitrophenyl)amino]-3,5-diisobutylbenzonitrile synthesized in Step 2, 11 mL (0.6 mol) of water, and 780 mL of ethanol, and the mixture was stirred. To this mixture was added 57 g (0.3 mol) of tin(II) chloride, and the mixture was stirred under a nitrogen stream at 80° C. for 7.5 hours. After the predetermined time elapsed, the mixture was poured into 400 mL of a 2M sodium hydroxide aqueous solution, and the solution was stirred at room temperature for 16 hours. A precipitated sediment was removed by suction filtration, and washing with chloroform was further performed, whereby a filtrate was obtained. The obtained filtrate was subjected to extraction with chloroform. After that, the extracted solution was concentrated to give 20 g of a white solid in a yield of 100%. The obtained white solid was identified as 4-[N-(2-aminophenyl)amino]-3,5-diisobutylbenzonitrile by nuclear magnetic resonance (NMR) spectroscopy. The synthesis scheme of Step 3 is shown in (a-3) below.

[Chemical Formula 13]

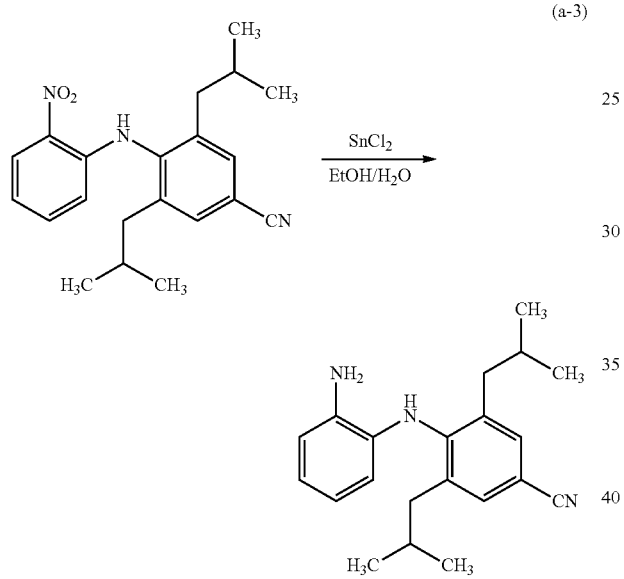

(a-3)

Step 4; Synthesis of 1-(4-cyano-2,6-diisobutylphenyl)-2-phenyl-1H-benzimidazole (abbreviation: Hpbi-diBuCNp)

Into a 1000 mL recovery flask were put 20 g (60.0 mmol) of 4-[N-(2-aminophenyl)amino]-3,5-diisobutylbenzonitrile synthesized in Step 3, 200 mL of acetonitrile, and 6.4 g (60.0 mmol) of benzaldehyde, and the mixture was stirred at 100° C. for one hour. To this mixture was added 100 mg (0.60 mmol) of iron(III) chloride, and the mixture was stirred at 100° C. for 24 hours. After the predetermined time elapsed, the reaction solution was subjected to extraction with chloroform to give an oily substance. Toluene was added to the obtained oily substance, which was then subjected to suction filtration through a filter aid in which Celite, Florisil, and aluminum oxide were stacked in this order. The obtained filtrate was concentrated to give an oily substance. The obtained oily substance was purified by silica column chromatography. Toluene was used as the developing solvent. The obtained fraction was concentrated to give a solid. The solid was recrystallized with ethyl acetate/hexane to give 4.3 g of a white solid, which was the target substance, in a yield of 18%. The obtained white solid was identified as 1-(4-cyano-2,6-diisobutylphenyl)-2-phenyl-1H-benzimidazole (abbreviation: Hpbi-diBuCNp) by nuclear magnetic resonance (NMR) spectroscopy. The synthesis scheme of Step 4 is shown in (a-4) below.

[Chemical Formula 14]

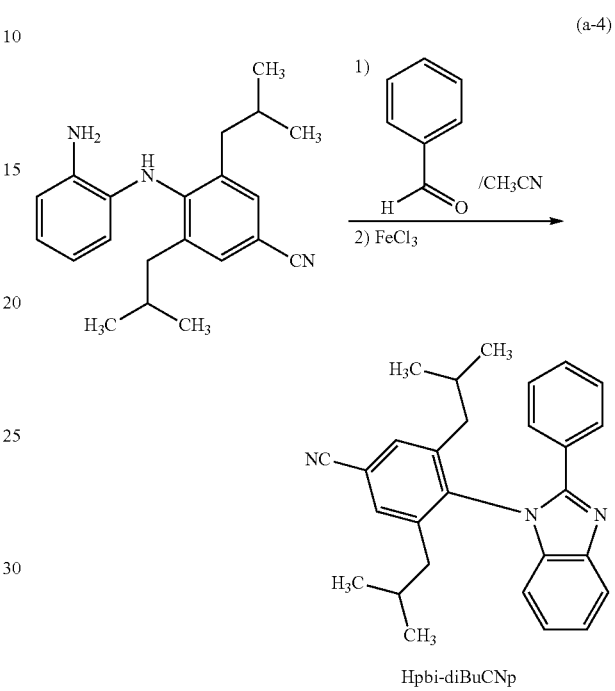

(a-4)

Step 5; Synthesis of tris {2-[1-(4-cyano-2,6-diisobutylphenyl)-1H-benzimidazol-2-yl-κN³]phenyl-κC}iridium(III) (abbreviation: Ir(pbi-diBuCNp)₃)

Into a reaction container with a three-way cock were put 1.8 g (4.4 mmol) of 1-(4-cyano-2,6-diisobutylphenyl)-2-phenyl-1H-benzimidazole (abbreviation: Hpbi-diBuCNp) synthesized in Step 4 and 0.43 g (0.88 mmol) of tris (acetylacetonato)iridium(III), and the mixture was heated at 250° C. for 39 hours. Toluene was added to the obtained reaction mixture, and an insoluble matter was removed. The obtained filtrate was concentrated to give a solid. The obtained solid was purified by silica column chromatography (neutral silica). Toluene was used as the developing solvent. The obtained fraction was concentrated to give a solid. The obtained solid was recrystallized with ethyl acetate/hexane to give 0.26 g of a yellow solid in a yield of 21%. The synthesis scheme is shown in (a-5) below.

[Chemical Formula 15]

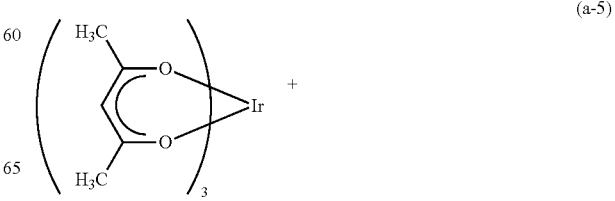

(a-5)

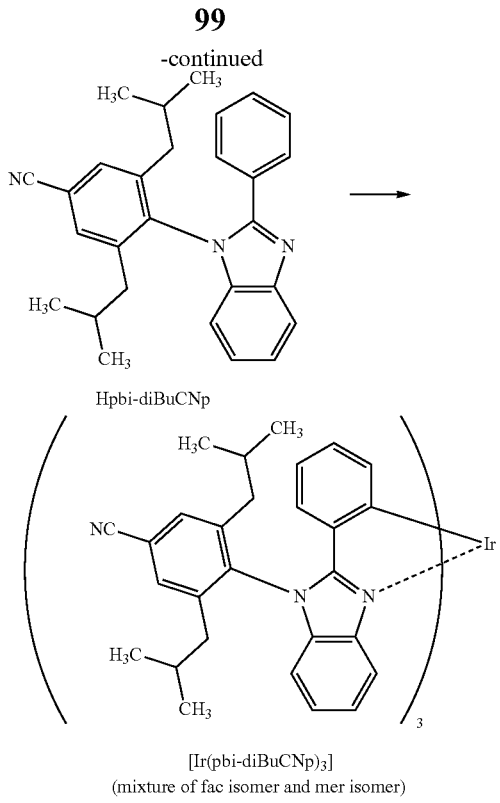

[Ir(pbi-diBuCNp)₃]
(mixture of fac isomer and mer isomer)

Protons (¹H) of the yellow solid obtained above were measured by nuclear magnetic resonance (NMR) spectroscopy. The measurement results indicate that Ir(pbi-diBuCNp)₃ (a mixture of a fac isomer and a mer isomer) is obtained in this reference example. Note that ¹H-NMR reveals that the product is an isomer mixture of a fac isomer and a mer isomer. The isomer ratio of the fac isomer to the mer isomer was found to be 3:2.

REFERENCE NUMERALS

10: substrate, 11: electrode, 12: electrode, 15: substrate, 20: organic semiconductor layer, 30: carrier-transport layer, 40: functional layer, 50: electronic device, 100: EL layer, 101: electrode, 102: electrode, 106: light-emitting unit, 108: light-emitting unit, 110: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 121: guest material, 122: host material, 130: light-emitting layer, 131: guest material, 131_1: organic compound, 131_2: organic compound, 132: host material, 134: light-emitting region, 140: light-emitting layer, 141: guest material, 142: host material, 142_1: organic compound, 142_2: organic compound, 150: light-emitting element, 170: light-emitting layer, 200: substrate, 250: light-emitting element, 252: light-emitting element, 601: source side driver circuit, 602: pixel portion, 603: gate side driver circuit, 604: sealing substrate, 605: sealing material, 607: space, 608: wiring, 610: element substrate, 611: switching TFT, 612: current controlling TFT, 613: electrode, 614: insulator, 616: EL layer, 617: electrode, 618: light-emitting element, 623: n-channel TFT, 624: p-channel TFT, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition, 1028: EL layer, 1029: electrode, 1031: sealing substrate, 1032: sealing material, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 3054: display portion, 3500: multifunction terminal, 3502: housing, 3504: display portion, 3506: camera, 3508: lighting, 3600: light, 3602: housing, 3608: lighting, 3610: speaker, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9055: hinge, 9200: portable information terminal, 9201: portable information terminal, and 9202: portable information terminal.

This application is based on Japanese Patent Application Serial No. 2017-100046 filed with Japan Patent Office on May 19, 2017 and Japanese Patent Application Serial No. 2017-100049 filed with Japan Patent Office on May 19, 2017, the entire contents of which are hereby incorporated herein by reference.

The invention claimed is:
1. An electronic device comprising:
a first electrode;
a second electrode;
a first layer; and
a second layer,
wherein the first layer is provided between the first electrode and the second layer,
wherein the second layer is provided between the first layer and the second electrode,
wherein the first layer comprises a first substance and a first organic compound,
wherein the first substance has an electron-accepting property,
wherein a refractive index of a thin film of the first organic compound is higher than or equal to 1 and lower than or equal to 1.75, and
wherein the first organic compound has an electron-donating property.
2. The electronic device according to claim 1,
wherein a refractive index of the first layer is lower than a refractive index of the second layer.
3. The electronic device according to claim 1,
wherein the first layer is in contact with the second layer.
4. The electronic device according to claim 1,
wherein a refractive index of the first layer is lower than a refractive index of the first electrode.
5. The electronic device according to claim 1,
wherein a volume ratio of the first substance to the first organic compound is greater than or equal to 0.01 and less than or equal to 0.3.
6. The electronic device according to claim 1,
wherein the first substance comprises any one oftitanium oxide, vanadium oxide, tantalum oxide, molybdenum oxide, tungsten oxide, rhenium oxide, ruthenium oxide, chromium oxide, zirconium oxide, hafnium oxide, and silver oxide.

7. The electronic device according to claim 1, wherein the first substance is any one of TCNQ, F4TCNQ, and F6TCNNQ.

8. The electronic device according to claim 1, wherein the first electrode is an anode and the second electrode is a cathode.

9. The electronic device according to claim 1, wherein the second layer has a light-emitting function.

10. The electronic device according to claim 1, wherein the second layer has a photoelectric conversion function.

11. A display device comprising:
the electronic device according to claim 1; and
at least one of a color filter and a transistor.

12. An electronic appliance comprising:
the display device according to claim 11; and
at least one of a housing and a touch sensor.

13. A lighting device comprising:
the electronic device according to claim 1; and
at least one of a housing and a touch sensor.

14. An electronic device comprising:
a first layer between a first electrode and a second electrode,
wherein the first layer comprises a first organic compound and a first substance,
wherein the first organic compound comprises a first skeleton and an electron-donating skeleton,
wherein the first skeleton is a tetraarylmethane skeleton or a tetraarylsilane skeleton, and
wherein the electron-donating skeleton comprises an acridine skeleton or an azepine skeleton.

15. The electronic device according to claim 14, wherein a refractive index of the first layer is higher than or equal to 1 and lower than or equal to 1.75.

16. The electronic device according to claim 14, wherein aryl groups in the tetraarylmethane skeleton and the tetraarylsilane skeleton are independently a substituted or unsubstituted aryl group having 6 to 13 carbon atoms, and
wherein the aryl groups are bonded to each other to form a ring.

17. The electronic device according to claim 16, wherein the aryl groups are independently a substituted or unsubstituted phenyl group, and
wherein the phenyl groups are bonded to each other to form a ring.

18. The electronic device according to claim 14, wherein a glass transition point (Tg) of the first organic compound is higher than or equal to 100° C.

19. An electronic device comprising:
a first layer, a second layer, and a third layer which are between a first electrode and a second electrode,
wherein the first layer is provided between the first electrode and the second layer,
wherein the second layer is provided between the first layer and the third layer,
wherein the first layer comprises a first substance and a first organic compound,
wherein the first substance has an electron-accepting property,
wherein the third layer is configured to emit or absorb light,
wherein a refractive index of the first layer is lower than a refractive index of the second layer and a refractive index of the third layer, and
wherein a refractive index of a thin film of the first organic compound is higher than or equal to 1 and lower than or equal to 1.75.

20. The electronic device according to claim 19, wherein the third layer is in contact with the second layer.

* * * * *